United States Patent
Tran et al.

(10) Patent No.: US 11,507,816 B2
(45) Date of Patent: Nov. 22, 2022

(54) PRECISION TUNING FOR THE PROGRAMMING OF ANALOG NEURAL MEMORY IN A DEEP LEARNING ARTIFICIAL NEURAL NETWORK

(71) Applicant: Silicon Storage Technology, Inc., San Jose, CA (US)

(72) Inventors: Hieu Van Tran, San Jose, CA (US); Steven Lemke, Boulder Creek, CA (US); Vipin Tiwari, Dublin, CA (US); Nhan Do, Saratoga, CA (US); Mark Reiten, Alamo, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 642 days.

(21) Appl. No.: 16/576,533

(22) Filed: Sep. 19, 2019

(65) Prior Publication Data
US 2021/0089875 A1    Mar. 25, 2021

(51) Int. Cl.
G06N 3/063        (2006.01)
G06F 17/16        (2006.01)
G11C 11/54        (2006.01)
G11C 11/56        (2006.01)

(52) U.S. Cl.
CPC ........... *G06N 3/0635* (2013.01); *G06F 17/16* (2013.01); *G11C 11/54* (2013.01); *G11C 11/5628* (2013.01)

(58) Field of Classification Search
CPC ....... G06N 3/0635; G06F 17/16; G11C 11/54; G11C 11/5628

USPC ..................................................... 365/185.03
See application file for complete search history.

(56) References Cited

U.S. PATENT DOCUMENTS

| | | | |
|---|---|---|---|
| 5,029,130 A | 7/1991 | Yeh | |
| 6,747,310 B2 | 6/2004 | Fan et al. | |
| 9,406,393 B2 | 8/2016 | Park | |
| 9,697,877 B2 | 7/2017 | Shanbhag | |
| 2005/0162916 A1* | 7/2005 | Guterman | G11C 11/5628 365/185.22 |
| 2017/0256320 A1 | 9/2017 | Lang | |
| 2017/0337466 A1* | 11/2017 | Bayat | G06N 3/04 |
| 2019/0088329 A1 | 3/2019 | Tiwari | |
| 2019/0164617 A1 | 5/2019 | Tran et al. | |

FOREIGN PATENT DOCUMENTS

| TW | 200540871 | 12/2005 |
|---|---|---|
| WO | 2019067980 | 4/2019 |

OTHER PUBLICATIONS

Taiwanese Search Report dated Feb. 18, 2022 corresponding to the related Taiwanese Patent Application No. 109131606.

\* cited by examiner

*Primary Examiner* — Anthan Tran
(74) *Attorney, Agent, or Firm* — DLA Piper LLP US

(57) ABSTRACT

Numerous embodiments of a precision tuning algorithm and apparatus are disclosed for precisely and quickly depositing the correct amount of charge on the floating gate of a non-volatile memory cell within a vector-by-matrix multiplication (VMM) array in an artificial neural network. Selected cells thereby can be programmed with extreme precision to hold one of N different values.

25 Claims, 49 Drawing Sheets

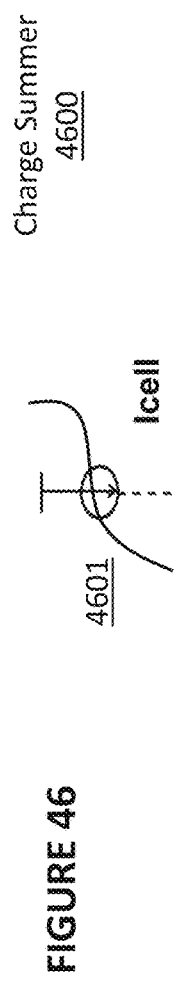
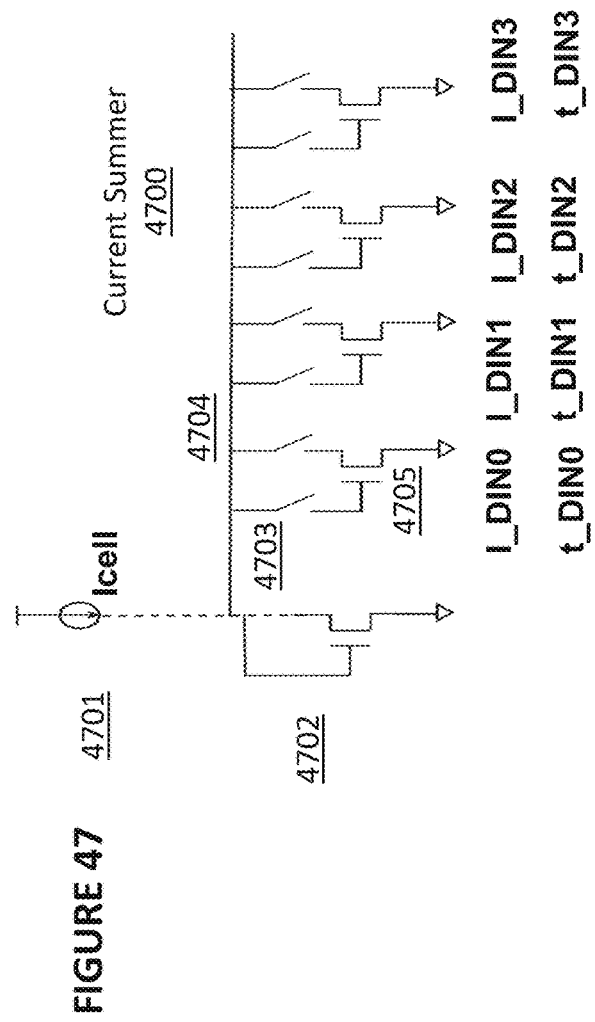
FIGURE 46
FIGURE 47

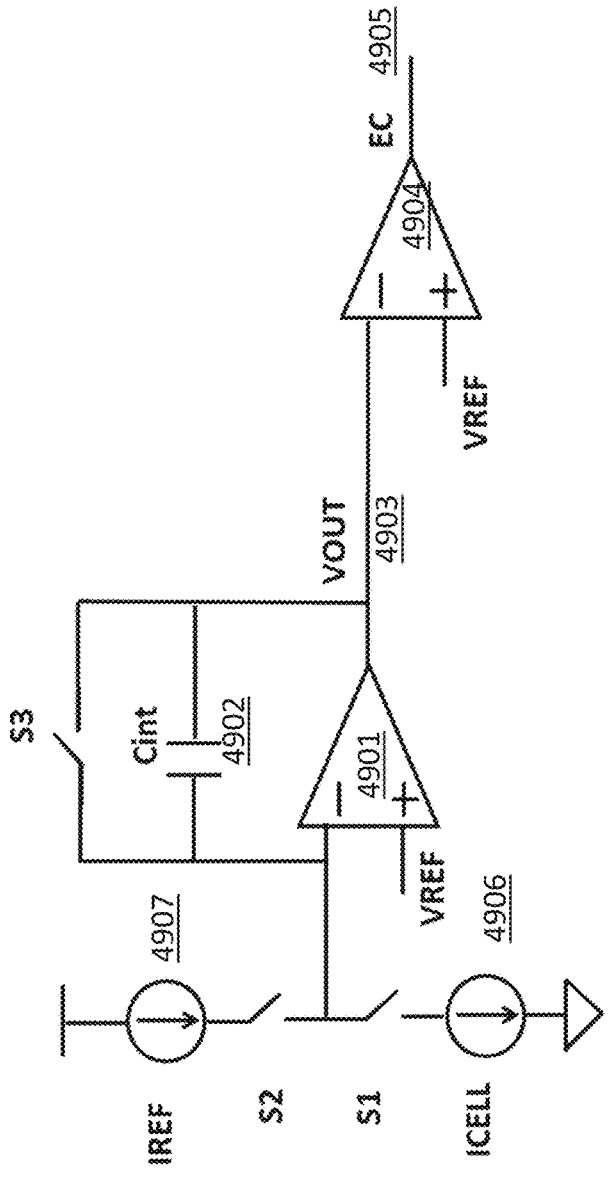
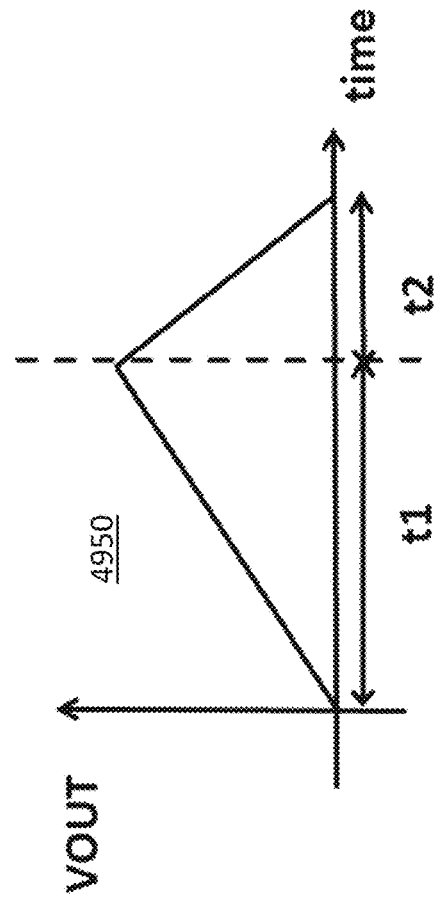
FIGURE 49A
FIGURE 49B

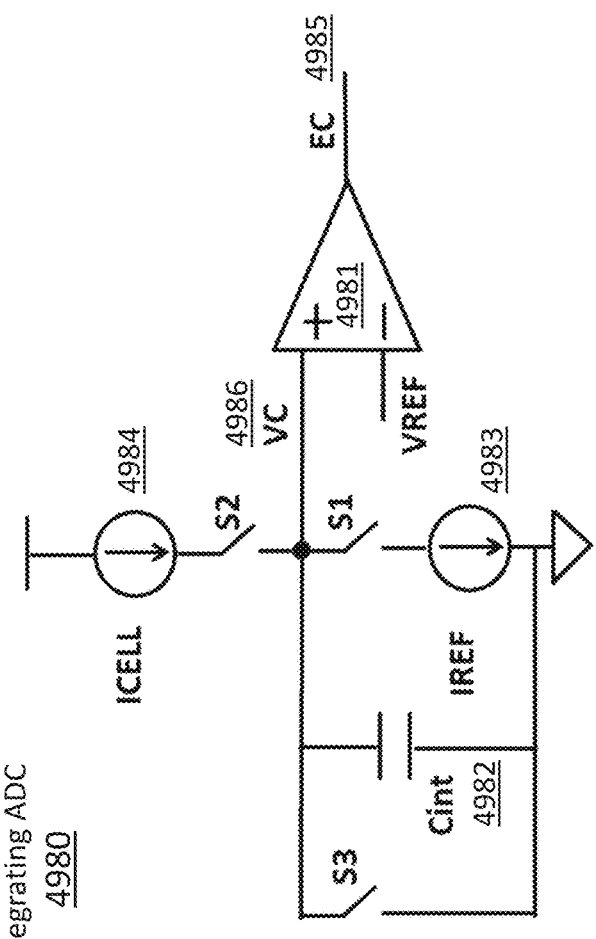
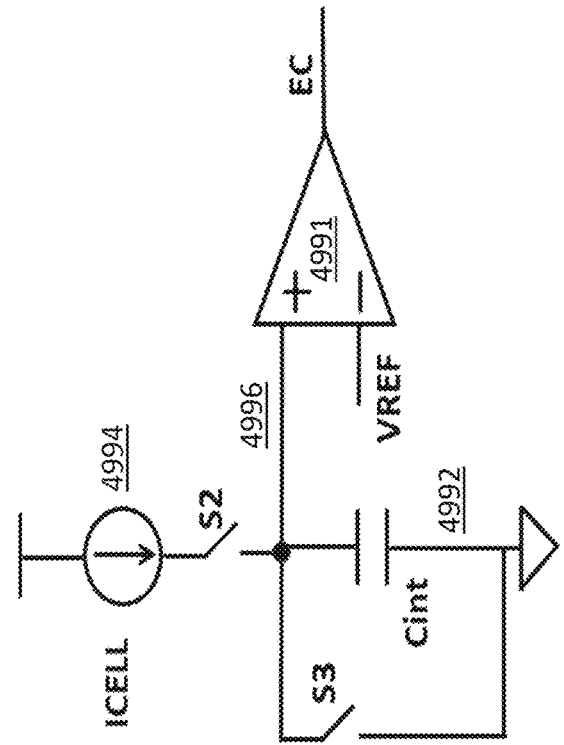
FIGURE 49E
FIGURE 49F

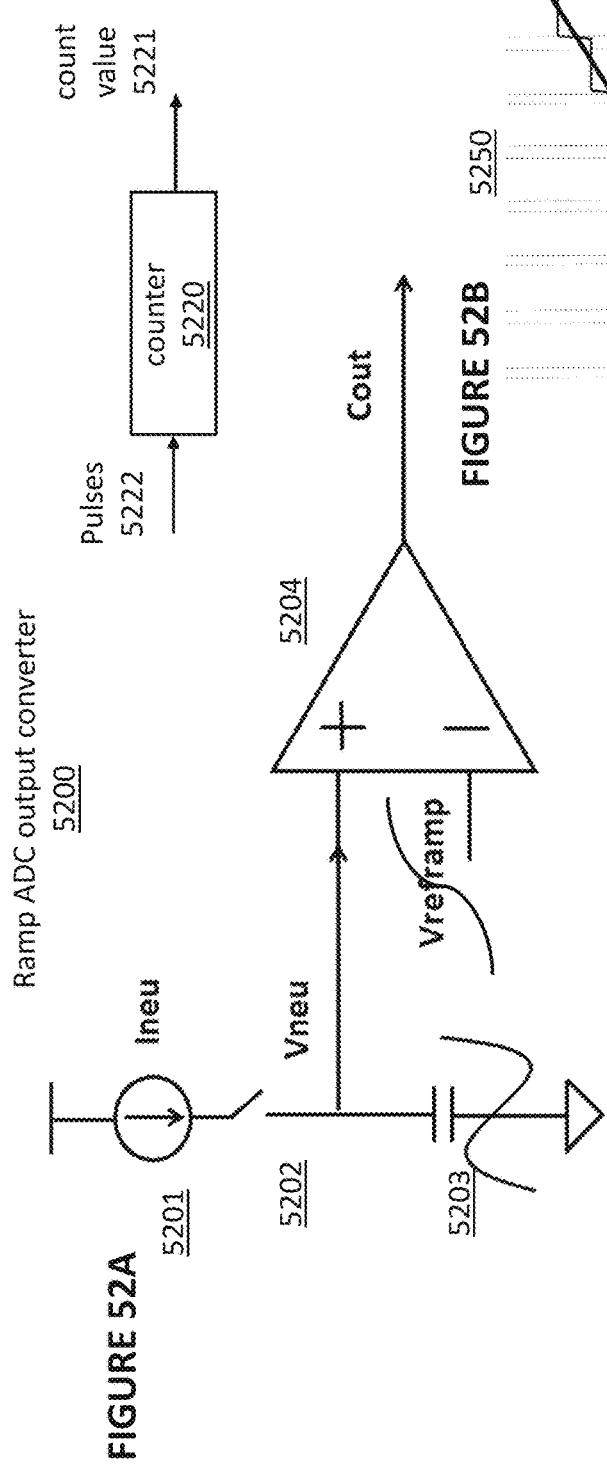
FIGURE 52A
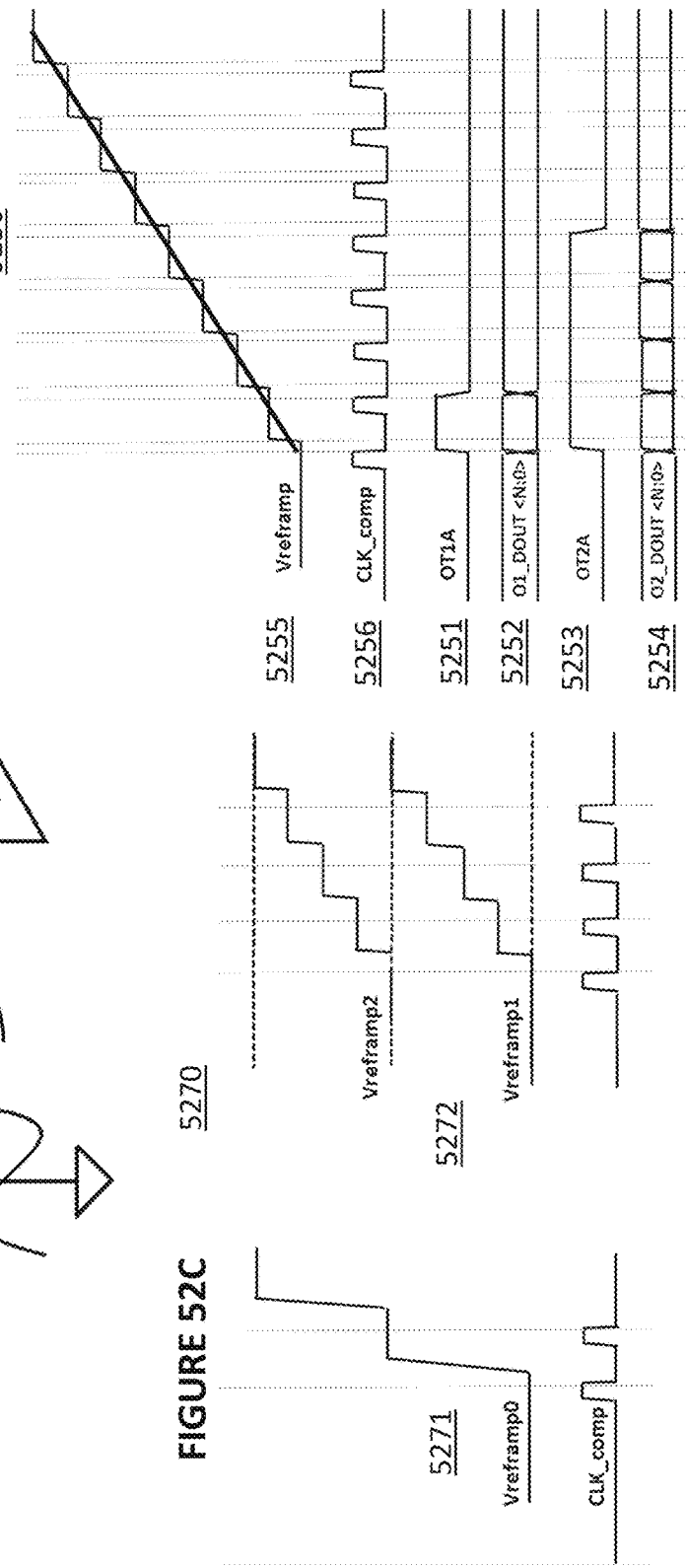
FIGURE 52B
FIGURE 52C

PRECISION TUNING FOR THE PROGRAMMING OF ANALOG NEURAL MEMORY IN A DEEP LEARNING ARTIFICIAL NEURAL NETWORK

FIELD OF THE INVENTION

Numerous embodiments of a precision tuning algorithm and apparatus are disclosed for precisely and quickly depositing the correct amount of charge on the floating gate of a non-volatile memory cell within a vector-by-matrix multiplication (VMM) array in an artificial neural network.

BACKGROUND OF THE INVENTION

Artificial neural networks mimic biological neural networks (the central nervous systems of animals, in particular the brain) and are used to estimate or approximate functions that can depend on a large number of inputs and are generally unknown. Artificial neural networks generally include layers of interconnected "neurons" which exchange messages between each other.

FIG. 1 illustrates an artificial neural network, where the circles represent the inputs or layers of neurons. The connections (called synapses) are represented by arrows, and have numeric weights that can be tuned based on experience. This makes neural networks adaptive to inputs and capable of learning. Typically, neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical neural networks rely on a very large number of synapses, enabling high connectivity between neurons, i.e. a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

Applicant previously disclosed an artificial (analog) neural network that utilizes one or more non-volatile memory arrays as the synapses in U.S. patent application Ser. No. 15/594,439, which is incorporated by reference. The non-volatile memory arrays operate as an analog neuromorphic memory. The neural network device includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells is configured to store a weight value corresponding to a number of electrons on the floating gate. The plurality of memory cells is configured to multiply the first plurality of inputs by the stored weight values to generate the first plurality of outputs.

Each non-volatile memory cells used in the analog neuromorphic memory system must be erased and programmed to hold a very specific and precise amount of charge, i.e., the number of electrons, in the floating gate. For example, each floating gate must hold one of N different values, where N is the number of different weights that can be indicated by each cell. Examples of N include 16, 32, 64, 128, and 256.

One challenge in VMM systems is the ability to program selected cells with the precision and granularity required for different values of N. For example, if a selected cell can include one of 64 different values, extreme precision is required in program operations.

What is needed are improved programming systems and methods suitable for use with a VMM in an analog neuromorphic memory system.

SUMMARY OF THE INVENTION

Numerous embodiments of a precision tuning algorithm and apparatus are disclosed for precisely and quickly depositing the correct amount of charge on the floating gate of a non-volatile memory cell within a vector-by-matrix multiplication (VMM) array in an artificial neural network. Selected cells thereby can be programmed with extreme precision to hold one of N different values.

BRIEF DESCRIPTION OF THE DRAWINGS

FIG. 46 depicts a charge summer circuit.

FIG. 47 depicts a current summer circuit.

FIG. 49A depicts an embodiment of an integrating analog-to-digital converter for a neuron output.

FIG. 49B depicts a graph showing the voltage output over time of the integrating analog-to-digital converter of FIG. 49A.

FIG. 49E depicts another embodiment of an integrating analog-to-digital converter for a neuron output.

FIG. 49F depicts another embodiment of an integrating analog-to-digital converter for a neuron output.

FIGS. 52A, 52B, and 52C depict an embodiment of a ramp analog-to-digital converter.

DETAILED DESCRIPTION OF THE INVENTION

The artificial neural networks of the present invention utilize a combination of CMOS technology and non-volatile memory arrays.

Non-Volatile Memory Cells

Figure 1:
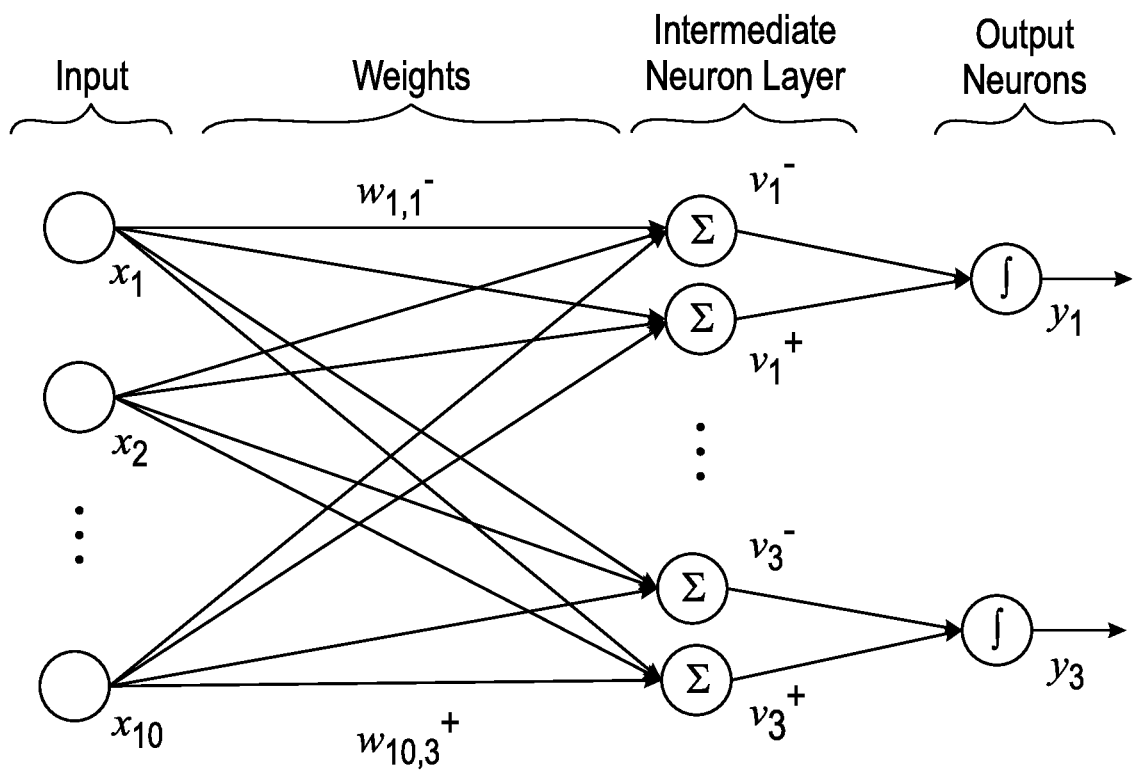
FIG. 1 is a diagram that illustrates a prior art artificial neural network.
Figure 2:
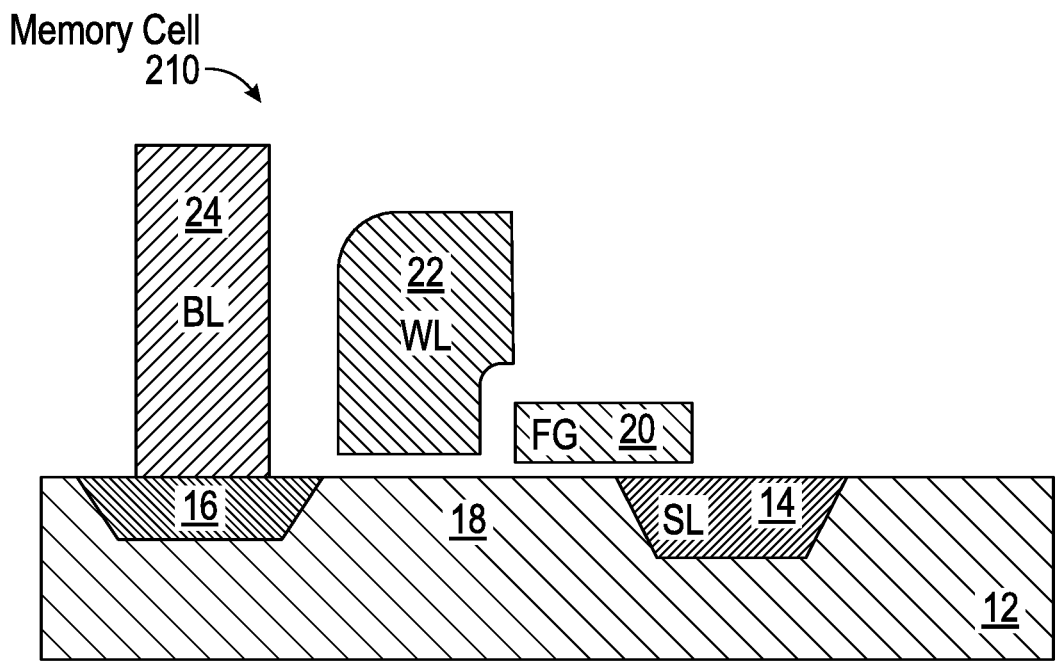
FIG. 2 depicts a prior art split gate flash memory cell.

Digital non-volatile memories are well known. For example, U.S. Pat. No. 5,029,130 ("the '130 patent"), which is incorporated herein by reference, discloses an array of split gate non-volatile memory cells, which are a type of flash memory cells. Such a memory cell 210 is shown in FIG. 2. Each memory cell 210 includes source region 14 and drain region 16 formed in semiconductor substrate 12, with channel region 18 there between. Floating gate 20 is formed over and insulated from (and controls the conductivity of) a first portion of the channel region 18, and over a portion of the source region 14. Word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline terminal 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim tunneling.

Memory cell 210 is programmed (where electrons are placed on the floating gate) by placing a positive voltage on the word line terminal 22, and a positive voltage on the source region 14. Electron current will flow from the source region 14 (source line terminal) towards the drain region 16. The electrons will accelerate and become heated when they reach the gap between the word line terminal 22 and the floating gate 20. Some of the heated electrons will be injected through the gate oxide onto the floating gate 20 due to the attractive electrostatic force from the floating gate 20.

Memory cell 210 is read by placing positive read voltages on the drain region 16 and word line terminal 22 (which turns on the portion of the channel region 18 under the word line terminal). If the floating gate 20 is positively charged (i.e. erased of electrons), then the portion of the channel region 18 under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage ranges that can be applied to the terminals of memory cell 110 for performing read, erase, and program operations:

TABLE No 1

Operation of Flash Memory Cell 210 of Figure 2

|  | WL | BL | SL |
|---|---|---|---|
| Read 1 | 0.5-3 V | 0.1-2 V | 0 V |
| Read 2 | 0.5-3 V | 0-2 V | 2-0.1 V |
| Erase | ~11-13 V | 0 V | 0 V |
| Program | 1-2 V | 1-3 µA | 9-10 V |

"Read 1" is a read mode in which the cell current is output on the bit line. "Read 2" is a read mode in which the cell current is output on the source line terminal.

Figure 3:
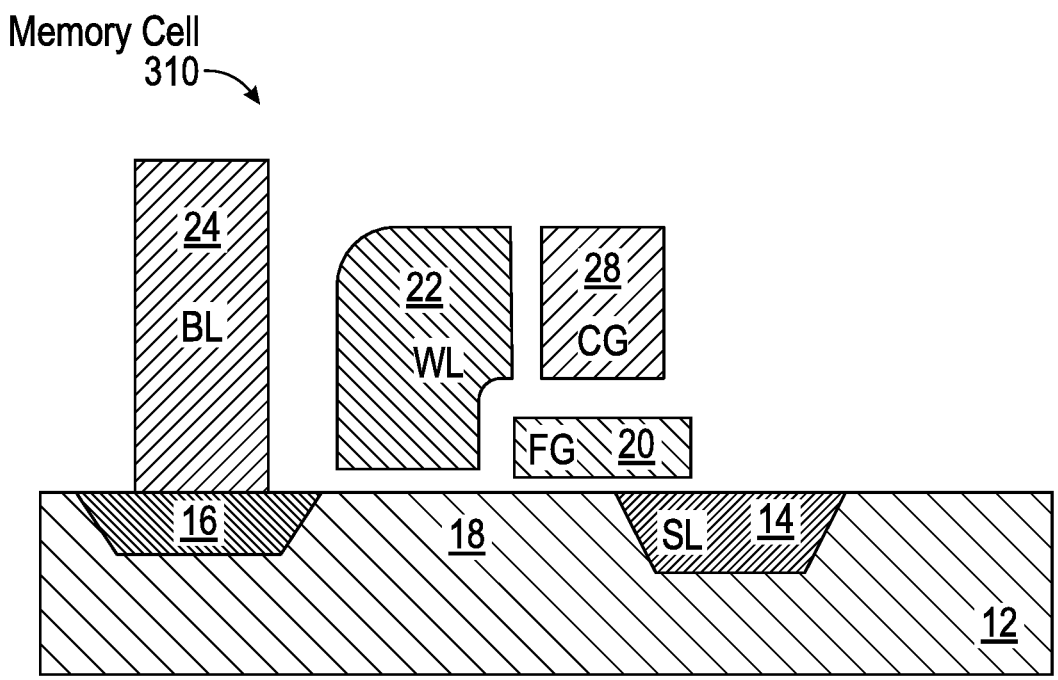
FIG. 3 depicts another prior art split gate flash memory cell

FIG. 3 shows memory cell 310, which is similar to memory cell 210 of FIG. 2 with the addition of control gate (CG) terminal 28. Control gate terminal 28 is biased at a high voltage, e.g., 10V, in programming, low or negative in erase, e.g., 0v/−8V, low or mid range in read, e.g., 0v/2.5V. Other terminals are biased similarly to that of FIG. 2.

Figure 4:
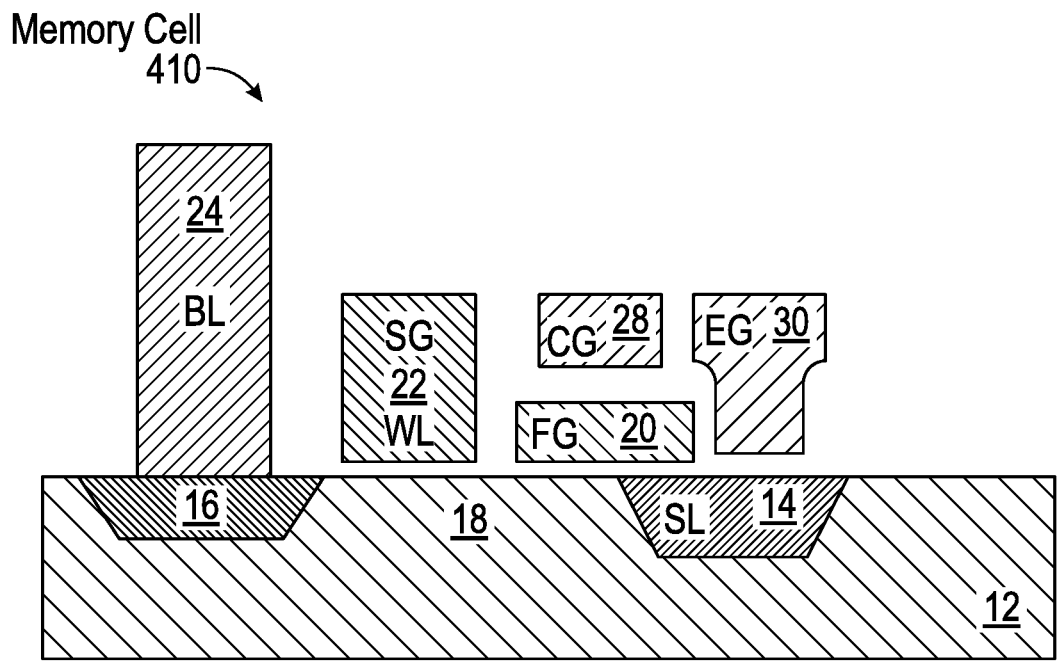
FIG. 4 depicts another prior art split gate flash memory cell.

FIG. 4 depicts four-gate memory cell 410 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 6,747,310, which is incorporated herein by reference for all purposes. Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage ranges that can be applied to the terminals of memory cell 410 for performing read, erase, and program operations:

TABLE No. 2

Operation of Flash Memory Cell 410 of Figure 4

|  | WL/SG | BL | CG | EG | SL |
|---|---|---|---|---|---|
| Read 1 | 0.5-2 V | 0.1-2 V | 0-2.6 V | 0-2.6 V | 0 V |
| Read 2 | 0.5-2 V | 0-2 V | 0-2.6 V | 0-2.6 V | 2-0.1 V |
| Erase | −0.5 V/0 V | 0 V | 0 V/−8 V | 8-12 V | 0 V |
| Program | 1 V | 1 µA | 8-11 V | 4.5-9 V | 4.5-5 V |

"Read 1" is a read mode in which the cell current is output on the bit line. "Read 2" is a read mode in which the cell current is output on the source line terminal.

Figure 5:
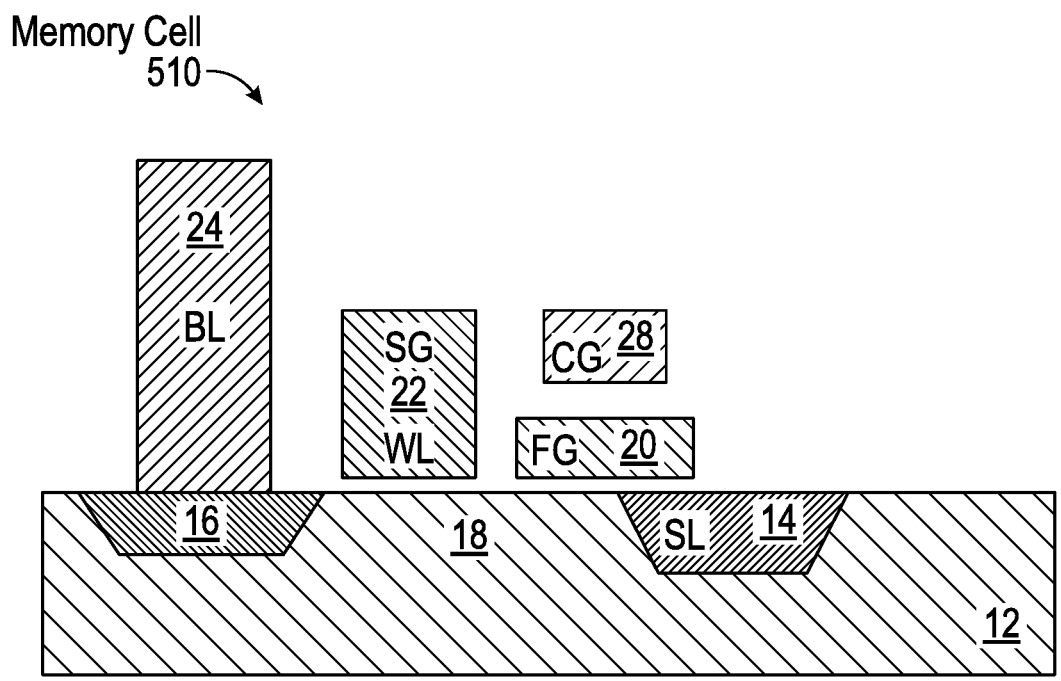
FIG. 5 depicts another prior art split gate flash memory cell

FIG. 5 shows memory cell 510, which is similar to memory cell 410 of FIG. 4 except that memory cell 510 does not contain an erase gate EG terminal. An erase is performed by biasing the substrate 18 to a high voltage and biasing the control gate CG terminal 28 to a low or negative voltage. Alternatively, an erase is performed by biasing word line terminal 22 to a positive voltage and biasing control gate terminal 28 to a negative voltage. Programming and reading is similar to that of FIG. 4.

Figure 6:
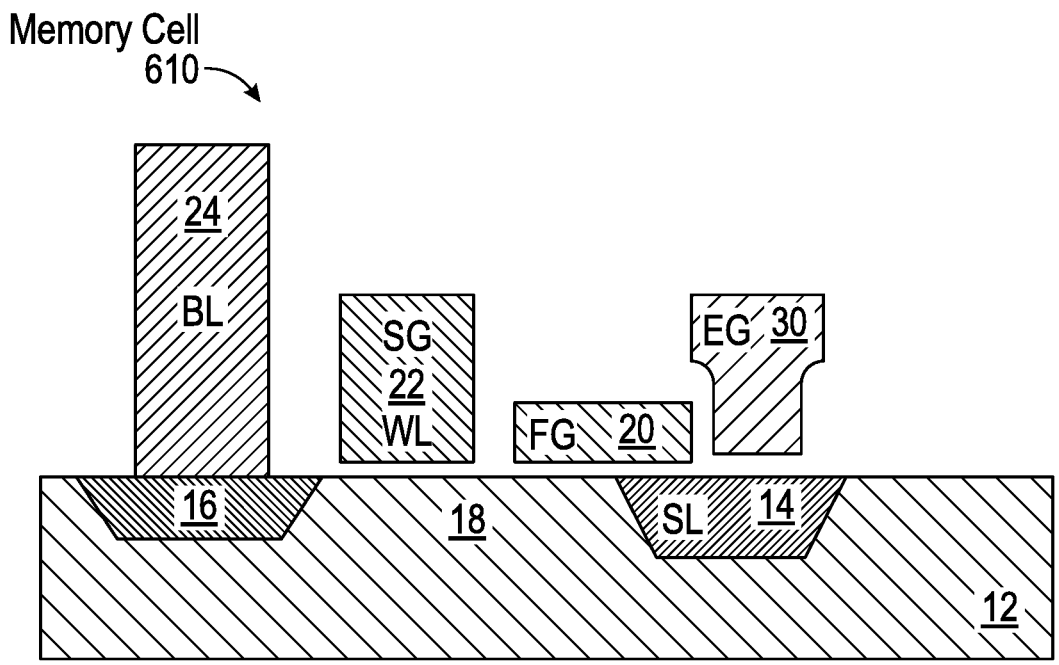
FIG. 6 depicts another prior art split gate flash memory cell.

FIG. 6 depicts a three-gate memory cell 610, which is another type of flash memory cell. Memory cell 610 is identical to the memory cell 410 of FIG. 4 except that memory cell 610 does not have a separate control gate terminal. The erase operation (whereby erasing occurs through use of the erase gate terminal) and read operation are similar to that of the FIG. 4 except there is no control gate bias applied. The programming operation also is done without the control gate bias, and as a result, a higher voltage must be applied on the source line terminal during a program operation to compensate for a lack of control gate bias.

Table No. 3 depicts typical voltage ranges that can be applied to the terminals of memory cell 610 for performing read, erase, and program operations:

TABLE No. 3

Operation of Flash Memory Cell 610 of Figure 6

|  | WL/SG | BL | EG | SL |
|---|---|---|---|---|
| Read 1 | 0.5-2.2 V | 0.1-2 V | 0-2.6 V | 0 V |
| Read 2 | 0.5-2.2 V | 0-2 V | 0-2.6 V | 2-0.1 V |
| Erase | −0.5 V/0 V | 0 V | 11.5 V | 0 V |
| Program | 1 V | 2-3 µA | 4.5 V | 7-9 V |

"Read 1" is a read mode in which the cell current is output on the bit line. "Read 2" is a read mode in which the cell current is output on the source line terminal.

Figure 7:
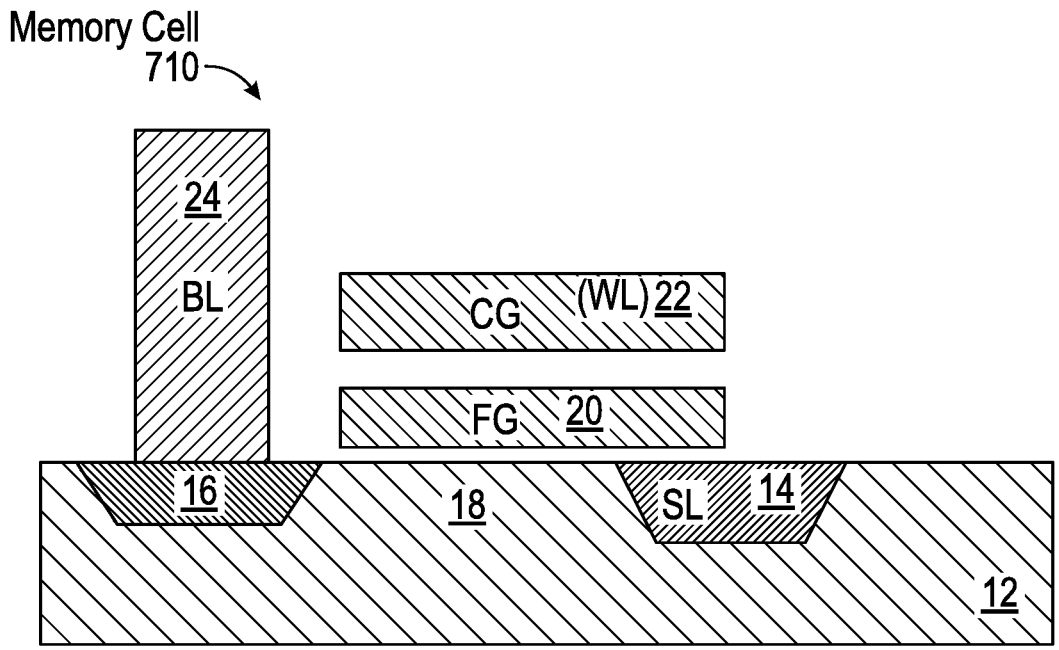
FIG. 7 depicts a prior art stacked gate flash memory cell.

FIG. 7 depicts stacked gate memory cell 710, which is another type of flash memory cell. Memory cell 710 is similar to memory cell 210 of FIG. 2, except that floating gate 20 extends over the entire channel region 18, and control gate terminal 22 (which here will be coupled to a word line) extends over floating gate 20, separated by an insulating layer (not shown). The erase, programming, and read operations operate in a similar manner to that described previously for memory cell 210.

Table No. 4 depicts typical voltage ranges that can be applied to the terminals of memory cell 710 and substrate 12 for performing read, erase, and program operations:

TABLE No. 4

Operation of Flash Memory Cell 710 of Figure 7

|  | CG | BL | SL | Substrate |
|---|---|---|---|---|
| Read 1 | 0-5 V | 0.1-2 V | 0-2 V | 0 V |
| Read 2 | 0.5-2 V | 0-2 V | 2-0.1 V | 0 V |
| Erase | −8 to −10 V/0 V | FLT | FLT | 8-10 V/15-20 V |
| Program | 8-12 V | 3-5 V/0 V | 0V/3-5 V | 0 V |

"Read 1" is a read mode in which the cell current is output on the bit line. "Read 2" is a read mode in which the cell current is output on the source line terminal. Optionally, in arrays comprising rows and columns of memory cells 210, 310, 410, 510, 610, or 710, source lines can be coupled to one row of memory cells or to two adjacent rows of memory cells. That is, source line terminals can be shared by adjacent rows of memory cells.

In order to utilize the memory arrays comprising one of the types of non-volatile memory cells described above in an artificial neural network, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e. charge on the floating gate) of each memory cell in the array can be continuously changed from a fully erased state to a fully programmed state, independently and with minimal disturbance of other memory cells. In another embodiment, the memory state (i.e., charge on the floating gate) of each memory cell in the array can be continuously changed from a fully programmed state to a fully erased state, and vice-versa, independently and with minimal disturbance of other memory cells. This means the cell storage is analog or at the very least can store one of many discrete values (such as 16 or 64 different values), which allows for very precise and individual tuning of all the cells in the memory array, and which makes the memory array ideal for storing and making fine tuning adjustments to the synapsis weights of the neural network.

The methods and means described herein may apply to other non-volatile memory technologies such as SONOS (silicon-oxide-nitride-oxide-silicon, charge trap in nitride), MONOS (metal-oxide-nitride-oxide-silicon, metal charge trap in nitride), ReRAM (resistive ram), PCM (phase change memory), MRAM (magnetic ram), FeRAM (ferroelectric ram), OTP (bi-level or multi-level one time programmable), and CeRAM (correlated electron ram), without limitation. The methods and means described herein may apply to volatile memory technologies used for neural network such as SRAM, DRAM, and other volatile synapse cells, without limitation.

Neural Networks Employing Non-Volatile Memory Cell Arrays

Figure 8:
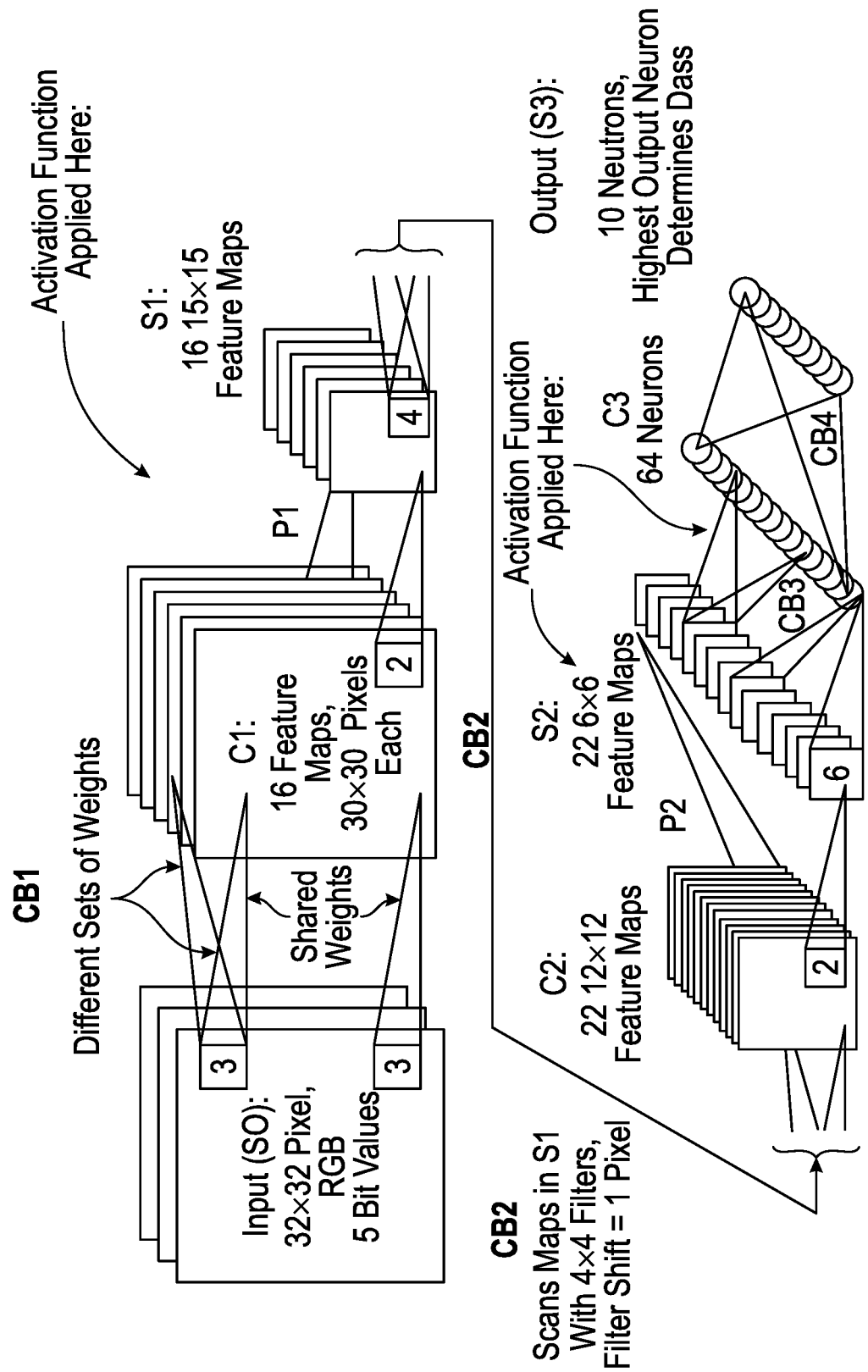
FIG. 8 is a diagram illustrating the different levels of an exemplary artificial neural network utilizing one or more non-volatile memory arrays.

FIG. 8 conceptually illustrates a non-limiting example of a neural network utilizing a non-volatile memory array of the present embodiments. This example uses the non-volatile memory array neural network for a facial recognition application, but any other appropriate application could be implemented using a non-volatile memory array based neural network.

S0 is the input layer, which for this example is a 32×32 pixel RGB image with 5 bit precision (i.e. three 32×32 pixel arrays, one for each color R, G and B, each pixel being 5 bit precision). The synapses CB1 going from input layer S0 to layer C1 apply different sets of weights in some instances and shared weights in other instances, and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, where these 9 input values are multiplied by the appropriate weights and, after summing the outputs of that multiplication, a single output value is determined and provided by a first synapse of CB1 for generating a pixel of one of the layers of feature map C1. The 3×3 filter is then shifted one pixel to the right within input layer S0 (i.e., adding the column of three pixels on the right, and dropping the column of three pixels on the left), whereby the 9 pixel values in this newly positioned filter are provided to the synapses CB1, where they are multiplied by the same weights and a second single output value is determined by the associated synapse. This process is continued until the 3×3 filter scans the entire 32×32 pixel image of input layer S0, for all three colors and for all bits (precision values). The process is then repeated using different sets of weights to generate a different feature map of C1, until all the features maps of layer C1 have been calculated.

In layer C1, in the present example, there are 16 feature maps, with 30×30 pixels each. Each pixel is a new feature pixel extracted from multiplying the inputs and kernel, and therefore each feature map is a two dimensional array, and thus in this example layer C1 constitutes 16 layers of two dimensional arrays (keeping in mind that the layers and arrays referenced herein are logical relationships, not necessarily physical relationships—i.e., the arrays are not necessarily oriented in physical two dimensional arrays). Each of the 16 feature maps in layer C1 is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from layer C1 to layer S1, which pools values from consecutive, non-overlapping 2×2 regions in each feature map. The purpose of the pooling function is to average out the nearby location (or a max function can also be used), to reduce the dependence of the edge location for example and to reduce the data size before going to the next stage. At layer S1, there are 16 15×15 feature maps (i.e., sixteen different arrays of 15×15 pixels each). The synapses CB2 going from layer S1 to layer C2 scan maps in S1 with 4×4 filters, with a filter shift of 1 pixel. At layer C2, there are 22 12×12 feature maps. An activation function P2 (pooling) is applied before going from layer C2 to layer S2, which pools values from consecutive non-overlapping 2×2 regions in each feature map. At layer S2, there are 22 6×6 feature maps. An activation function (pooling) is applied at the synapses CB3 going from layer S2 to layer C3, where every neuron in layer C3 connects to every map in layer S2 via a respective synapse of CB3. At layer C3, there are 64 neurons. The synapses CB4 going from layer C3 to the output layer S3 fully connects C3 to S3, i.e. every neuron in layer C3 is connected to every neuron in layer S3. The output at S3 includes 10 neurons, where the highest output neuron determines the class. This output could, for example, be indicative of an identification or classification of the contents of the original image.

Each layer of synapses is implemented using an array, or a portion of an array, of non-volatile memory cells.

Figure 9:
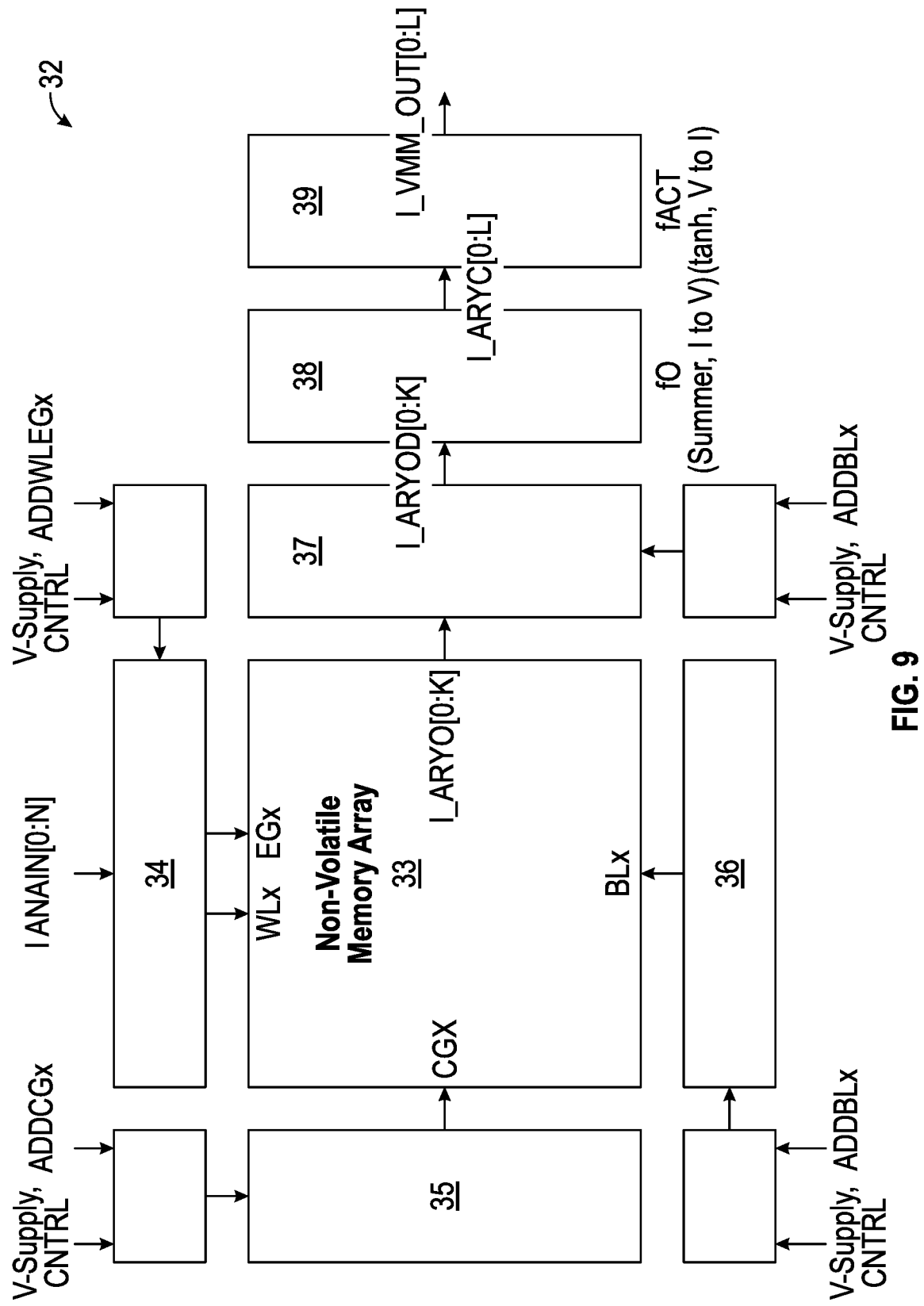
FIG. 9 is a block diagram illustrating a vector-by-matrix multiplication system.

FIG. 9 is a block diagram of a system that can be used for that purpose. Vector-by-matrix multiplication (VMM) system 32 includes non-volatile memory cells and is utilized as the synapses (such as CB1, CB2, CB3, and CB4 in FIG. 6) between one layer and the next layer. Specifically, VMM system 32 includes VMM array 33 comprising non-volatile memory cells arranged in rows and columns, erase gate and word line gate decoder 34, control gate decoder 35, bit line decoder 36 and source line decoder 37, which decode the respective inputs for the non-volatile memory cell array 33. Input to VMM array 33 can be from the erase gate and wordline gate decoder 34 or from the control gate decoder 35. Source line decoder 37 in this example also decodes the output of VMM array 33. Alternatively, bit line decoder 36 can decode the output of VMM array 33.

VMM array 33 serves two purposes. First, it stores the weights that will be used by the VMM system 32. Second, VMM array 33 effectively multiplies the inputs by the weights stored in VMM array 33 and adds them up per output line (source line or bit line) to produce the output, which will be the input to the next layer or input to the final layer. By performing the multiplication and addition function, VMM array 33 negates the need for separate multiplication and addition logic circuits and is also power efficient due to its in-situ memory computation.

The output of VMM array 33 is supplied to a differential summer (such as a summing op-amp or a summing current mirror) 38, which sums up the outputs of VMM array 33 to create a single value for that convolution. The differential summer 38 is arranged to perform summation of both positive weight and negative weight inputs to output the single value.

The summed up output values of differential summer 38 are then supplied to an activation function circuit 39, which rectifies the output. The activation function circuit 39 may provide sigmoid, tan h, ReLU functions, or any other non-linear function. The rectified output values of activation function circuit 39 become an element of a feature map of the next layer (e.g. C1 in FIG. 8), and are then applied to the next synapse to produce the next feature map layer or final layer. Therefore, in this example, VMM array 33 constitutes a plurality of synapses (which receive their inputs from the prior layer of neurons or from an input layer such as an image database), and summer 38 and activation function circuit 39 constitute a plurality of neurons.

The input to VMM system 32 in FIG. 9 (WLx, EGx, CGx, and optionally BLx and SLx) can be analog level, binary level, digital pulses (in which case a pulses-to-analog converter PAC may be needed to convert pulses to the appropriate input analog level) or digital bits (in which case a DAC is provided to convert digital bits to appropriate input analog level) and the output can be analog level, binary level, digital pulses, or digital bits (in which case an output ADC is provided to convert output analog level into digital bits).

Figure 10:
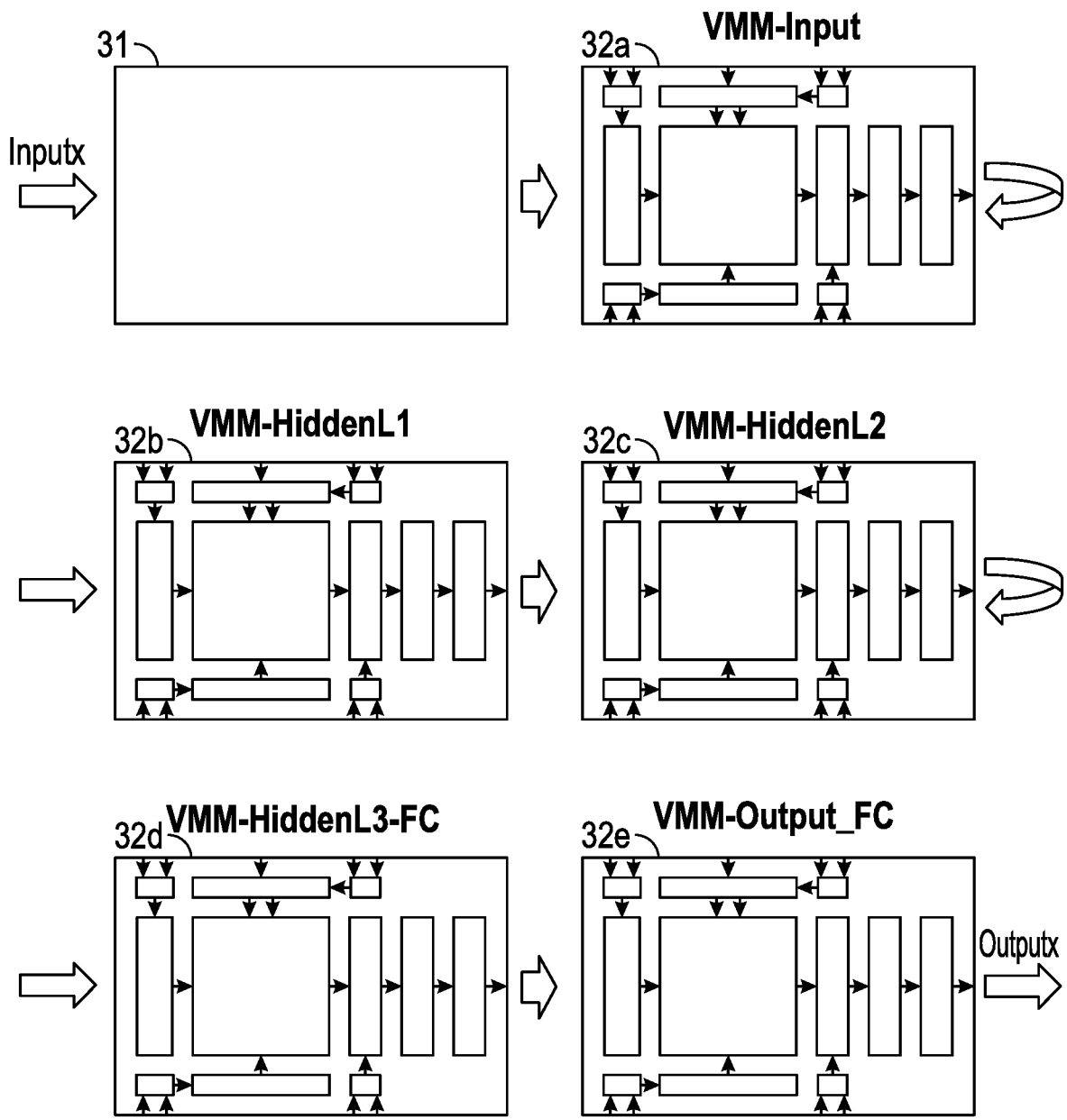
FIG. 10 is a block diagram illustrates an exemplary artificial neural network utilizing one or more a vector-by-matrix multiplication systems.

FIG. 10 is a block diagram depicting the usage of numerous layers of VMM systems 32, here labeled as VMM systems 32a, 32b, 32c, 32d, and 32e. As shown in FIG. 10, the input, denoted Inputx, is converted from digital to analog by a digital-to-analog converter 31, and provided to input VMM system 32a. The converted analog inputs could be voltage or current. The input D/A conversion for the first layer could be done by using a function or a LUT (look up table) that maps the inputs Inputx to appropriate analog levels for the matrix multiplier of input VMM system 32a. The input conversion could also be done by an analog to analog (A/A) converter to convert an external analog input to a mapped analog input to the input VMM system 32a. The input conversion could also be done by a digital-to-digital pules (D/P) converter to convert an external digital input to a mapped digital pulse or pulses to the input VMM system 32a.

The output generated by input VMM system 32a is provided as an input to the next VMM system (hidden level 1) 32b, which in turn generates an output that is provided as an input to the next VMM system (hidden level 2) 32c, and so on. The various layers of VMM system 32 function as different layers of synapses and neurons of a convolutional neural network (CNN). Each VMM system 32a, 32b, 32c, 32d, and 32e can be a stand-alone, physical system comprising a respective non-volatile memory array, or multiple VMM systems could utilize different portions of the same physical non-volatile memory array, or multiple VMM systems could utilize overlapping portions of the same physical non-volatile memory array. Each VMM system 32a, 32b, 32c, 32d, and 32e can also be time multiplexed for various portion of its array or neurons. The example shown in FIG. 10 contains five layers (32a,32b,32c,32d,32e): one input layer (32a), two hidden layers (32b,32c), and two fully connected layers (32d,32e). One of ordinary skill in the art will appreciate that this is merely exemplary and that a system instead could comprise more than two hidden layers and more than two fully connected layers.

VMM Arrays

Figure 11:
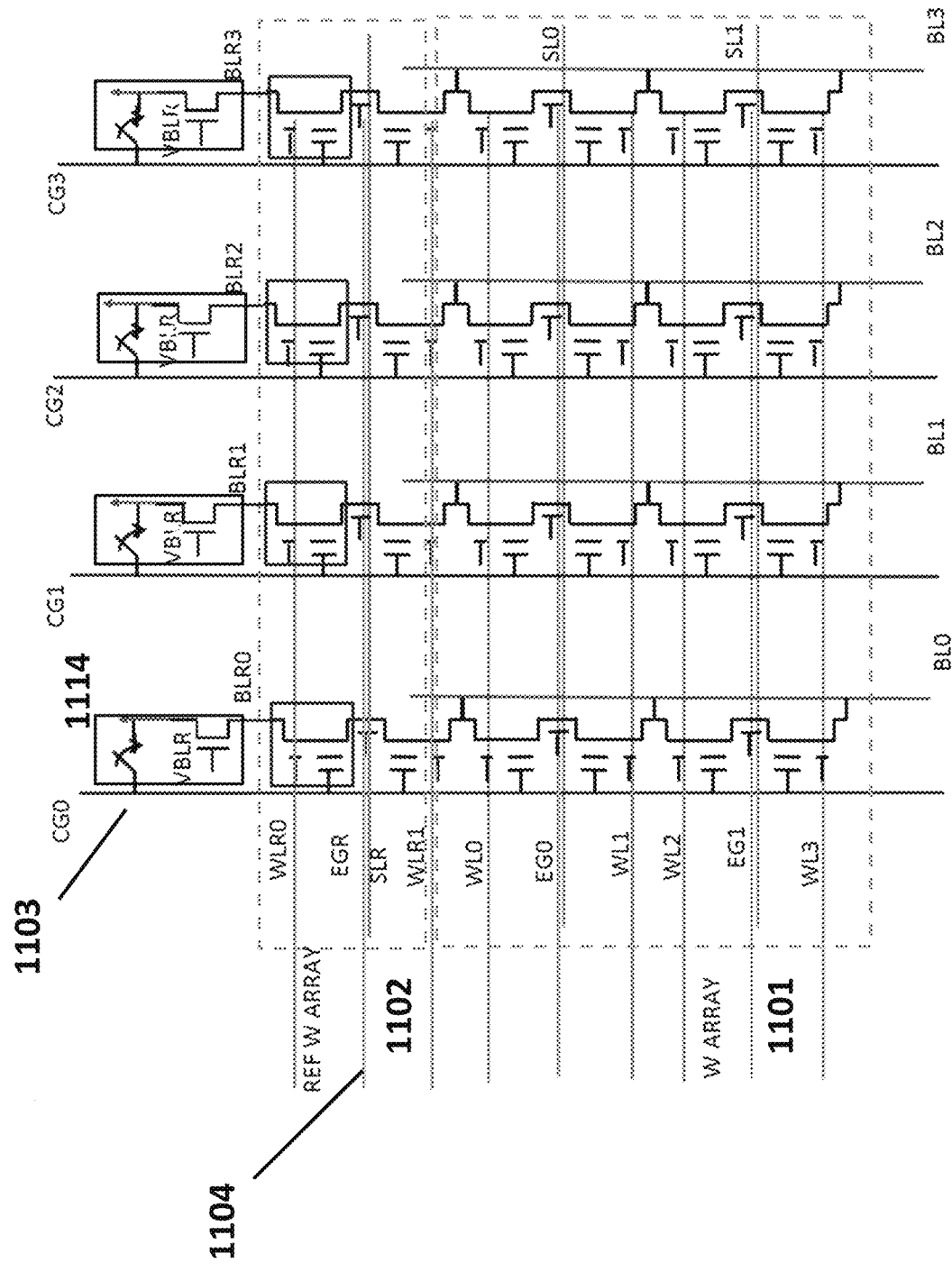
FIG. 11 depicts another embodiment of a vector-by-matrix multiplication system.

FIG. 11 depicts neuron VMM array 1100, which is particularly suited for memory cells 310 as shown in FIG. 3, and is utilized as the synapses and parts of neurons between an input layer and the next layer. VMM array 1100 comprises memory array 1101 of non-volatile memory cells and reference array 1102 (at the top of the array) of non-volatile reference memory cells. Alternatively, another reference array can be placed at the bottom.

In VMM array 1100, control gate lines, such as control gate line 1103, run in a vertical direction (hence reference array 1102 in the row direction is orthogonal to control gate line 1103), and erase gate lines, such as erase gate line 1104, run in a horizontal direction. Here, the inputs to VMM array 1100 are provided on the control gate lines (CG0, CG1, CG2, CG3), and the output of VMM array 1100 emerges on the source lines (SL0, SL1). In one embodiment, only even rows are used, and in another embodiment, only odd rows are used. The current placed on each source line (SL0, SL1, respectively) performs a summing function of all the currents from the memory cells connected to that particular source line.

As described herein for neural networks, the non-volatile memory cells of VMM array 1100, i.e. the flash memory of VMM array 1100, are preferably configured to operate in a sub-threshold region.

The non-volatile reference memory cells and the non-volatile memory cells described herein are biased in weak inversion:

$$Ids = Io * e^{(Vg-Vth)/nVt} = w * Io * e^{(Vg)/nVt},$$

where $w = e^{(-Vth)/nVt}$ where Ids is the drain to source current; Vg is gate voltage on the memory cell; Vth is threshold voltage of the memory cell; Vt is thermal voltage=k*T/q with k being the Boltzmann constant, T the temperature in Kelvin, and q the electronic charge; n is a slope factor=1+(Cdep/Cox) with Cdep=capacitance of the depletion layer, and Cox capacitance of the gate oxide layer; Io is the memory cell current at gate voltage equal to threshold voltage, Io is proportional to $(Wt/L)*u*Cox*(n-1)*Vt^2$ where u is carrier mobility and Wt and L are width and length, respectively, of the memory cell.

For an I-to-V log converter using a memory cell (such as a reference memory cell or a peripheral memory cell) or a transistor to convert input current Ids, into an input voltage, Vg:

$$Vg = n*Vt*\log [Ids/wp*Io]$$

Here, wp is w of a reference or peripheral memory cell.

For an I-to-V log converter using a memory cell (such as a reference memory cell or a peripheral memory cell) or a transistor to convert input current Ids, into an input voltage, Vg:

$$Vg = n*Vt*\log [Ids/wp*Io]$$

Here, wp is w of a reference or peripheral memory cell.

For a memory array used as a vector matrix multiplier VMM array, the output current is:

$Iout = wa*Io*e^{(Vg)/nVt}$, namely $Iout = (wa/wp)*Iin = W*Iin$ $W = e^{(Vthp-Vtha)/nVt}$ $Iin = wp*Io*e^{(Vg)/nVt}$ Here, wa=w of each memory cell in the memory array.

A wordline or control gate can be used as the input for the memory cell for the input voltage.

Alternatively, the non-volatile memory cells of VMM arrays described herein can be configured to operate in the linear region:

$Ids = beta*(Vgs-Vth)*Vds; beta = u*Cox*Wt/L$, $W\alpha(Vgs-Vth)$, meaning weight W in the linear region is proportional to (Vgs-Vth)

A wordline or control gate or bitline or sourceline can be used as the input for the memory cell operated in the linear region. The bitline or sourceline can be used as the output for the memory cell.

For an I-to-V linear converter, a memory cell (such as a reference memory cell or a peripheral memory cell) or a transistor operating in the linear region or a resistor can be used to linearly convert an input/output current into an input/output voltage.

Alternatively, the memory cells of VMM arrays described herein can be configured to operate in the saturation region:

$Ids = \frac{1}{2}*beta*(Vgs-Vth)^2; beta = u*Cox*Wt/L$ $W\alpha(Vgs-Vth)^2$, meaning weight $W$ is proportional to $(Vgs-Vth)^2$ A wordline, control gate, or erase gate can be used as the input for the memory cell operated in the saturation region. The bitline or sourceline can be used as the output for the output neuron.

Alternatively, the memory cells of VMM arrays described herein can be used in all regions or a combination thereof (sub threshold, linear, or saturation).

Other embodiments for VMM array 33 of FIG. 9 are described in U.S. patent application Ser. No. 15/826,345, which is incorporated by reference herein. As described in that application, a sourceline or a bitline can be used as the neuron output (current summation output).

Figure 12:
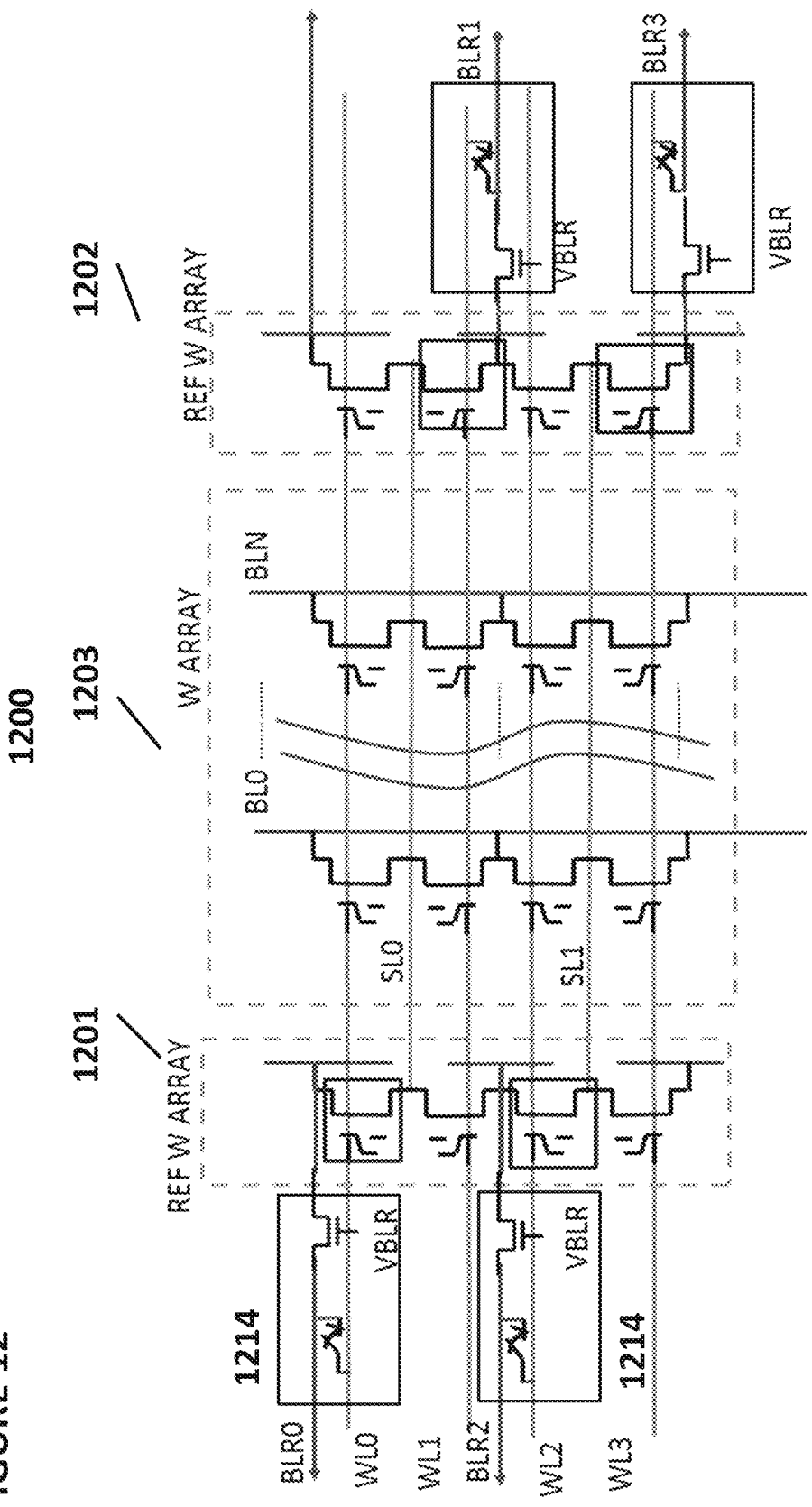
FIG. 12 depicts another embodiment of a vector-by-matrix multiplication system.

FIG. 12 depicts neuron VMM array 1200, which is particularly suited for memory cells 210 as shown in FIG. 2, and is utilized as the synapses between an input layer and the next layer. VMM array 1200 comprises a memory array 1203 of non-volatile memory cells, reference array 1201 of first non-volatile reference memory cells, and reference array 1202 of second non-volatile reference memory cells.

Reference arrays 1201 and 1202, arranged in the column direction of the array, serve to convert current inputs flowing into terminals BLR0, BLR1, BLR2, and BLR3 into voltage inputs WL0, WL1, WL2, and WL3. In effect, the first and second non-volatile reference memory cells are diode-connected through multiplexors 1214 (only partially depicted) with current inputs flowing into them. The reference cells are tuned (e.g., programmed) to target reference levels. The target reference levels are provided by a reference mini-array matrix (not shown).

Memory array 1203 serves two purposes. First, it stores the weights that will be used by the VMM array 1200 on respective memory cells thereof. Second, memory array 1203 effectively multiplies the inputs (i.e. current inputs provided in terminals BLR0, BLR1, BLR2, and BLR3, which reference arrays 1201 and 1202 convert into the input voltages to supply to wordlines WL0, WL1, WL2, and WL3) by the weights stored in the memory array 1203 and then adds all the results (memory cell currents) to produce the output on the respective bit lines (BL0-BLN), which will be the input to the next layer or input to the final layer. By performing the multiplication and addition function, memory array 1203 negates the need for separate multiplication and addition logic circuits and is also power efficient. Here, the voltage inputs are provided on the word lines WL0, WL1, WL2, and WL3, and the output emerges on the respective bit lines BL0-BLN during a read (inference) operation. The current placed on each of the bit lines BL0-BLN performs a summing function of the currents from all non-volatile memory cells connected to that particular bitline.

Table No. 5 depicts operating voltages for VMM array 1200. The columns in the table indicate the voltages placed on word lines for selected cells, word lines for unselected cells, bit lines for selected cells, bit lines for unselected cells, source lines for selected cells, and source lines for unselected cells, where FLT indicates floating, i.e. no voltage is imposed. The rows indicate the operations of read, erase, and program.

TABLE NO. 5

Operation of VMM Array 1200 of FIG. 12:

| | WL | WL -unsel | BL | BL -unsel | SL | SL -unsel |
|---|---|---|---|---|---|---|
| Read | 0.5-3.5 V | −0.5 V/0 V | 0.1-2 V (Ineuron) | 0.6 V-2 V/FLT | 0 V | 0 V |
| Erase | ~5-13 V | 0 V | 0 V | 0 V | 0 V | 0 V |
| Program | 1-2 V | −0.5 V/0 V | 0.1-3 uA | Vinh ~2.5 V | 4-10 V | 0-1 V/FLT |

Figure 13:
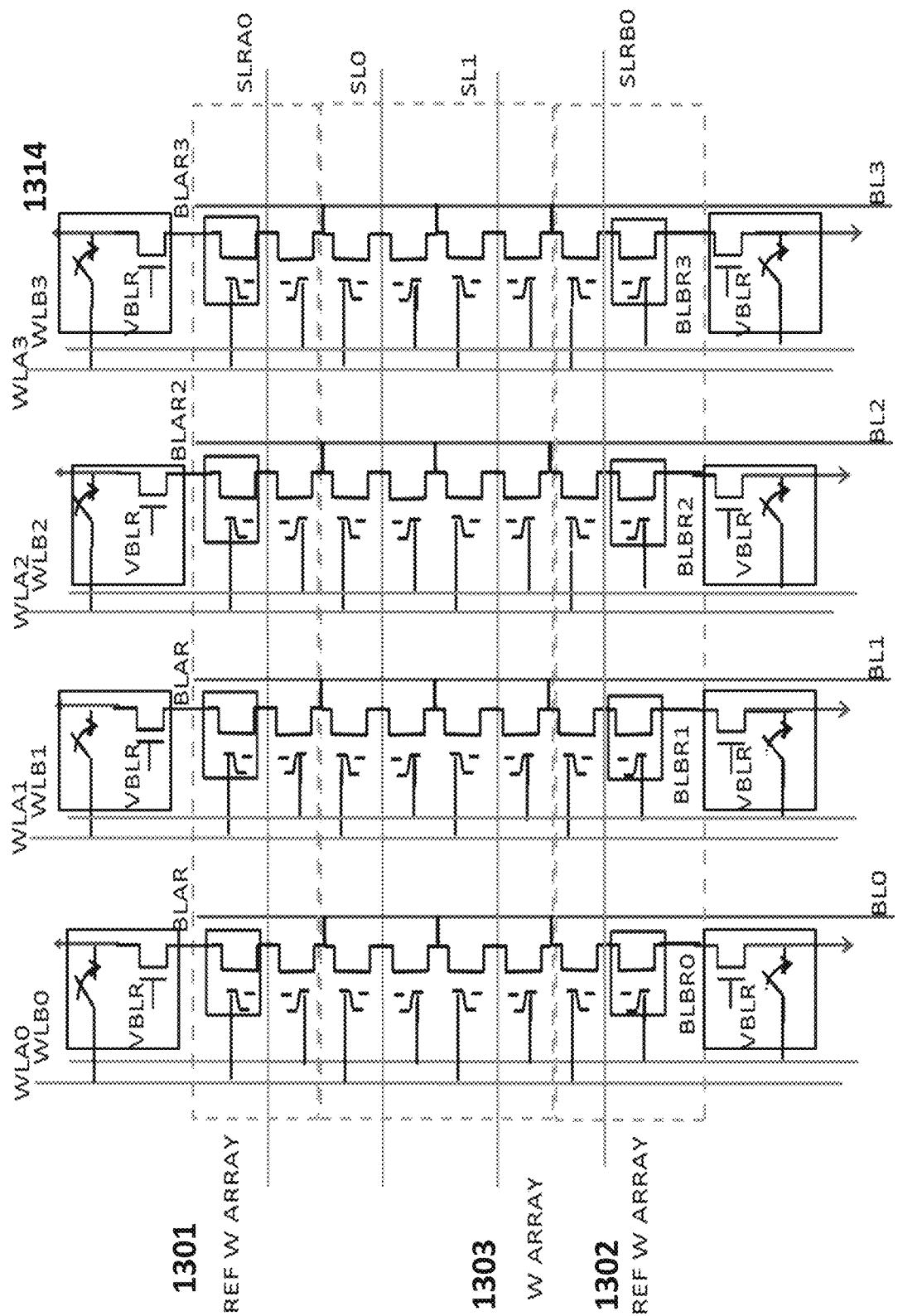
FIG. 13 depicts another embodiment of a vector-by-matrix multiplication system.

FIG. 13 depicts neuron VMM array 1300, which is particularly suited for memory cells 210 as shown in FIG. 2, and is utilized as the synapses and parts of neurons between an input layer and the next layer. VMM array 1300 comprises a memory array 1303 of non-volatile memory cells, reference array 1301 of first non-volatile reference memory cells, and reference array 1302 of second non-volatile reference memory cells. Reference arrays 1301 and 1302 run in row direction of the VMM array 1300. VMM array is similar to VMM 1000 except that in VMM array 1300, the word lines run in the vertical direction. Here, the inputs are provided on the word lines (WLA0, WLB0, WLA1, WLB2, WLA2, WLB2, WLA3, WLB3), and the output emerges on the source line (SL0, SL1) during a read operation. The current placed on each source line performs a summing function of all the currents from the memory cells connected to that particular source line.

Table No. 6 depicts operating voltages for VMM array 1300. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

power efficient. Here, the inputs are provided on the control gate lines (CG0, CG1, CG2, and CG3), and the output emerges on the bitlines (BL0-BLN) during a read operation. The current placed on each bitline performs a summing function of all the currents from the memory cells connected to that particular bitline.

VMM array 1400 implements uni-directional tuning for non-volatile memory cells in memory array 1403. That is, each non-volatile memory cell is erased and then partially programmed until the desired charge on the floating gate is

TABLE NO. 6

Operation of VMM Array 1300 of FIG. 13

|  | WL | WL -unsel | BL | BL -unsel | SL | SL -unsel |
|---|---|---|---|---|---|---|
| Read | 0.5-3.5 V | −0.5 V/0 V | 0.1-2 V | 0.1 V-2 V/FLT | ~0.3-1 V (Ineuron) | 0 V |
| Erase | ~5-13 V | 0 V | 0 V | 0 V | 0 V | SL-inhibit (~4-8 V) |
| Program | 1-2 V | −0.5 V/0 V | 0.1-3 uA | Vinh ~2.5 V | 4-10 V | 0-1 V/FLT |

Figure 14:
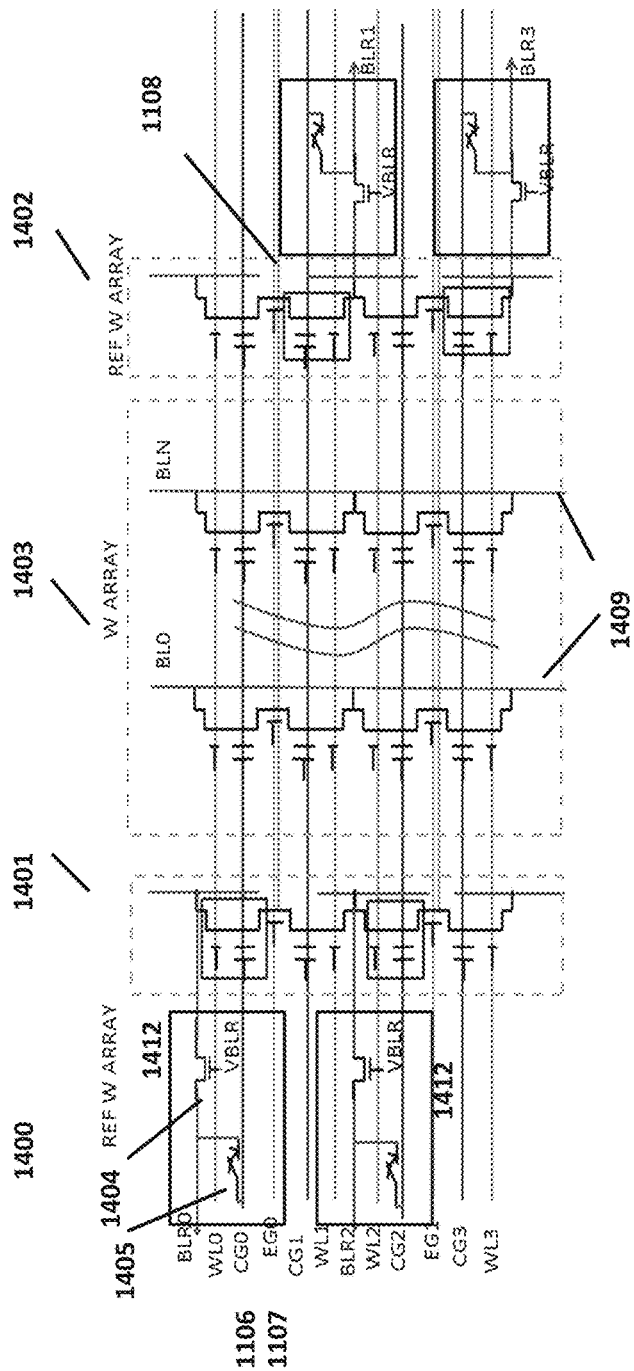
FIG. 14 depicts another embodiment of a vector-by-matrix multiplication system.

FIG. 14 depicts neuron VMM array 1400, which is particularly suited for memory cells 310 as shown in FIG. 3, and is utilized as the synapses and parts of neurons between an input layer and the next layer. VMM array 1400 comprises a memory array 1403 of non-volatile memory cells, reference array 1401 of first non-volatile reference memory cells, and reference array 1402 of second non-volatile reference memory cells. Reference arrays 1401 and 1402 serve to convert current inputs flowing into terminals BLR0, BLR1, BLR2, and BLR3 into voltage inputs CG0, CG1, CG2, and CG3. In effect, the first and second non-volatile reference memory cells are diode-connected through multiplexors 1412 (only partially shown) with current inputs flowing into them through BLR0, BLR1, BLR2, and BLR3. Multiplexors 1412 each include a respective multiplexor 1405 and a cascoding transistor 1404 to ensure a constant voltage on the bitline (such as BLR0) of each of the first and second non-volatile reference memory cells during a read operation. The reference cells are tuned to target reference levels.

Memory array 1403 serves two purposes. First, it stores the weights that will be used by the VMM array 1400.

reached. This can be performed, for example, using the precision programming techniques described below. If too much charge is placed on the floating gate (such that the wrong value is stored in the cell), the cell must be erased and the sequence of partial programming operations must start over. As shown, two rows sharing the same erase gate (such as EG0 or EG1) need to be erased together (which is known as a page erase), and thereafter, each cell is partially programmed until the desired charge on the floating gate is reached.

Table No. 7 depicts operating voltages for VMM array 1400. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE NO. 7

Operation of VMM Array 1400 of FIG. 14

|  | WL | WL - unsel | BL | BL - unsel | CG | CG - unsel samesector | CG - unsel | EG | EG - unsel | SL | SL - unsel |
|---|---|---|---|---|---|---|---|---|---|---|---|
| Read | 0.5-2 V | −0.5 V/0 V | 0.1-2 V (Ineuron) | 0 V/FLT | 0-2.6 V | 0-2.6 V | 0-2.6 V | 0-2.6 V | 0-2.6 V | 0 V | 0 V |
| Erase | 0 V | 0 V | 0 V | 0 V | 0 V | 0-2.6 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

Figure 15:
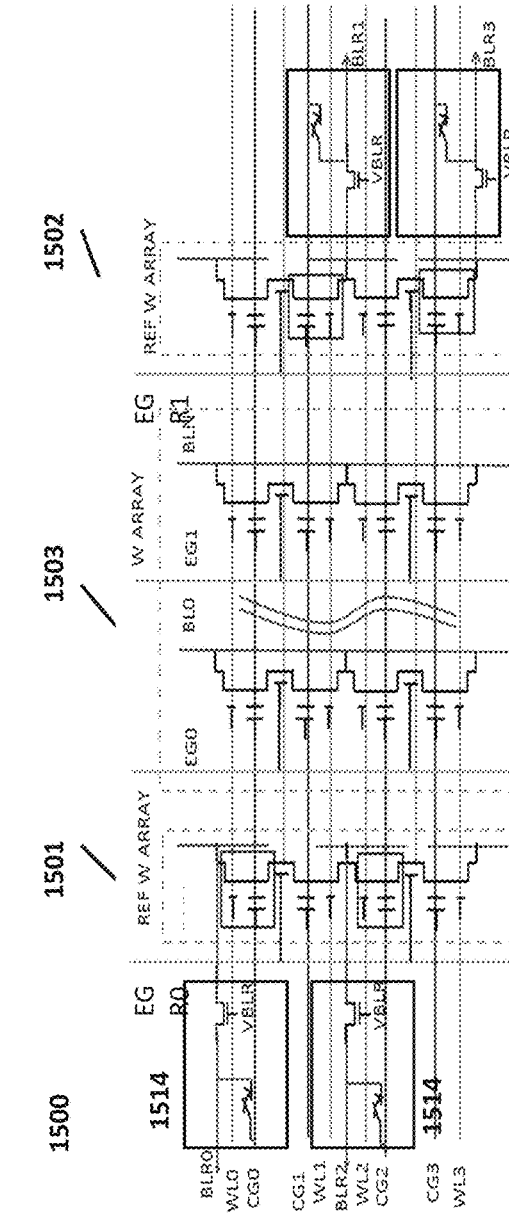
FIG. 15 depicts another embodiment of a vector-by-matrix multiplication system.

Second, memory array 1403 effectively multiplies the inputs (current inputs provided to terminals BLR0, BLR1, BLR2, and BLR3, for which reference arrays 1401 and 1402 convert these current inputs into the input voltages to supply to the control gates (CG0, CG1, CG2, and CG3) by the weights stored in the memory array and then add all the results (cell currents) to produce the output, which appears on BL0-BLN, and will be the input to the next layer or input to the final layer. By performing the multiplication and addition function, the memory array negates the need for separate multiplication and addition logic circuits and is also FIG. 15 depicts neuron VMM array 1500, which is particularly suited for memory cells 310 as shown in FIG. 3, and is utilized as the synapses and parts of neurons between an input layer and the next layer. VMM array 1500 comprises a memory array 1503 of non-volatile memory cells, reference array 1501 or first non-volatile reference memory cells, and reference array 1502 of second non-volatile reference memory cells. EG lines EGR0, EG0, EG1 and EGR1 are run vertically while CG lines CG0, CG1, CG2 and CG3 and SL lines WL0, WL1, WL2 and WL3 are run horizontally. VMM array 1500 is similar to VMM array 1400, except that VMM array 1500 implements bi-directional tuning, where each individual cell can be completely erased, partially programmed, and partially erased as needed to reach the desired amount of charge on the floating gate due to the use of separate EG lines. As shown, reference arrays 1501 and 1502 convert input current in the terminal BLR0, BLR1, BLR2, and BLR3 into control gate voltages CG0, CG1, CG2, and CG3 (through the action of diode-connected reference cells through multiplexors 1514) to be applied to the memory cells in the row direction. The current output (neuron) is in the bitlines BL0-BLN, where each bit line sums all currents from the non-volatile memory cells connected to that particular bitline.

Table No. 8 depicts operating voltages for VMM array 1500. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

$WL_0, \ldots, WL_M$, respectively, and the outputs $OUTPUT_0, \ldots OUTPUT_N$ are generated on bit lines $BL_0, \ldots, BL_N$.

Figure 20:
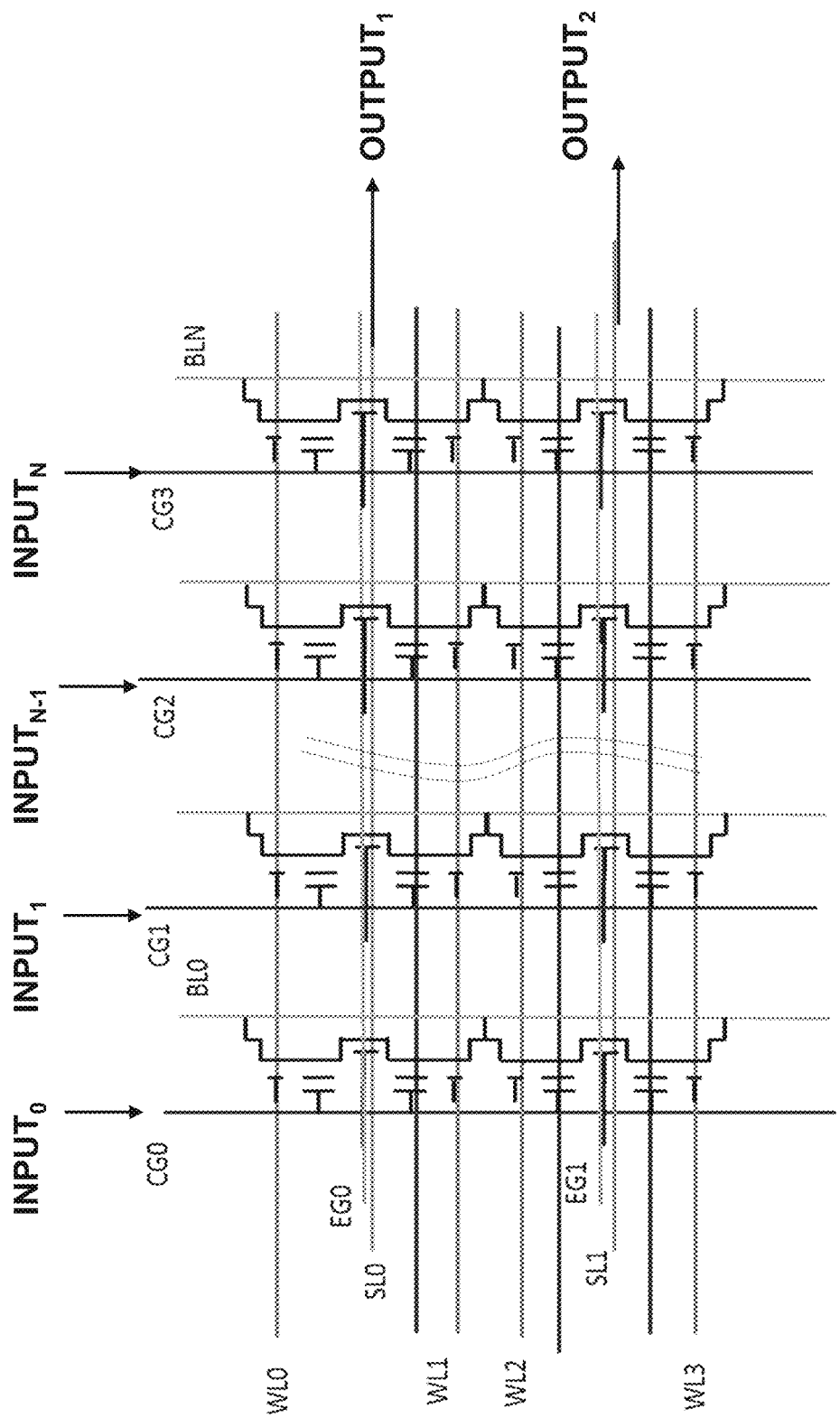
FIG. 20 depicts another embodiment of a vector-by-matrix multiplication system.

FIG. 20 depicts neuron VMM array 2000, which is particularly suited for memory cells 410 as shown in FIG. 4, and is utilized as the synapses and parts of neurons between an input layer and the next layer. In this example, the inputs $INPUT_0, \ldots, INPUT_n$ are received on vertical control gate lines $CG_0, \ldots, CG_N$, respectively, and the outputs $OUTPUT_1$ and $OUTPUT_2$ are generated on source lines $SL_0$ and $SL_1$.

Figure 21:
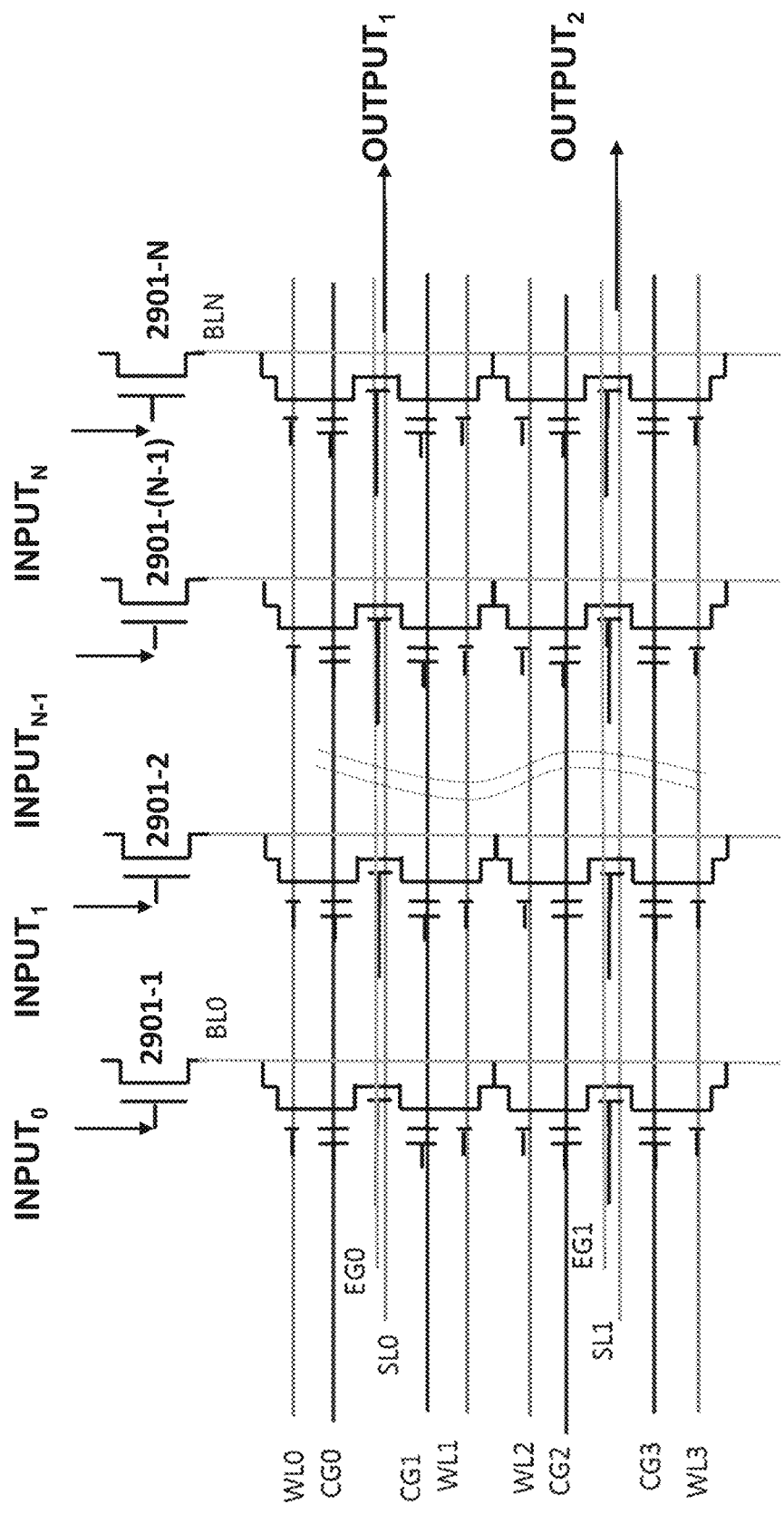
FIG. 21 depicts another embodiment of a vector-by-matrix multiplication system.

FIG. 21 depicts neuron VMM array 2100, which is particularly suited for memory cells 410 as shown in FIG. 4, and is utilized as the synapses and parts of neurons between an input layer and the next layer. In this example, the inputs $INPUT_0, \ldots, INPUT_N$ are received on the gates of bit line control gates 2901-1, 2901-2, ..., 2901-(N−1), and 2901-N, respectively, which are coupled to bit lines $BL_0, \ldots, BL_N$, respectively. Exemplary outputs $OUTPUT_1$ and $OUTPUT_2$ are generated on source lines $SL_0$ and $SL_1$.

Figure 22:
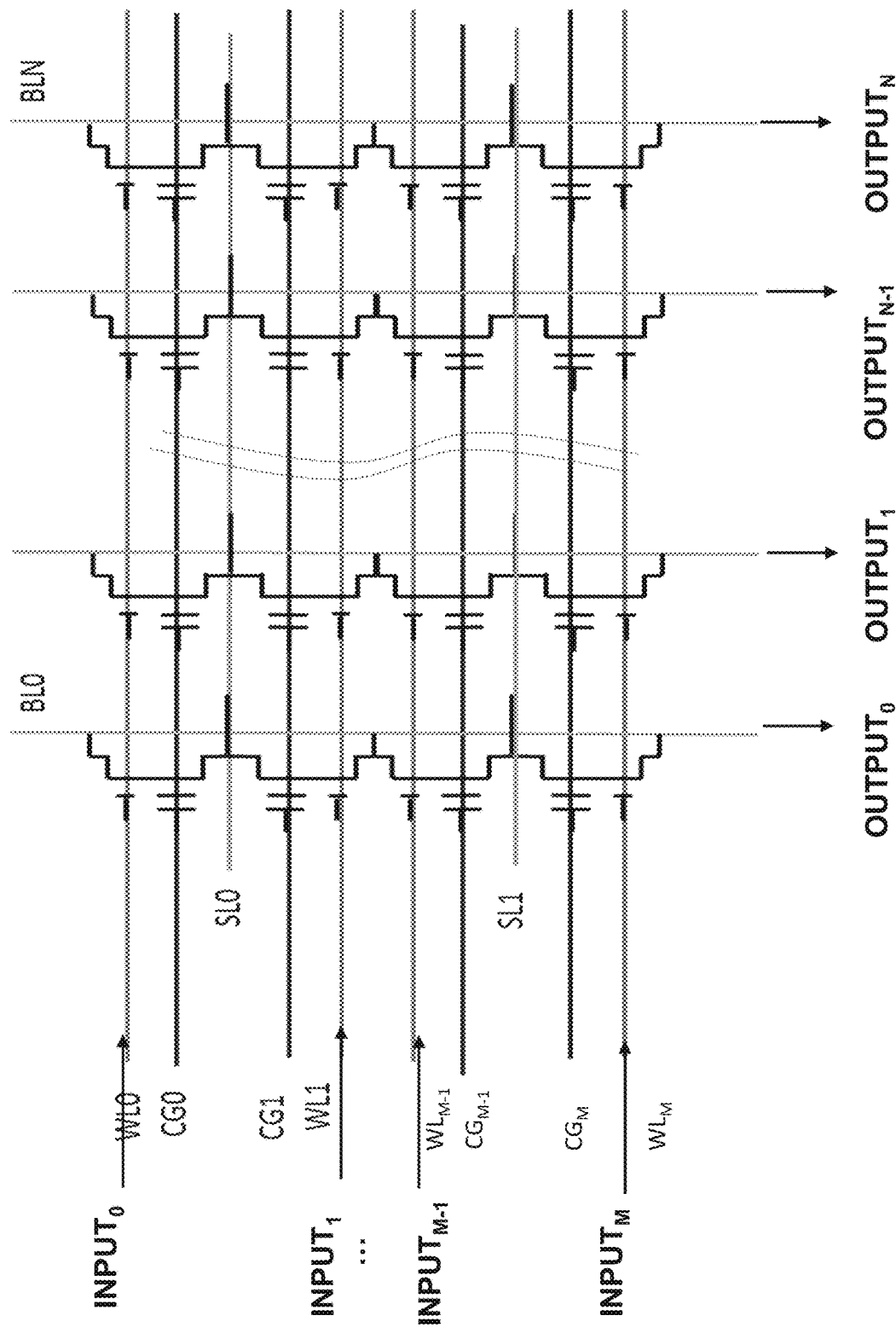
FIG. 22 depicts another embodiment of a vector-by-matrix multiplication system.

FIG. 22 depicts neuron VMM array 2200, which is particularly suited for memory cells 310 as shown in FIG. 3, memory cells 510 as shown in FIG. 5, and memory cells 710 as shown in FIG. 7, and is utilized as the synapses and parts

TABLE NO. 8

Operation of VMM Array 1500 of FIG. 15

| | WL | WL - unsel | BL | BL - unsel | CG | CG -unsel samesector | CG - unsel | EG | EG - unsel | SL | SL - unsel |
|---|---|---|---|---|---|---|---|---|---|---|---|
| Read | 1.0-2 V | −0.5 V/0 V | 0.6-2 V (Ineuron) | 0 V/FLT | 0-2.6 V | 0-2.6 V | 0-2.6 V | 0-2.6 V | 0-2.6 V | 0 V | 0 V/FLT |
| Erase | 0 V | 0 V | 0 V | 0 V | 0 V | 4-9 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

Figure 16:
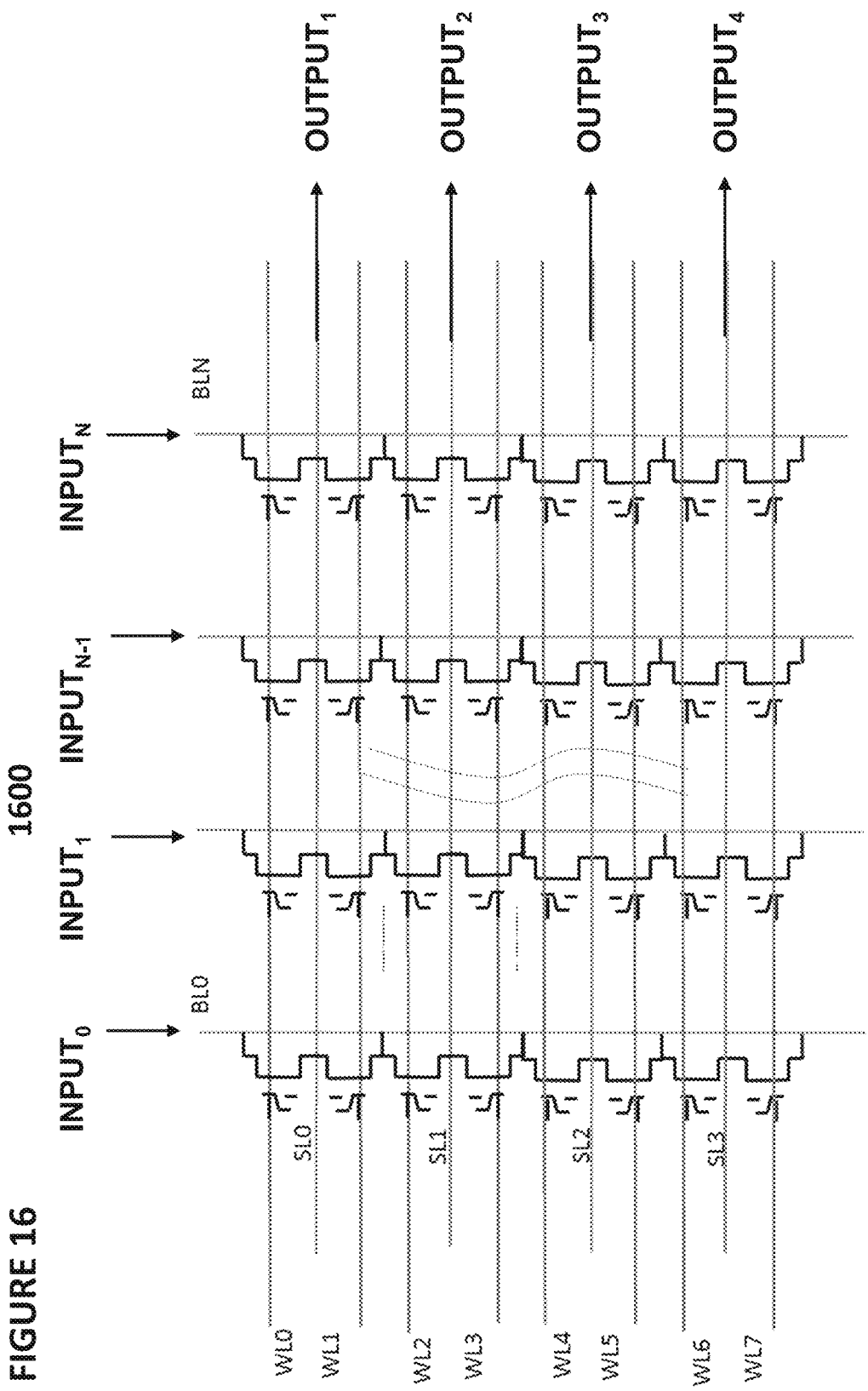
FIG. 16 depicts another embodiment of a vector-by-matrix multiplication system.

FIG. 16 depicts neuron VMM array 1600, which is particularly suited for memory cells 210 as shown in FIG. 2, and is utilized as the synapses and parts of neurons between an input layer and the next layer. In VMM array 1600, the inputs $INPUT_0, \ldots, INPUT_N$ are received on bit lines $BL_0, \ldots BL_N$, respectively, and the outputs $OUTPUT_1$, $OUTPUT_2$, $OUTPUT_3$, and $OUTPUT_4$ are generated on source lines $SL_0$, $SL_1$, $SL_2$, and $SL_3$, respectively.

Figure 17:
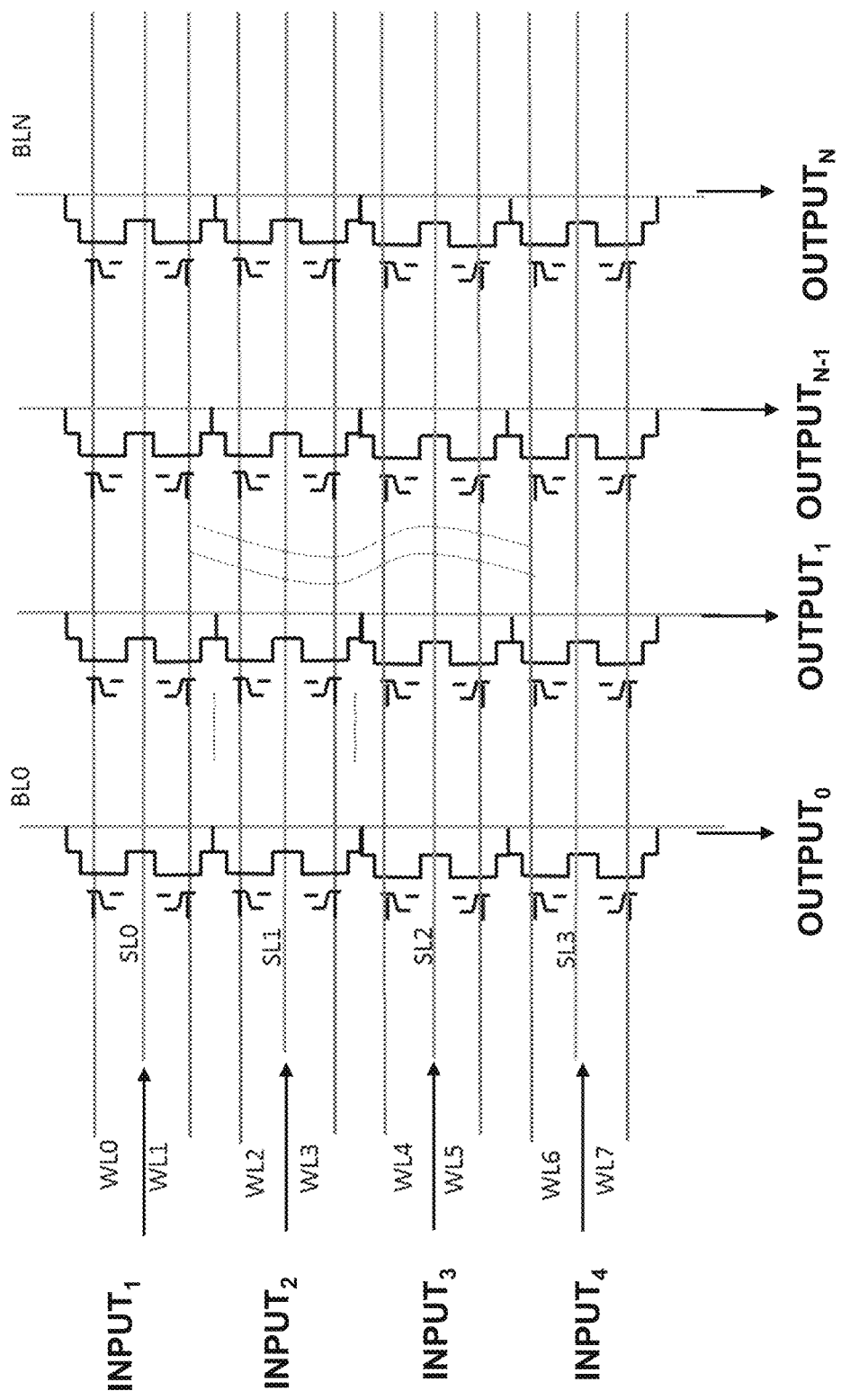
FIG. 17 depicts another embodiment of a vector-by-matrix multiplication system.

FIG. 17 depicts neuron VMM array 1700, which is particularly suited for memory cells 210 as shown in FIG. 2, and is utilized as the synapses and parts of neurons between an input layer and the next layer. In this example, the inputs $INPUT_0$, $INPUT_1$, $INPUT_2$, and INPUTS are received on source lines $SL_0$, $SL_1$, $SL_2$, and $SL_3$, respectively, and the outputs $OUTPUT_0, \ldots OUTPUT_N$ are generated on bit lines $BL_0, \ldots, BL_N$.

Figure 18:
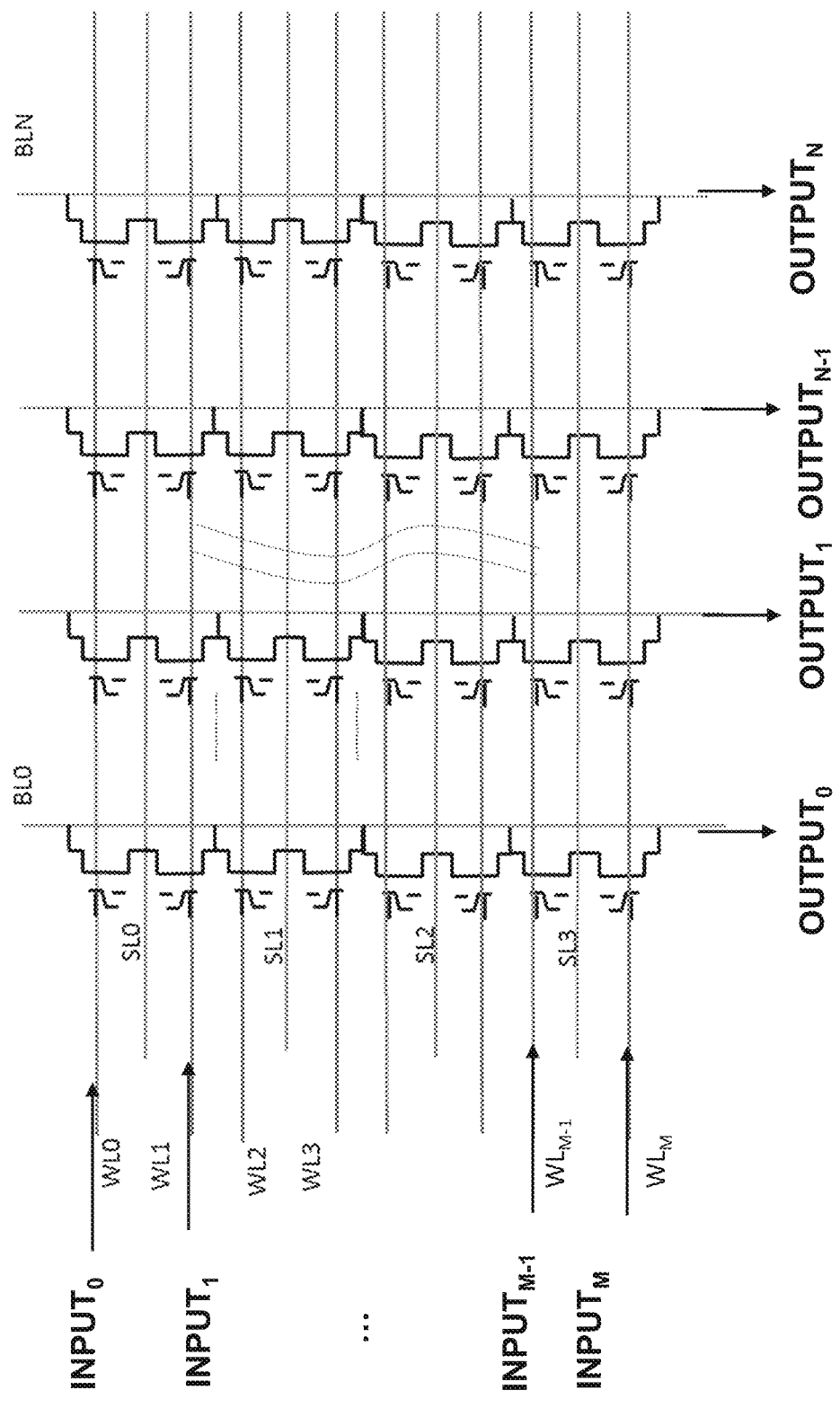
FIG. 18 depicts another embodiment of a vector-by-matrix multiplication system.

FIG. 18 depicts neuron VMM array 1800, which is particularly suited for memory cells 210 as shown in FIG. 2, and is utilized as the synapses and parts of neurons between an input layer and the next layer. In this example, the inputs $INPUT_0, \ldots, INPUT_M$ are received on word lines $WL_0, \ldots, WL_M$, respectively, and the outputs $OUTPUT_0, \ldots OUTPUT_N$ are generated on bit lines $BL_0, \ldots, BL_N$.

Figure 19:
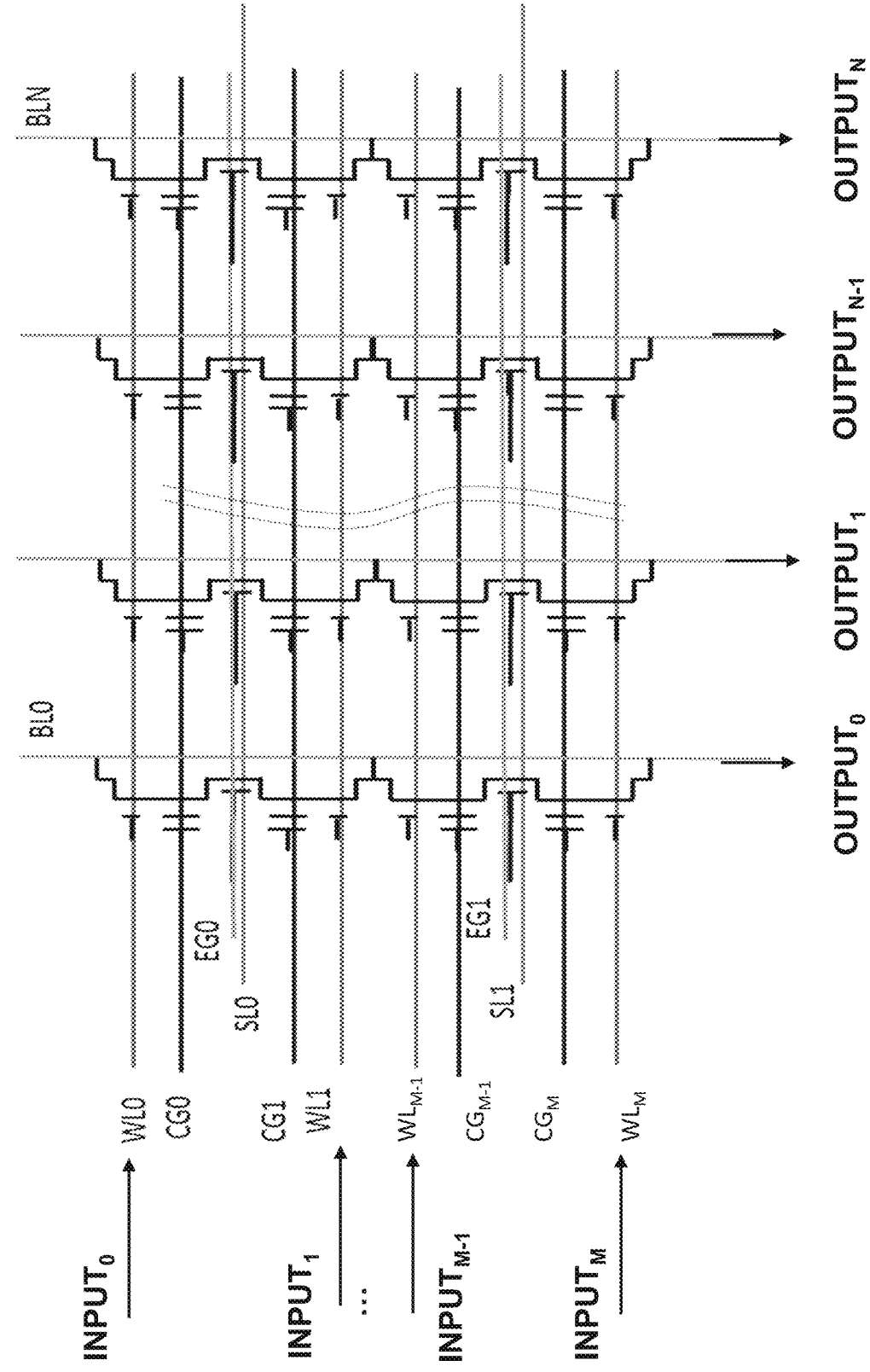
FIG. 19 depicts another embodiment of a vector-by-matrix multiplication system.

FIG. 19 depicts neuron VMM array 1900, which is particularly suited for memory cells 310 as shown in FIG. 3, and is utilized as the synapses and parts of neurons between an input layer and the next layer. In this example, the inputs $INPUT_0, \ldots, INPUT_M$ are received on word lines of neurons between an input layer and the next layer. In this example, the inputs $INPUT_0, \ldots, INPUT_M$ are received on word lines $WL_0, \ldots, WL_M$, and the outputs $OUTPUT_0, \ldots, OUTPUT_N$ are generated on bit lines $BL_0, \ldots, BL_N$, respectively.

Figure 23:
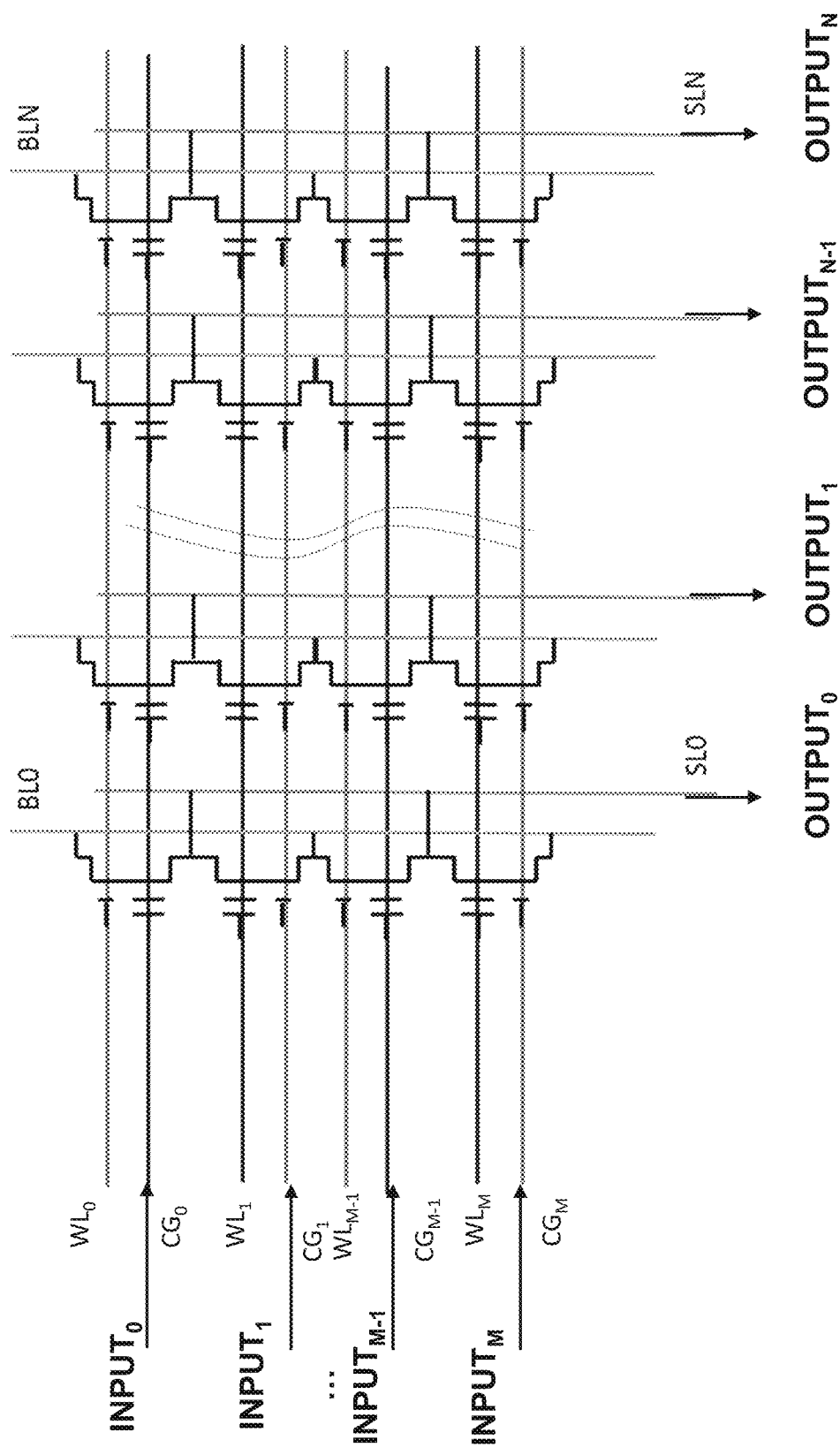
FIG. 23 depicts another embodiment of a vector-by-matrix multiplication system.

FIG. 23 depicts neuron VMM array 2300, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0, \ldots, INPUT_M$ are received on control gate lines $CG_0, \ldots, CG_M$. Outputs $OUTPUT_0, \ldots, OUTPUT_N$ are generated on vertical source lines $SL_0, \ldots, SL_N$, respectively, where each source line $SL_i$ is coupled to the source lines of all memory cells in column i.

Figure 24:
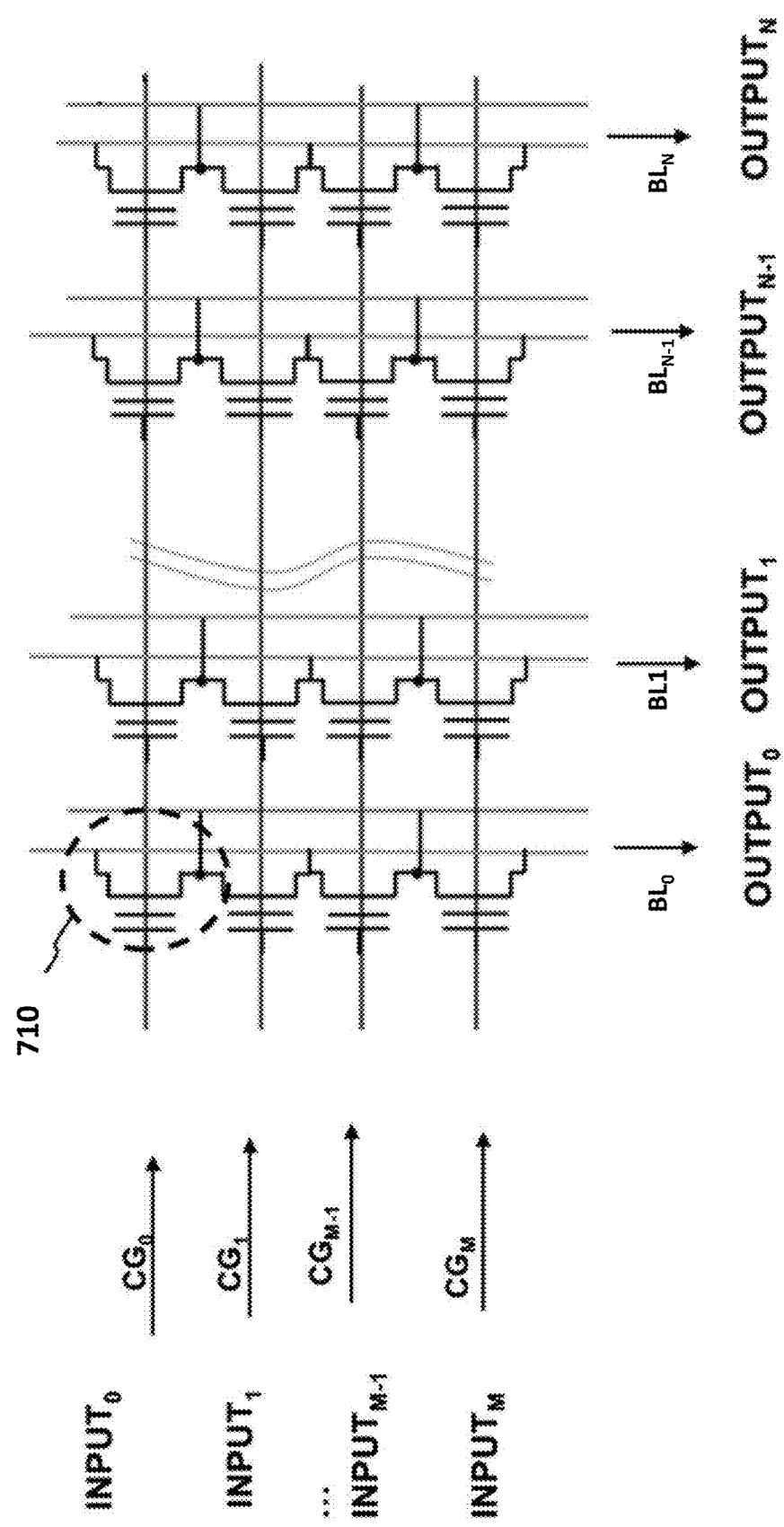
FIG. 24 depicts another embodiment of a vector-by-matrix multiplication system.

FIG. 24 depicts neuron VMM array 2400, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0, \ldots, INPUT_M$ are received on control gate lines $CG_0, \ldots, CG_M$. Outputs $OUTPUT_0, OUTPUT_N$ are generated on vertical bit lines $BL_0, \ldots, BL_N$, respectively, where each bit line $BL_i$ is coupled to the bit lines of all memory cells in column i.

Long Short-Term Memory

The prior art includes a concept known as long short-term memory (LSTM). LSTM units often are used in neural networks. LSTM allows a neural network to remember information over predetermined arbitrary time intervals and to use that information in subsequent operations. A conventional LSTM unit comprises a cell, an input gate, an output gate, and a forget gate. The three gates regulate the flow of information into and out of the cell and the time interval that the information is remembered in the LSTM. VMMs are particularly useful in LSTM units.

Figure 25:
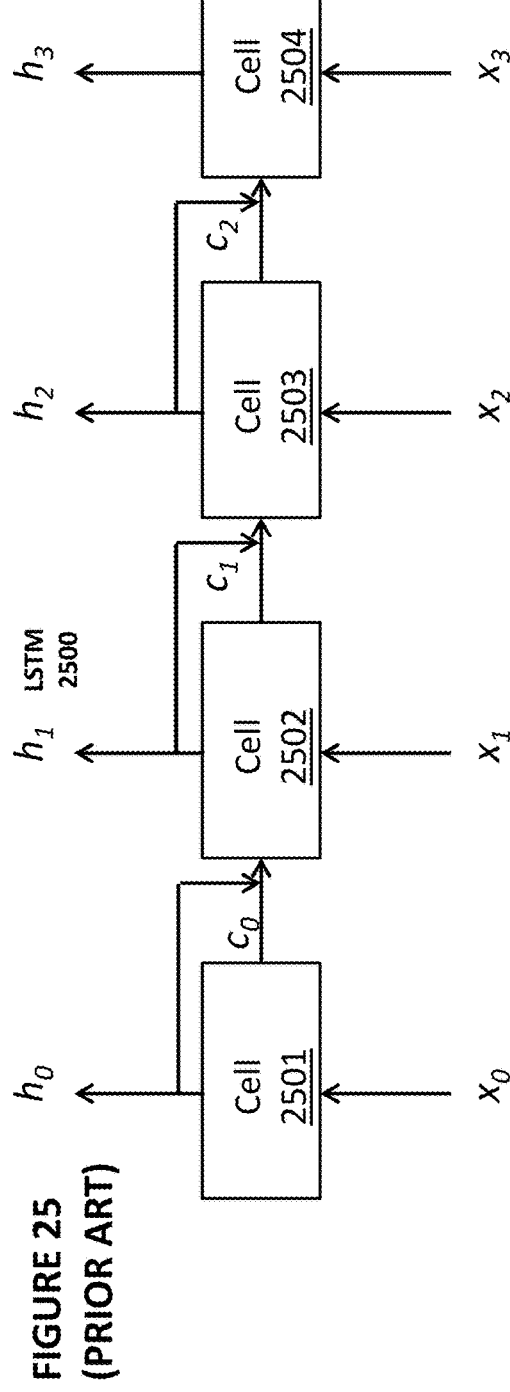
FIG. 25 depicts a prior art long short term memory system.

FIG. 25 depicts an exemplary LSTM 2500. LSTM 2500 in this example comprises cells 2501, 2502, 2503, and 2504. Cell 2501 receives input vector $x_0$ and generates output vector $h_0$ and cell state vector $c_0$. Cell 2502 receives input vector $x_1$, the output vector (hidden state) $h_0$ from cell 2501, and cell state $c_0$ from cell 2501 and generates output vector $h_1$ and cell state vector $c_1$. Cell 2503 receives input vector $x_2$, the output vector (hidden state) $h_1$ from cell 2502, and cell state $c_1$ from cell 2502 and generates output vector $h_2$ and cell state vector $c_2$. Cell 2504 receives input vector $x_3$, the output vector (hidden state) $h_2$ from cell 2503, and cell state c from cell 2503 and generates output vector $h_3$. Additional cells can be used, and an LSTM with four cells is merely an example.

Figure 26:
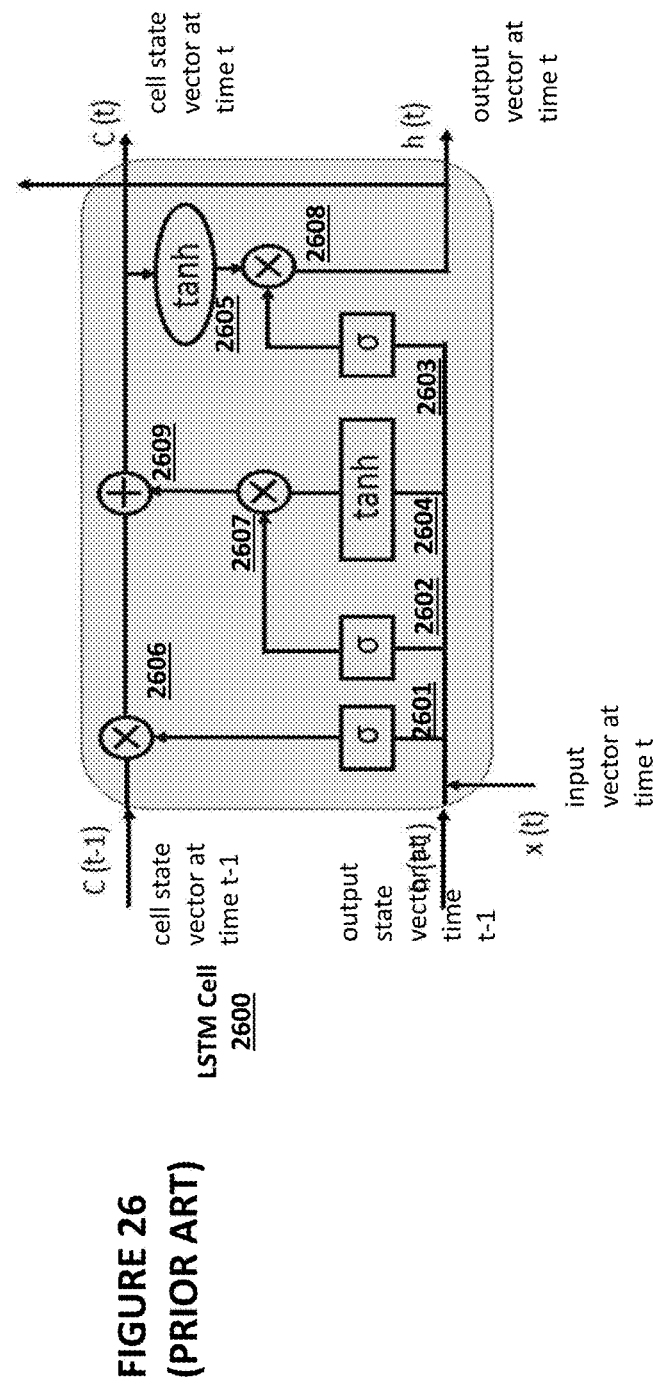
FIG. 26 depicts an exemplary cell for use in a long short term memory system.

FIG. 26 depicts an exemplary implementation of an LSTM cell 2600, which can be used for cells 2501, 2502, 2503, and 2504 in FIG. 25. LSTM cell 2600 receives input vector x(t), cell state vector c(t−1) from a preceding cell, and output vector h(t−1) from a preceding cell, and generates cell state vector c(t) and output vector h(t).

LSTM cell 2600 comprises sigmoid function devices 2601, 2602, and 2603, each of which applies a number between 0 and 1 to control how much of each component in the input vector is allowed through to the output vector. LSTM cell 2600 also comprises tan h devices 2604 and 2605 to apply a hyperbolic tangent function to an input vector, multiplier devices 2606, 2607, and 2608 to multiply two vectors together, and addition device 2609 to add two vectors together. Output vector h(t) can be provided to the next LSTM cell in the system, or it can be accessed for other purposes.

Figure 27:
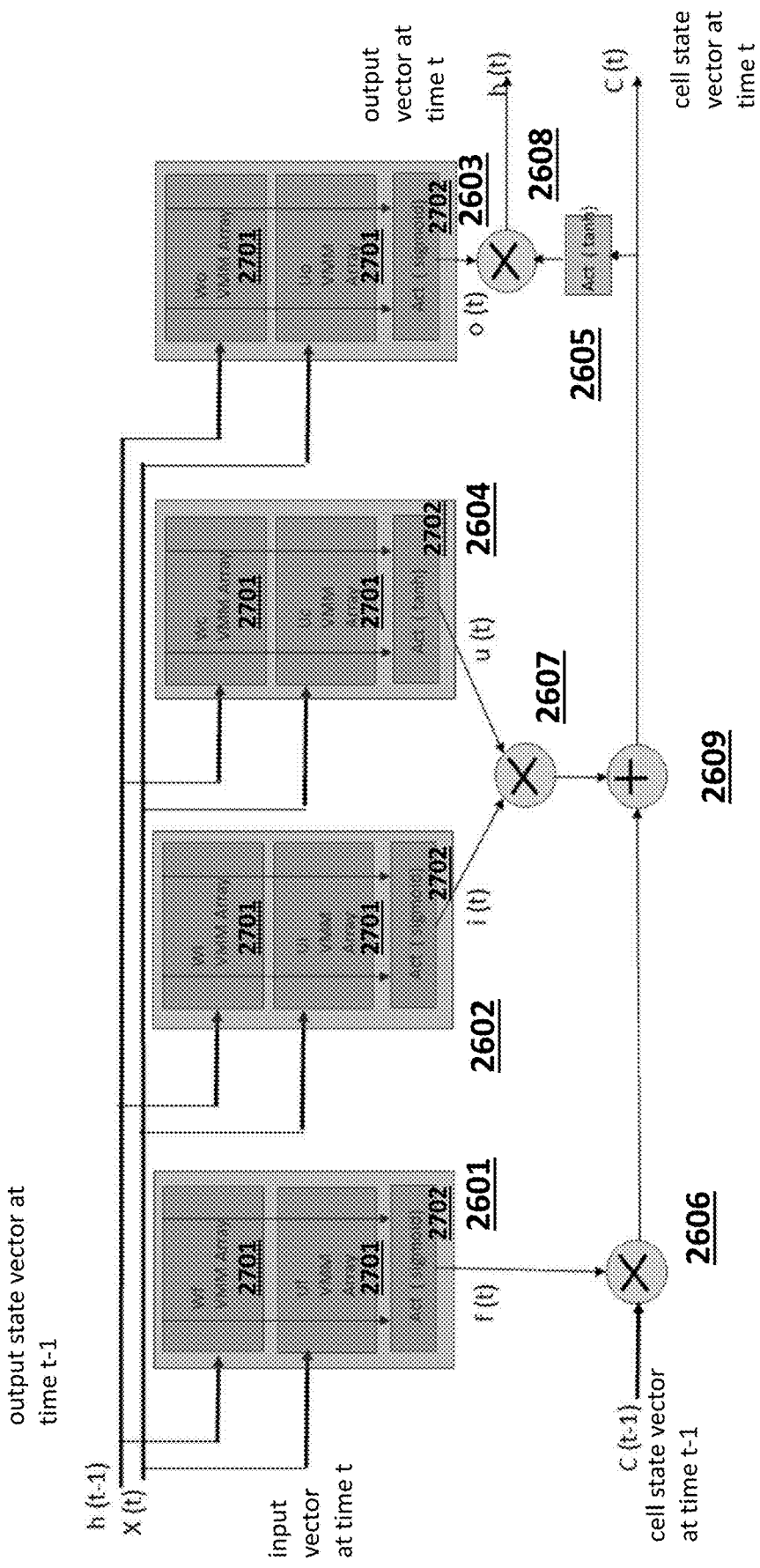
FIG. 27 depicts an embodiment of the exemplary cell of FIG. 26.

FIG. 27 depicts an LSTM cell 2700, which is an example of an implementation of LSTM cell 2600. For the reader's convenience, the same numbering from LSTM cell 2600 is used in LSTM cell 2700. Sigmoid function devices 2601, 2602, and 2603 and tan h device 2604 each comprise multiple VMM arrays 2701 and activation circuit blocks 2702. Thus, it can be seen that VMM arrays are particular useful in LSTM cells used in certain neural network systems.

Figure 28:
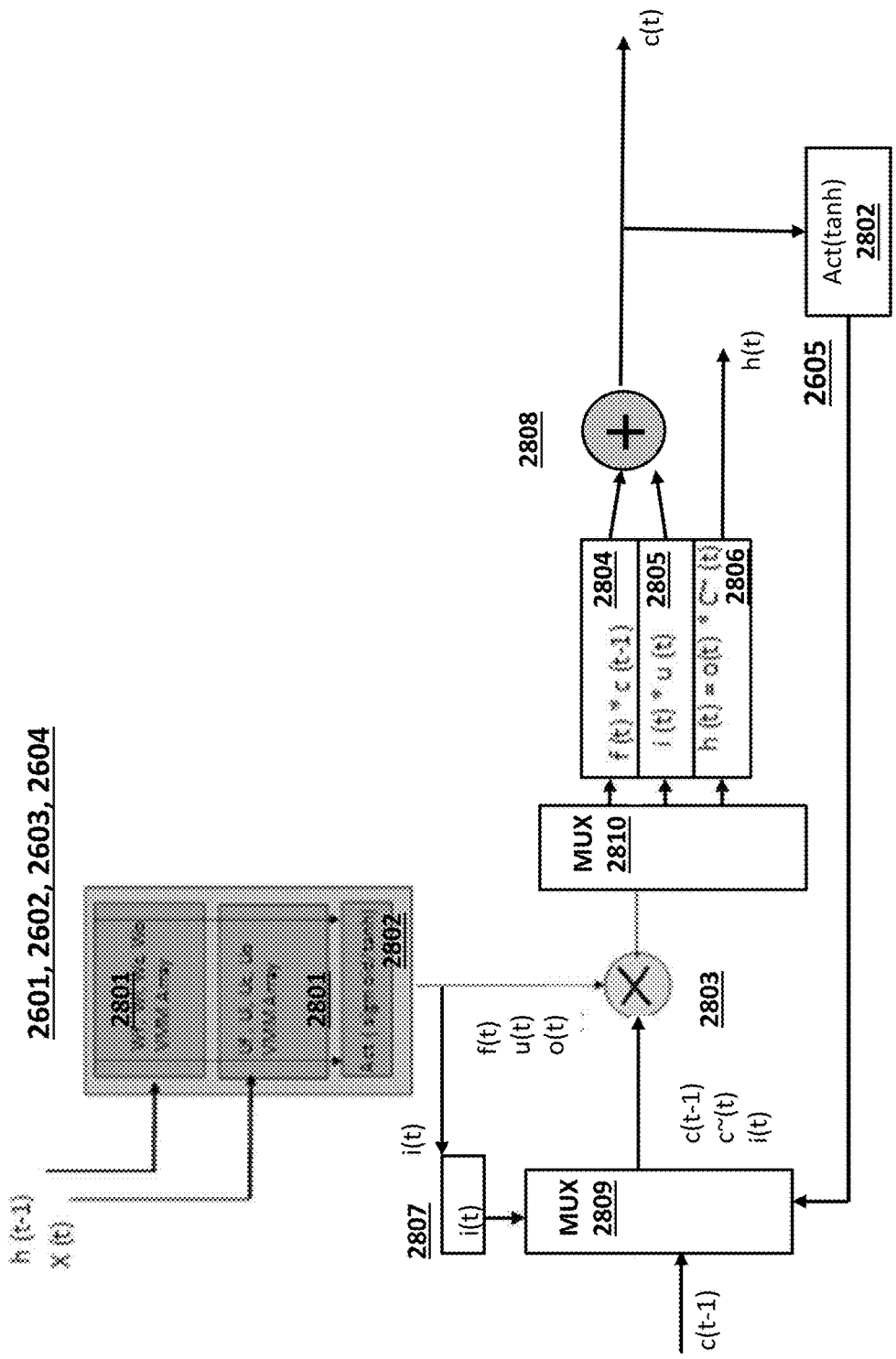
FIG. 28 depicts another embodiment of the exemplary cell of FIG. 26.

An alternative to LSTM c ell 2700 (and another example of an implementation of LSTM cell 2600) is shown in FIG. 28. In FIG. 28, sigmoid function devices 2601, 2602, and 2603 and tan h device 2604 may share the same physical hardware (VMM arrays 2801 and activation function block 2802) in a time-multiplexed fashion. LSTM cell 2800 also comprises multiplier device 2803 to multiply two vectors together, addition device 2808 to add two vectors together, tan h device 2605 (which comprises activation circuit block 2802), register 2807 to store the value i(t) when i(t) is output from sigmoid function block 2802, register 2804 to store the value f(t)*c(t−1) when that value is output from multiplier device 2803 through multiplexor 2810, register 2805 to store the value i(t)*u(t) when that value is output from multiplier device 2803 through multiplexor 2810, and register 2806 to store the value o(t)*c~(t) when that value is output from multiplier device 2803 through multiplexor 2810, and multiplexor 2809.

Whereas LSTM cell 2700 contains multiple sets of VMM arrays 2701 and respective activation function blocks 2702, LSTM cell 2800 contains only one set of VMM arrays 2801 and activation function block 2802, which are used to represent multiple layers in the embodiment of LSTM cell 2800. LSTM cell 2800 will require less space than LSTM 2700, as LSTM cell 2800 will require ¼ as much space for VMMs and activation function blocks compared to LSTM cell 2700.

It can be further appreciated that ISM units will typically comprise multiple VMM arrays, each of which requires functionality provided by certain circuit blocks outside of the VMM arrays, such as a summer and activation circuit block and high voltage generation blocks. Providing separate circuit blocks for each VMM array would require a significant amount of space within the semiconductor device and would be somewhat inefficient. The embodiments described below therefore attempt to minimize the circuitry required outside of the VMM arrays themselves.

Gated Recurrent Units

An analog VMM implementation can be utilized for a GRU (gated recurrent unit) system. GRUs are a gating mechanism in recurrent neural networks. GRUs are similar to LSTMs, except that GRU cells generally contain fewer components than an LSTM cell.

Figure 29:
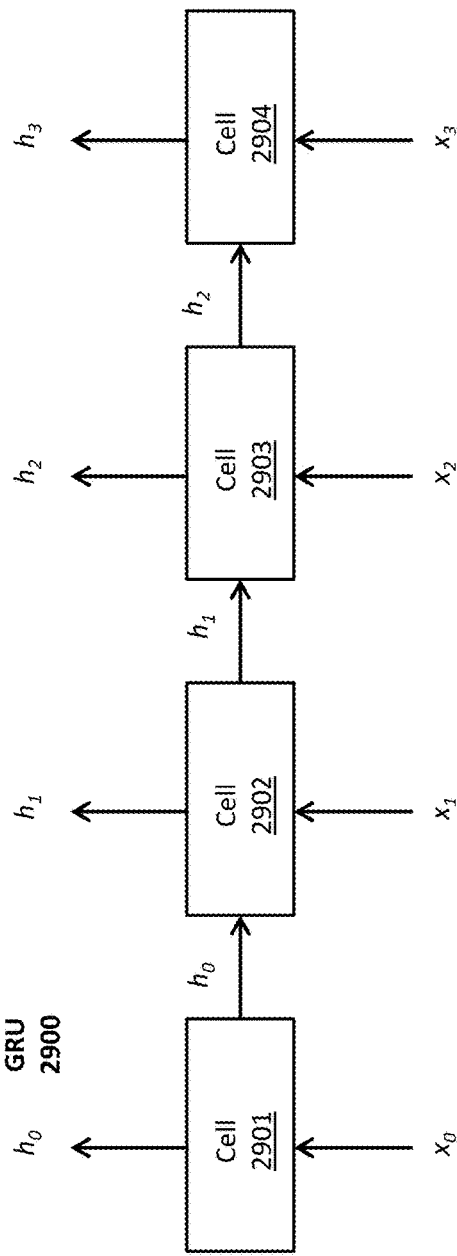
FIG. 29 depicts a prior art gated recurrent unit system.

FIG. 29 depicts an exemplary GRU 2900. GRU 2900 in this example comprises cells 2901, 2902, 2903, and 2904. Cell 2901 receives input vector $x_0$ and generates output vector $h_0$. Cell 2902 receives input vector $x_1$, the output vector $h_0$ from cell 2901 and generates output vector $h_1$. Cell 2903 receives input vector $x_2$ and the output vector (hidden state) iii from cell 2902 and generates output vector $h_2$. Cell 2904 receives input vector $x_3$ and the output vector (hidden state) $h_2$ from cell 2903 and generates output vector $h_3$, Additional cells can be used, and an GRU with four cells is merely an example.

Figure 30:
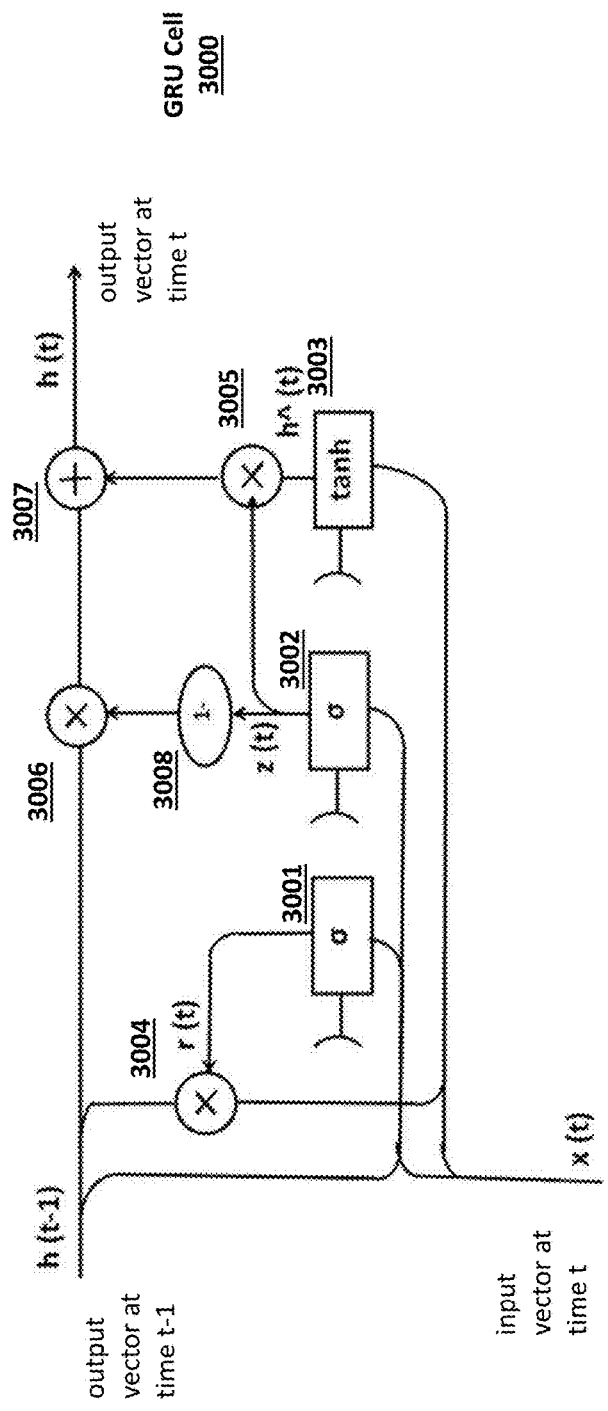
FIG. 30 depicts an exemplary cell for use in a gated recurrent unit system.

FIG. 30 depicts an exemplary implementation of a GRU cell 3000, which can be used for cells 2901, 2902, 2903, and 2904 of FIG. 29. GRU cell 3000 receives input vector x(t) and output vector h(t−1) from a preceding GRU cell and generates output vector h(t). GRU cell 3000 comprises sigmoid function devices 3001 and 3002, each of which applies a number between 0 and 1 to components from output vector h(t−1) and input vector x(t). GRU cell 3000 also comprises a tan h device 3003 to apply a hyperbolic tangent function to an input vector, a plurality of multiplier devices 3004, 3005, and 3006 to multiply two vectors together, an addition device 3007 to add two vectors together, and a complementary device 3008 to subtract an input from 1 to generate an output.

Figure 31:
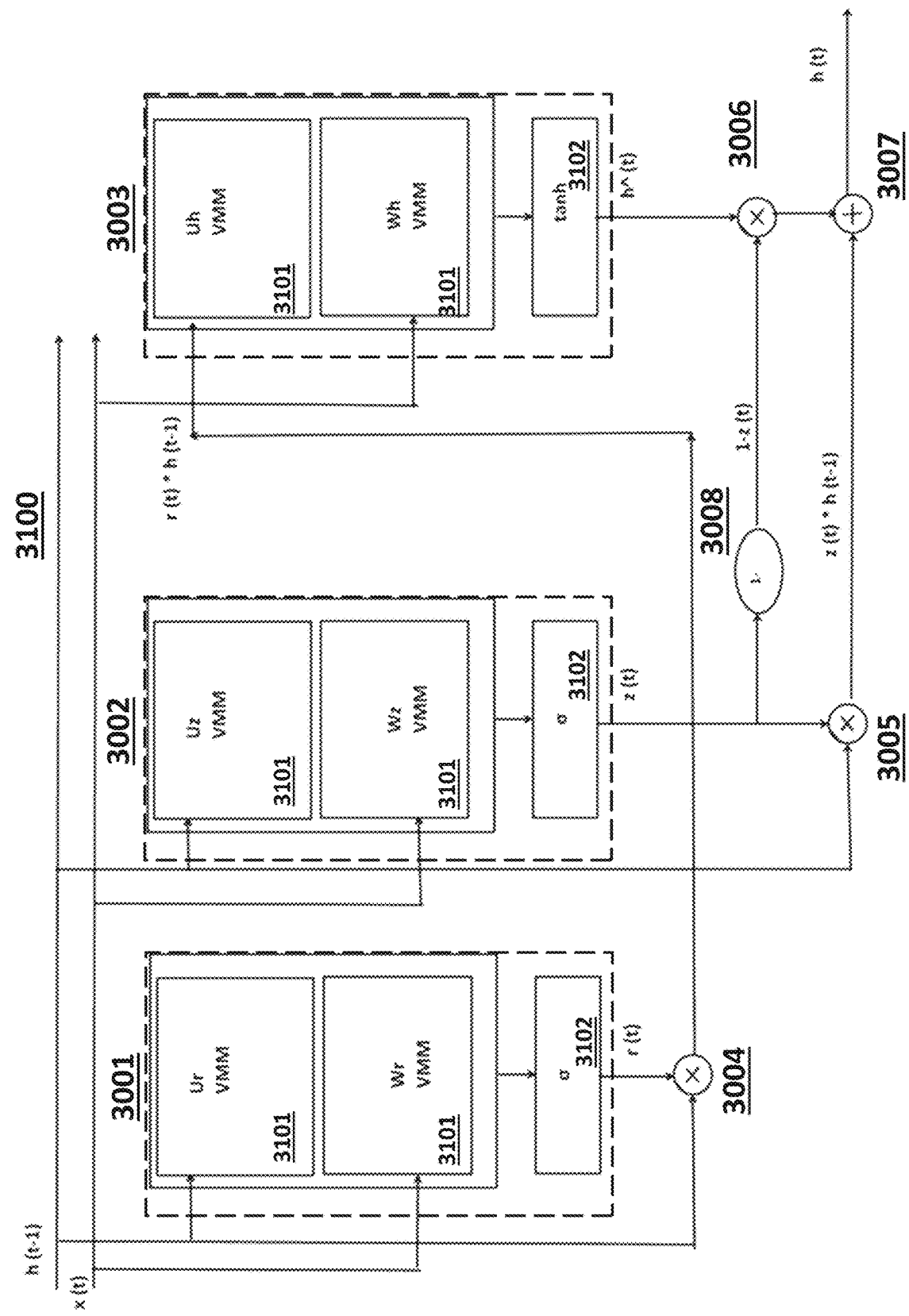
FIG. 31 depicts an embodiment of the exemplary cell of FIG. 30.

FIG. 31 depicts a GRU cell 3100, which is an example of an implementation of GRU cell 3000. For the reader's convenience, the same numbering from GRU cell 3000 is used in GRU cell 3100. As can be seen in FIG. 31, sigmoid function devices 3001 and 3002, and tan h device 3003 each comprise multiple VMM arrays 3101 and activation function blocks 3102. Thus, it can be seen that VMM arrays are of particular use in GRU cells used in certain neural network systems.

Figure 32:
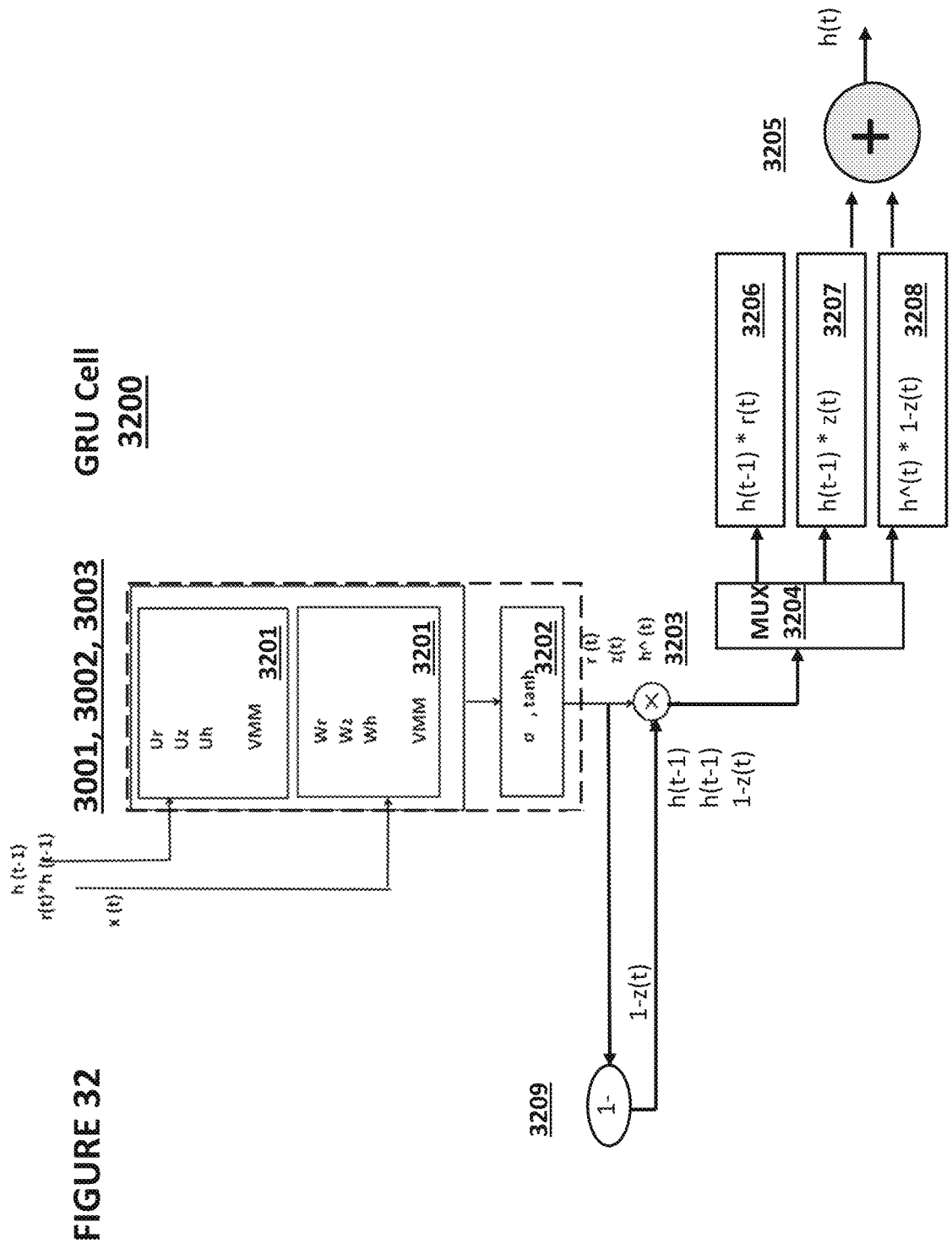
FIG. 32 depicts another embodiment of the exemplary cell of FIG. 30.

An alternative to GRU cell 3100 (and another example of an implementation of GRU cell 3000) is shown in FIG. 32. In FIG. 32, GRU cell 3200 utilizes VMM arrays 3201 and activation function block 3202, which when configured as a sigmoid function applies a number between 0 and 1 to control how much of each component in the input vector is allowed through to the output vector. In FIG. 32, sigmoid function devices 3001 and 3002 and tan h device 3003 share the same physical hardware (VMM arrays 3201 and activation function block 3202) in a time-multiplexed fashion.

GRU cell 3200 also comprises multiplier device 3203 to multiply two vectors together, addition device 3205 to add two vectors together, complementary device 3209 to subtract an input from 1 to generate an output, multiplexor 3204, register 3206 to hold the value h(t−1)*r(t) when that value is output from multiplier device 3203 through multiplexor 3204, register 3207 to hold the value h(t−1))*z(t) when that value is output from multiplier device 3203 through multiplexor 3204, and register 3208 to hold the value hˆ(t) (1−z(t)) when that value is output from multiplier device 3203 through multiplexor 3204.

Whereas GRU cell 3100 contains multiple sets of VMM arrays 3101 and activation function blocks 3102, GRU cell 3200 contains only one set of VMM arrays 3201 and activation function block 3202, which are used to represent multiple layers in the embodiment of GRU cell 3200. GRU cell 3200 will require less space than GRU cell 3100, as GRU cell 3200 will require ⅓ as much space for VMMs and activation function blocks compared to GRU cell 3100.

It can be further appreciated that GRU systems will typically comprise multiple VMM arrays, each of which requires functionality provided by certain circuit blocks outside of the VMM arrays, such as a summer and activation circuit block and high voltage generation blocks. Providing separate circuit blocks for each VMM array would require a significant amount of space within the semiconductor device and would be somewhat inefficient. The embodiments described below therefore attempt to minimize the circuitry required outside of the VMM arrays themselves.

The input to the VMM arrays can be an analog level, a binary level, timing pulses, or digital bits and the output can be an analog level, a binary level, timing pulses, or digital bits (in this case an output ADC is needed to convert output analog level current or voltage into digital bits).

For each memory cell in a VMM array, each weight w can be implemented by a single memory cell or by a differential cell or by two blend memory cells (average of 2 or more cells). In the differential cell case, two memory cells are needed to implement a weight w as a differential weight (w=w+−w−). In the two blend memory cells, two memory cells are needed to implement a weight w as an average of two cells.

Embodiments for Precise Programming of Cells in a VMM

Figure 33A:
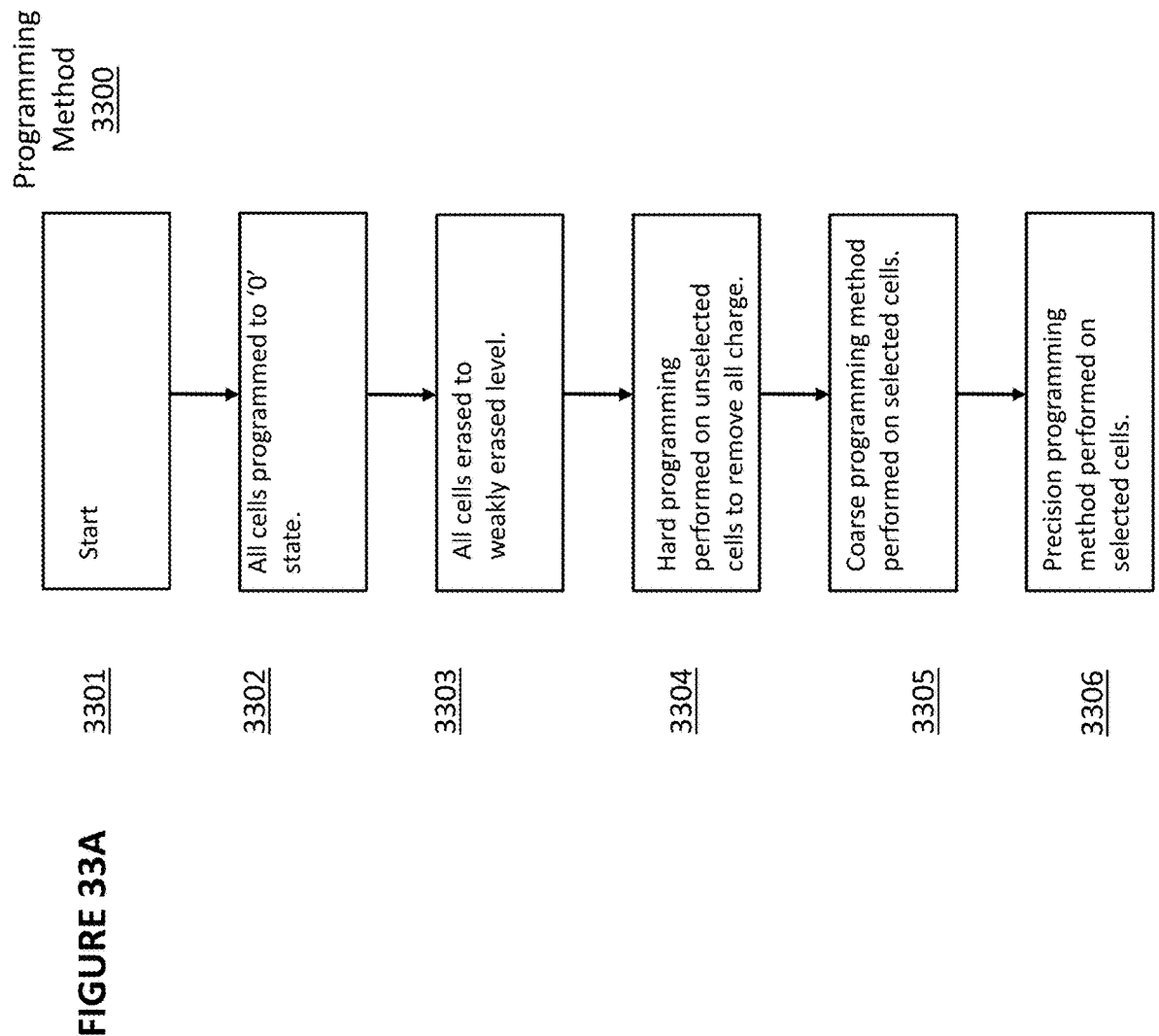
FIG. 33A depicts an embodiment of a method of programming a non-volatile memory cell.

FIG. 33A depicts programming method 3300. First, the method starts (step 3301), which typically occurs in response to a program command being received. Next, a mass program operation programs all cells to a '0' state (step 3302). Then a soft erase operation erases all cells to an intermediate weakly erased level such that each cell would draw current of, for example, approximately 3-5 µA during a read operation (step 3303). This is in contrast to a deeply erased level where each cell would draw current of approximately ~20-30 µA during a read operation. Then, a hard program is performed on all unselected cells to a very deep programmed state to add electrons to the floating gates of the cells (step 3304) to ensure that those cells are really "off," meaning that those cells will draw a negligible amount of current during a read operation.

A coarse programming method (to get the cell much closer to the target, for example 2×−100X the target) is then performed on the selected cells (step 3305), followed by a precision programming method on the selected cells (step 3306) to program the precise value desired for each selected cell.

Figure 33B:
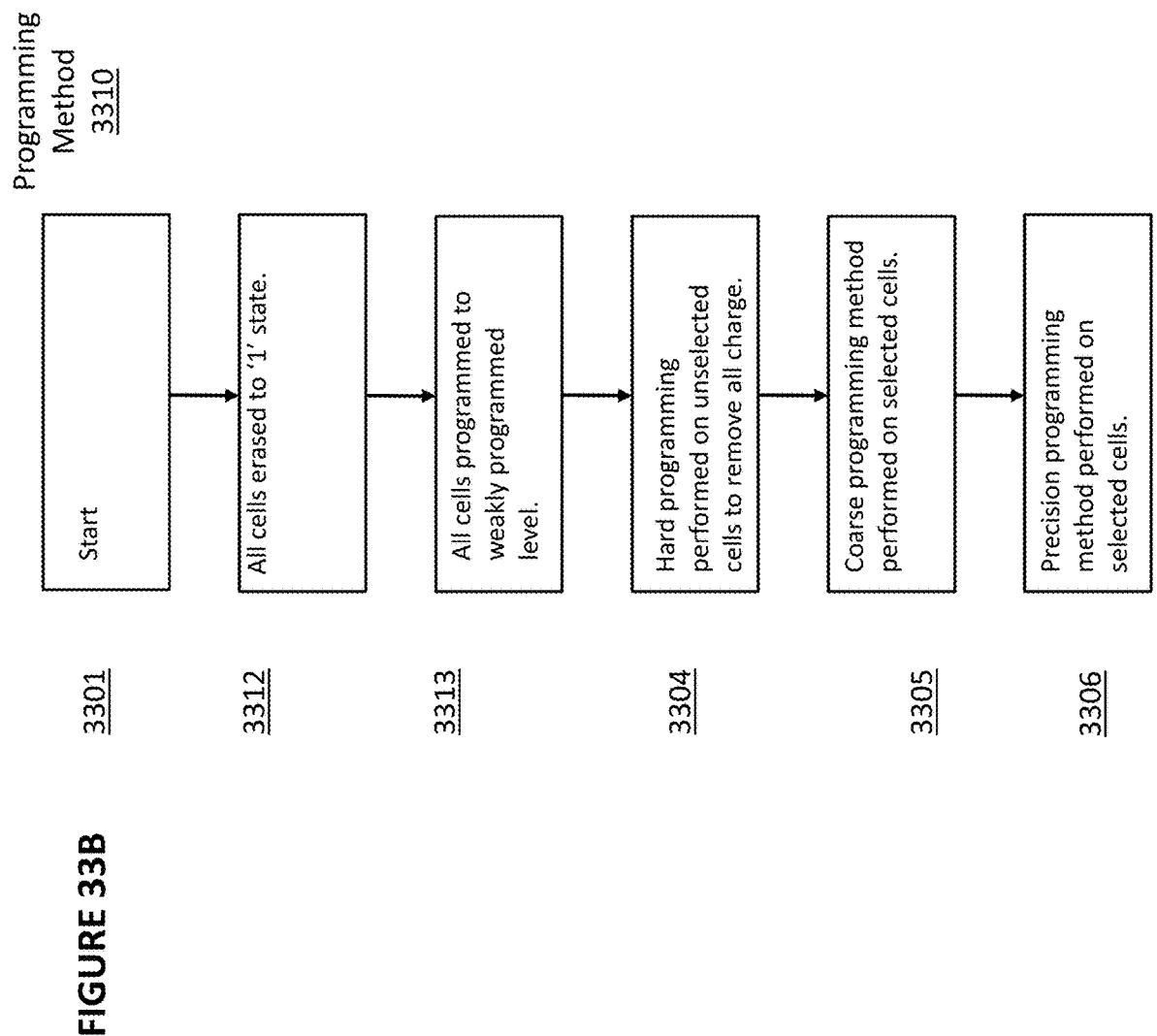
FIG. 33B depicts another embodiment of a method of programming a non-volatile memory cell.

FIG. 33B depicts another programming method 3310, which is similar to programming method 3300. However, instead of a program operation to program all cells to a '0' state as in step 3302 of FIG. 33A, after the method start (step 3301), an erase operation is used to erase all cells to a '1' state (step 3312). Then a soft program operation (step 3313) is used to program all cells to an intermediate state (level) such that each cell would draw current of approximately 3-5 uA during a read operation. Afterward, coarse and precision programming method would follow as in FIG. 33A. A variation of the embodiment of FIG. 33B would remove the soft programing method (step 3313) altogether.

Figure 34:
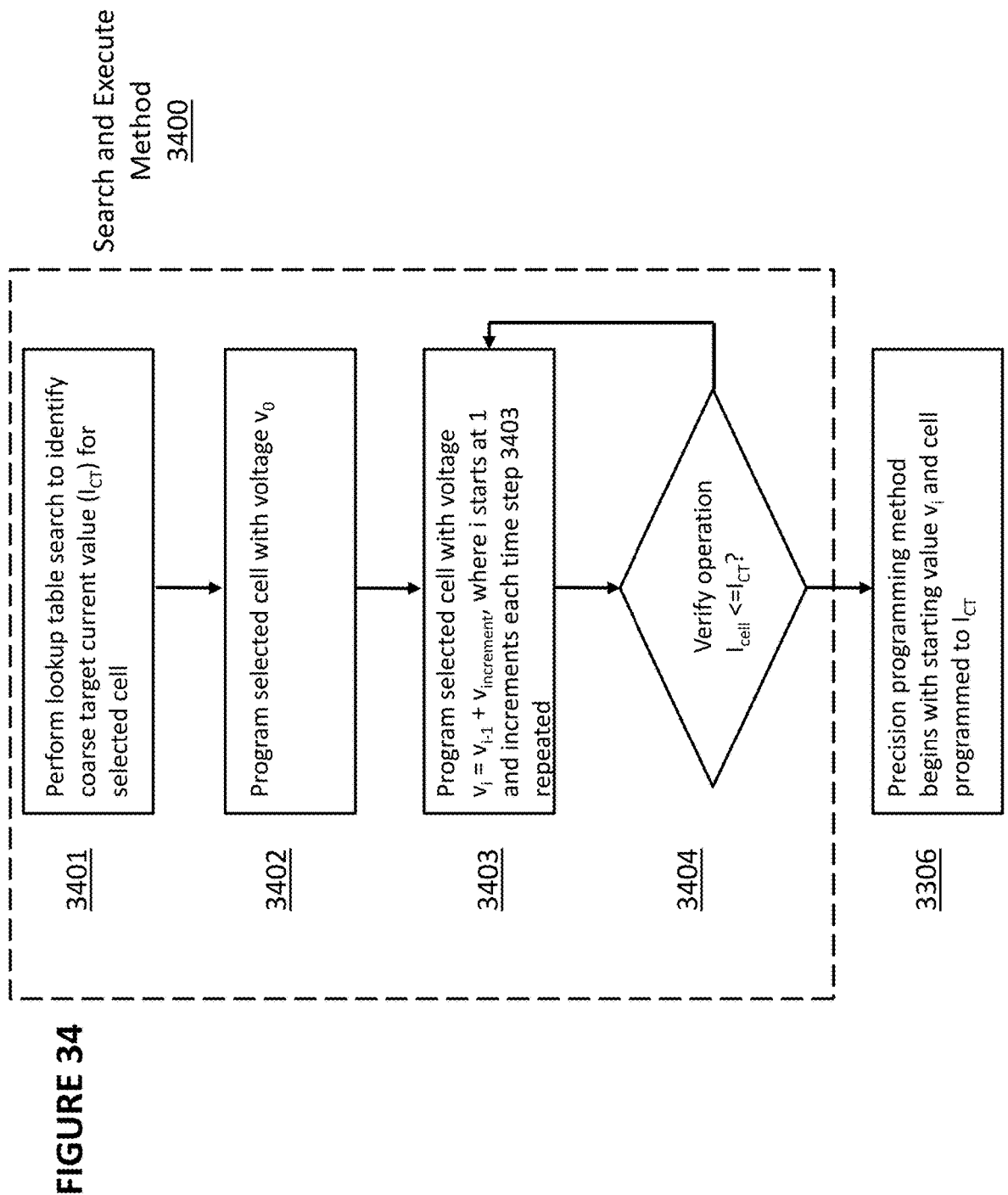
FIG. 34 depicts an embodiment of a coarse programming method.

FIG. 34 depicts a first embodiment of coarse programming method 3305, which is search and execute method 3400. First, a lookup table search is performed to determine a coarse target current value ($I_{CT}$) for the selected cell based on the value that is intended to be stored in that selected cell (step 3401). This table is, for example, created by silicon characterization or from calibration from wafer testing. It is assumed that the selected cell can be programmed to store one of N possible values (e.g., 128, 64, 32, etc.). Each of the N values would correspond to a different desired current value ($I_D$) that is drawn by the selected cell during a read operation. In one embodiment, a look-up table might contain M possible current values to use as the coarse target current value $I_{CT}$ for the selected cell during search and execute method 3400, where M is an integer less than N. For example, if N is 8, then M might be 4, meaning that there are 8 possible values that the selected cell can store, and one of 4 coarse target current values will be selected as the coarse target for search and execute method 3400. That is, search and execute method 3400 (which again is an embodiment of coarse programming method 3305) is intended to quickly program the selected cell to a value ($I_{CT}$) that is somewhat close to the desired value ($I_D$), and then the precision programming method 3306 is intended to more precisely program the selected cell to be extremely close to the desired value ($I_D$).

Examples of cell values, desired current values, and coarse target current values are depicted in Tables 9 and 10 for the simple example of N=8 and M=4:

TABLE No. 9

Example of N Desired Current Values for N = 8

| Value Stored in Selected Cell | Desired Current Value ($I_D$) |
|---|---|
| 000 | 100 pA |
| 001 | 200 pA |
| 010 | 300 pA |
| 011 | 400 pA |
| 100 | 500 pA |
| 101 | 600 pA |
| 110 | 700 pA |
| 111 | 800 pA |

TABLE No. 10

Example of M Target Current Values for M = 4

| Coarse Target Current Value ($I_{CT}$) | Associated Cell Values |
|---|---|
| 800 pA + $I_{CTOFFSET1}$ | 000, 001 |
| 1600 pA + $I_{CTOFFSET2}$ | 010, 011 |
| 2400 pA + $I_{CTOFFSET3}$ | 100, 101 |
| 3200 pA + $I_{CTOFFSET4}$ | 110, 111 |

The offset values $I_{CTOFFSETx}$ are used to prevent overshooting the desired current value during coarse tuning.

Once the coarse target current value $I_{CT}$ is selected, the selected cell is programmed by applying the voltage $v_0$ to the appropriate terminal of selected cell based on the cell architecture type of the selected cell (e.g., memory cells 210, 310, 410, or 510) (step 3402). If the selected cell is of type memory cell 310 in FIG. 3, then the voltage $v_0$ will be applied to control gate terminal 28, and $v_0$ might be 5-7V depending on coarse target current value $I_{CT}$. The value of $v_0$ optionally can be determined from a voltage look up table that stores $v_0$ vs. coarse target current value $I_{CT}$.

Next, the selected cell is programmed by applying the voltage $v_i=v_{i-1}+v_{increment}$, where i starts at 1 and increments each time this step is repeated, and where $v_{increment}$ is a small, fine voltage that will cause a degree of programming that is appropriate for the granularity of change desired (step 3403). Thus, the first time step 3403 is performed, i=1, and $v_1$ will be $v_0+v_{increment}$. Then a verify operation occurs (step 3404), wherein a read operation is performed on the selected cell and the current drawn through the selected cell ($I_{cell}$) is measured. If $I_{cell}$ is less than or equal to $I_{CT}$ (which here is a first threshold value), then search and execute method 3400 is complete and precision programming method 3306 can begin. If $I_{cell}$ is not less than or equal to $I_{CT}$, then step 3403 is repeated, and i is incremented.

Thus, at the point when coarse programming method 3305 ends and precision programming method 3306 begins, the voltage $v_1$ will be the last voltage used to program the selected cell, and the selected cell will be storing a value associated with the coarse target current value $I_{CT}$. The goal of precision programming method 3306 is to program the selected cell to the point where during a read operation it draws a current $I_D$ (plus or minus an acceptable amount of deviation, such as +/−50 pA or +/−30% or less), which is the desired current value that is associated with the value that is intended to be stored in the selected cell.

Figure 35:
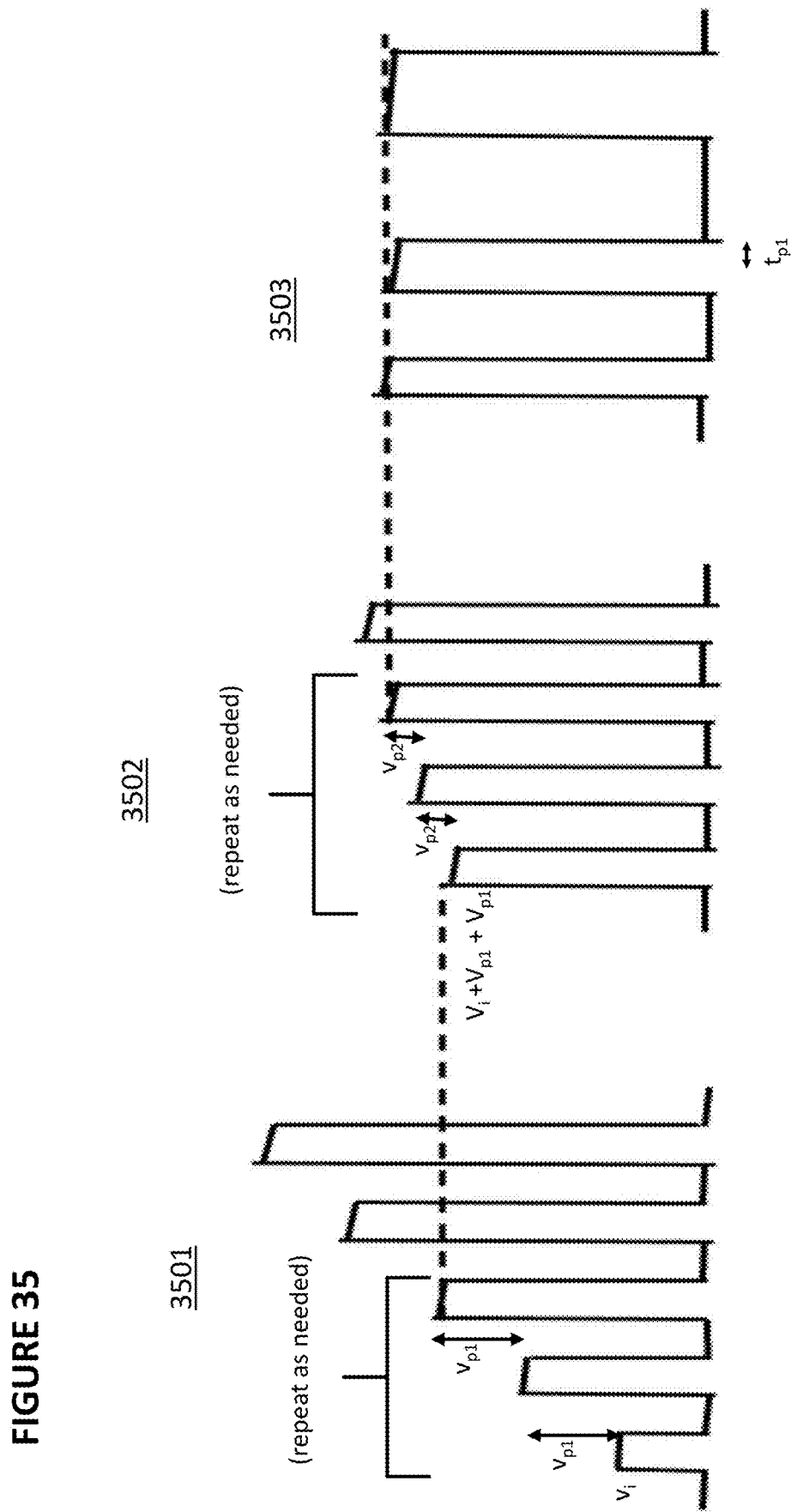
FIG. 35 depicts exemplary pulses used in the programming of a non-volatile memory cell.

FIG. 35 depicts examples of different voltage progressions that can be applied to the control gate of a selected memory cell during coarse and/or precision program method 3306.

Under a first approach, increasing voltages are applied in progression to the control gate to further program the selected memory cell. The starting point is $v_i$, which is the last voltage applied during coarse programming method 3305. An increment of $v_{p1}$ is added to $v_1$ and the voltage $v_1+v_{p1}$ is then used to program the selected cell (indicated by the second pulse from the left in progression 3501). $v_{p1}$ is an increment that is smaller than $v_{increment}$ (the voltage increment used during coarse programming method 3305). After each programming voltage is applied, a verify step (similar to step 3404) is performed, where a determination is made if $I_{cell}$ is less than or equal to $I_{PT1}$ (which is the first precision target current value and here is a second threshold value), where $I_{PT1}=I_D+I_{PT1OFFSET}$, where $I_{PT1OFFSET}$ is an offset valued added to prevent program overshoot. If it is not, then another increment $v_{p1}$ is added to the previously-applied programming voltage, and the process is repeated. At the point where Len is less than or equal to $I_{PT1}$, then this portion of the programming sequence stops. Optionally, if $I_{PT1}$ is equal to $I_D$, or almost equal to $I_D$ with sufficient precision, then the selected memory cell has been successfully programmed.

Figure 36:
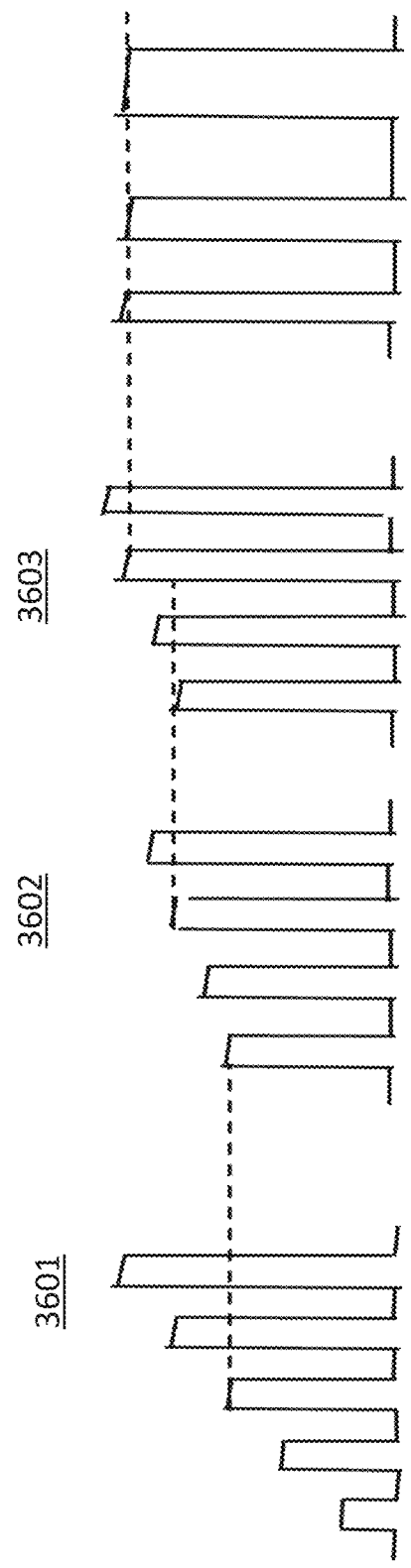
FIG. 36 depicts exemplary pulses used in the programming of a non-volatile memory cell.

If $I_{PT1}$ is not close enough to $I_D$, then further programming of a smaller granularity can occur. Here, progression 3502 is now used. The starting point for progression 3502 is the last voltage used for programming under progression 3501. A increment of $V_{p2}$ (which is smaller than $v_{p1}$) is added to that voltage, and the combined voltage is applied to program the selected memory cell. After each programming voltage is applied, a verify step (similar to step 3404) is performed, where a determination is made if Len is less than or equal to $I_{PT2}$ (which is the second precision target current value and here is a third threshold value), where $I_{PT2}=ID+I_{PT2OFFSET}$, $I_{PT2OFFSET}$ is an offset value added to prevent program overshoot. If it is not, then another increment $V_{p2}$ is added to the previously-applied programming voltage, and the process is repeated. At the point where $I_{cell}$ is less than or equal to $I_{PT2}$, then this portion of the programming sequence stops. Here, it is assumed that $I_{PT2}$ is equal to $I_D$ or close enough to $I_D$ that the programming can stop, since the target value has been achieved with sufficient precision. One of ordinary skill in the art can appreciate that additional progressions can be applied with smaller and smaller programming increments used. For example, in FIG. 36, three progressions (3601, 3602, and 3603) are applied instead of just two.

A second approach is shown in progression 3503. Here, instead of increasing the voltage applied during the programming of the selected memory cell, the same voltage is applied for durations of increasing period. Instead of adding an incremental voltage such as $v_{p1}$ in progression 3501 and $v_{p2}$ in progression 3503, an additional increment of time $t_{p1}$ is added to the programming pulse such that each applied pulse is longer than the previously-applied pulse by $t_{p1}$. After each programming pulse is applied, the same verify step is performed as described previously for progression 3501. Optionally, additional progressions can be applied where the additional increment of time added to the programming pulse is of a smaller duration than the previous progression used. Although only one temporal progression is shown, one of ordinary skill in the art will appreciate that any number of different temporal progressions can be applied.

Additional detail will now be provided for three additional embodiments of coarse programming method 3305.

Figure 37:
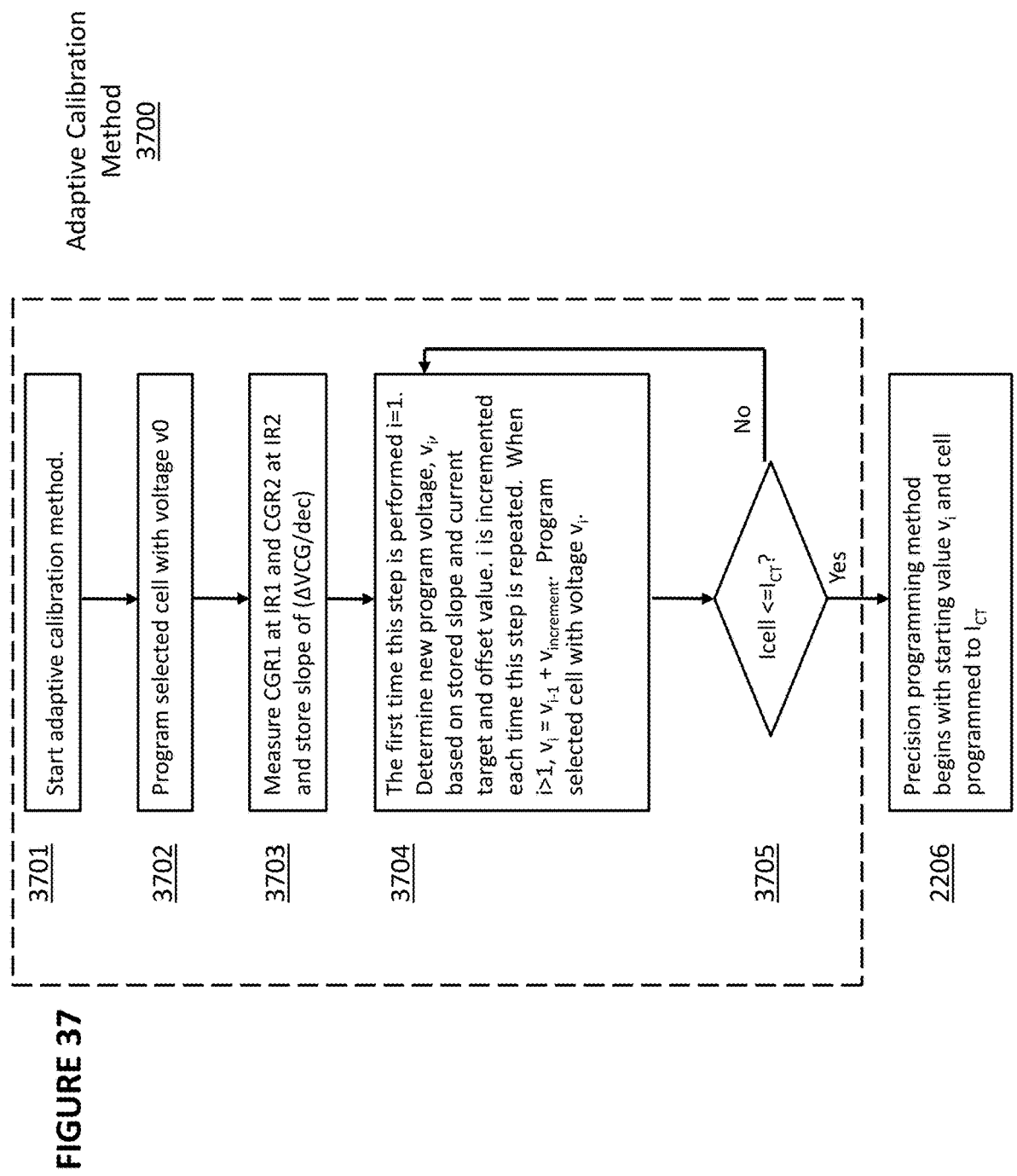
FIG. 37 depicts a calibration algorithm for the programming of a non-volatile memory cell that adjusts the programming parameters based on slope characteristics of the cell.

FIG. 37 depicts a first embodiment of coarse programming method 3305, which is adaptive calibration method 3700. The method starts (step 3701). The cell is programmed at a default start value $v_0$ (step 3702). Unlike in search and execute method 3400, here $v_0$ is not derived from a lookup table, and instead can be a relatively small initial value. The control gate voltage of the cell is measured at a first current value IR1 (e.g., 100 na) and a second current value IR2 (e.g., 10 na), and a sub-threshold slope is determined based on those measurements (e.g., 360 mV/dec) and stored (step 3703).

A new desired voltage, $v_i$, is determined. The first time this step is performed, i=1, and $v_1$ is determined based on the stored sub-threshold slope value and a current target and offset value using a sub-threshold equation, such as the following:

$Vi=Vi-1+V$increment,

Vincrement is proportional to slope of Vg $Vg=n*Vt*\log [Ids/wa*Io]$

Here, wa is w of a memory cell, Ids is the current target plusoffset value.

If the stored slope value is relatively steep, then a relatively small current offset value can be used. If the stored slope value is relatively flat, then a relatively high current offset value can be used. Thus, determining the slope information will allow for a current offset value to be selected that is customized for the particular cell in question. This ultimately will make the programming process shorter.

When this step is repeated, i is incremented, and $v_i = v_{i-1} + v_{increment}$. The cell is then programmed using vi. $v_{increment}$ can be determined from a lookup table storing values of $v_{increment}$ vs. target current value.

Next, a verify operation occurs, wherein a read operation is performed on the selected cell and the current drawn through the selected cell ($I_{cell}$) is measured (step 3705). If $I_{cell}$ is less than or equal to $I_{CT}$ (which here is a coarse target threshold value), where $I_{CT}$ is set=$I_D + I_{CTOFFSET}$, where $I_{CTOFFSET}$ is an offset value added to prevent program overshoot, then adaptive calibration method 3700 is complete and precision programming method 2206 can begin. If $I_{cell}$ is not less than or equal to $I_{CT}$, then steps 3704-3705 are repeated, and i is incremented.

Figure 38:
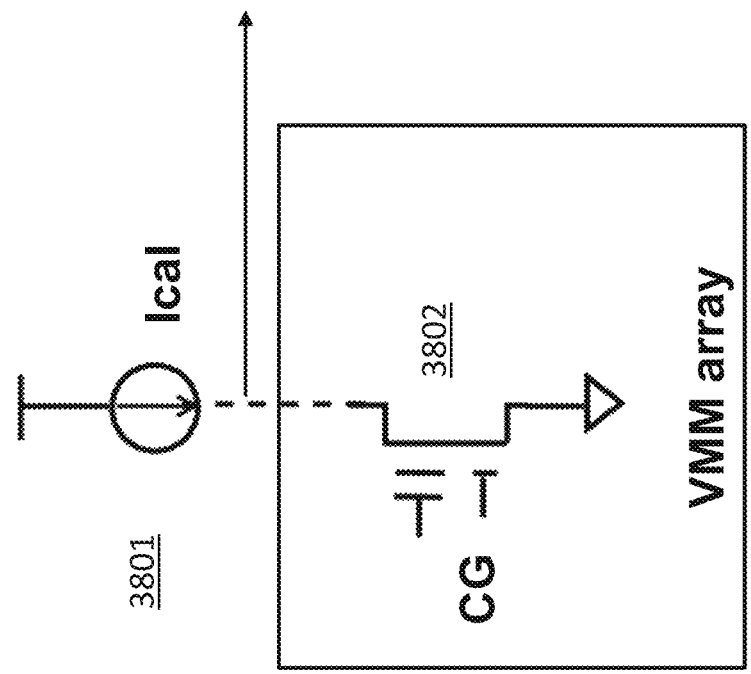
FIG. 38 depicts a circuit used in the calibration algorithm of FIG. 37.

FIG. 38 depicts aspects of adaptive calibration method 3700. During step 3803, current source 3801 is used to apply the exemplary current values IR1 and IR2 to the selected cell (here, memory cell 3802), and the voltage (CGR1 for IR1 and CGR2 for IR2) at the control gate of memory cell 3802 is then measured. The slope will be (CGR2–CGR1)/dec.

Figure 39:
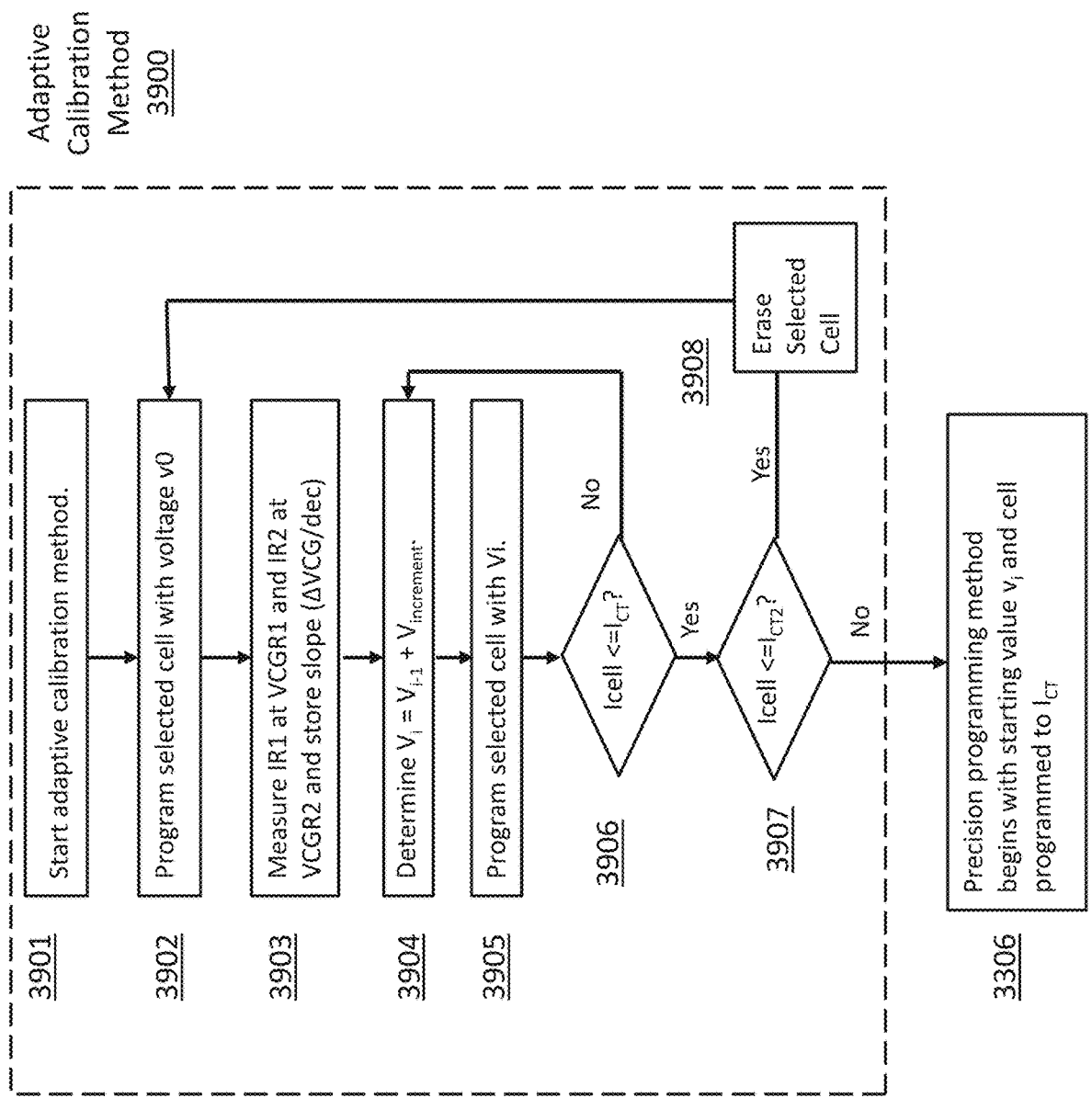
FIG. 39 depicts a calibration algorithm for the programming of a non-volatile memory cell.

FIG. 39 depicts a second embodiment of programming method 3305, which is adaptive calibration method 3900. The method starts (step 3901). The cell is programmed at a default start value $V_0$ (step 3902). $V_0$ is derived from a lookup table such as created from silicon characterization, the table value is offset such as not to overshoot the programmed target In next step 3903 a I-V slope parameter is created which is used in predicting the next programming voltage, a first control gate read voltage, $V_{CGR1}$, is applied to the selected cell, and the resulting cell current, $IR_1$, is measured. Then a second control gate read voltage, $V_{CGR2}$, is applied to the selected cell, and the resulting cell current, $IR_2$, is measured. A slope is determined based on those measurements and stored, for example as according to the equation in sub threshold region (cell operating in sub threshold):

$$\text{slope} = (V_{CGR1} - V_{CGR2})/(\text{LOG}(IR_1) - \text{LOG}(IR_2))$$

(step 3903). Examples of values for $V_{CGR1}$ and $V_{CGR2}$ are 1.5V and 1.3V, respectively.

Determining the slope information allows for a $V_{increment}$ value to be selected that is customized for the particular cell in question. This ultimately will make the programming process shorter.

When step 3904 is repeated, i is incremented, a new desired programming voltage, $V_i$, is determined based on the stored slope value and a current target and offset value using an equation such as the following:

$$V_i = V_{i-1} + V_{increment},$$

where for i-1, $V_{increment} = \text{alpha} * \text{slope} * (\text{LOG}(IR_1) - \text{LOG}(I_{CT}))$, where $I_{CT}$ is the target current and alpha is a pre-determined constant <1 (programming offset value) to prevent overshoot, e.g., 0.9. For example Vi is VSLP or VCGP, source line or control gate programming voltage.

The cell is then programmed using Vi. (step 3904)

Next, a verify operation occurs, wherein a read operation is performed on the selected cell and the current drawn through the selected cell ($I_{cell}$) is measured (step 3906). If $I_{cell}$ is less than or equal to $I_{CT}$ (which here is a coarse target threshold value), where $I_{CT}$ is set=$I_D + I_{CTOFFSET}$, where $I_{CTOFFSET}$ is an offset value added to prevent program overshoot, then the process proceeds to the step 3907. If not, then the process returns to step 390 and i is incremented.

In step 3907, $I_{cell}$ is compared against a threshold value, $_{CT2}$, that is smaller than $I_{CT}$. The purpose of this is to see if an overshoot has occurred. That is, although the goal is for $I_{cell}$ to be below $I_{CT}$, if it falls too far below $I_{CT}$, then an overshoot has occurred and the stored value may actually correspond to the wrong value. If $I_{cell}$ is not less than or equal to $I_{CT2}$, then no overshoot has occurred, and adaptive calibration method 3900 has completed, as which point the process progresses to precision programming method 3306. If $I_{cell}$ is less than or equal to $I_{CT2}$, then an overshoot has occurred. The selected cell is then erased (step 3908), and the programming process starts over at step 3902. Optionally, if step 3908 is performed more than a predetermined number of times, the selected cell can be deemed a bad cell that should not be used.

The precision program method 3306 is such as consisting of multiple verify and program cycles, in which the program voltage is incremented by a constant fine voltage with a fixed pulse width or in which the program voltage is fixed and the program pulse width is varied or constant for next pulses.

Optionally, the step of determining if the current through the selected non-volatile memory cell during a read or verify operation is less than or equal to the first threshold current value can be performed by applying a fixed bias to a terminal of the non-volatile memory cell, measuring and digitizing the current drawn by the selected non-volatile memory cell to generate digital output bits, and comparing the digital output bits to digital bits representing the first threshold current.

Optionally, the step of determining if the current through the selected non-volatile memory cell during a read or verify operation is less than or equal to the first threshold current value can be performed by applying a fixed bias to a terminal of the non-volatile memory cell, measuring and digitizing the current drawn by the selected non-volatile memory cell to generate digital output bits, and comparing the digital output bits to digital bits representing the first threshold current.

Optionally, the step of determining if the current through the selected non-volatile memory cell during a read or verify operation is less than or equal to the first threshold current value can be performed by applying an input to a terminal of the non-volatile memory cell, modulating the current drawn by the selected non-volatile memory cell with an output pulse to generate a modulated output, digitizing the modulated output to generate digital output bits, and comparing the digital output bits to digital bits representing the first threshold current.

Figure 40:
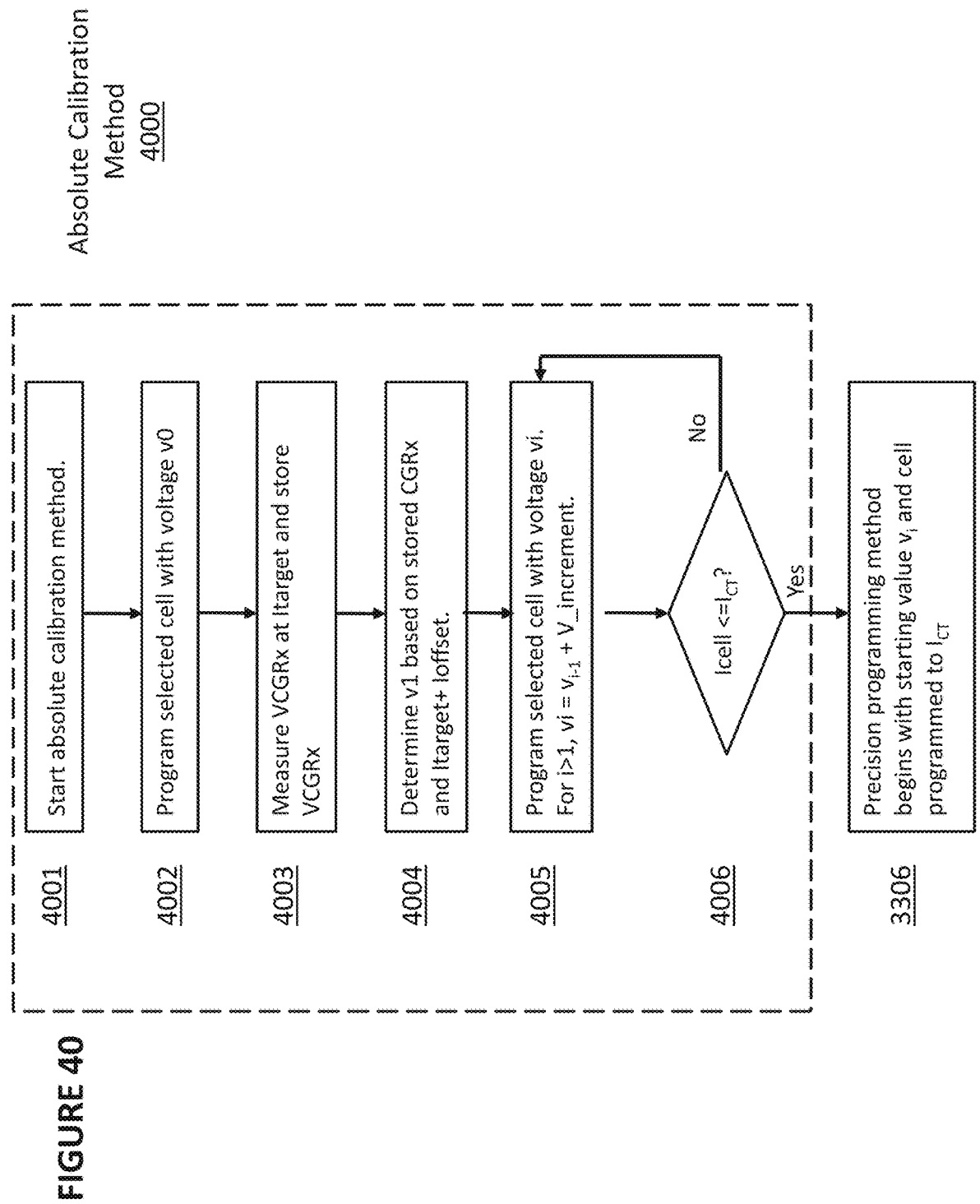
FIG. 40 depicts a calibration algorithm for the programming of a non-volatile memory cell.

FIG. 40 depicts a third embodiment of programming method 3305, which is absolute calibration method 4000. The method starts (step 4001). The cell is programmed at a default starting value $V_0$ (step 4002). The control gate voltage of the cell (VCGRx) is measured at a current value Itarget and stored (step 4003). A new desired voltage, $v_1$, is determined based on the stored control gate voltage and a current target and offset value, Ioffset+Itarget (step 4004). For example, the new desired voltage, $v_1$, can be calculated as follows: $v_1 = v_0 + (\text{VCGBIAS} - \text{stored VCGR})$, where VCGBIAS=~1.5V, which is the default read control gate voltage at a maximum target current and stored VCGR is the measured read control gate voltage of step 4003.

The cell is then programmed using $v_i$. When i=1, the voltage $v_1$ from step 4004 is used. When i>=2, the voltage $v_i = v_{i-1} + V_{increment}$ is used. $v_{increment}$ can be determined from a lookup table storing values of $v_{increment}$ vs. target current value. Next, a verify operation occurs, wherein a read operation is performed on the selected cell and the current drawn through the selected cell ($I_{cell}$) is measured (step 4006). If $I_{cell}$ is less than or equal to $I_{CT}$ (which here is a threshold value), then absolute calibration method 4000 is complete and precision programming method 3306 can begin. If $I_{cell}$ is not less than or equal to $I_{CT}$, then steps 4005-4006 are repeated, and i is incremented.

Figure 41:
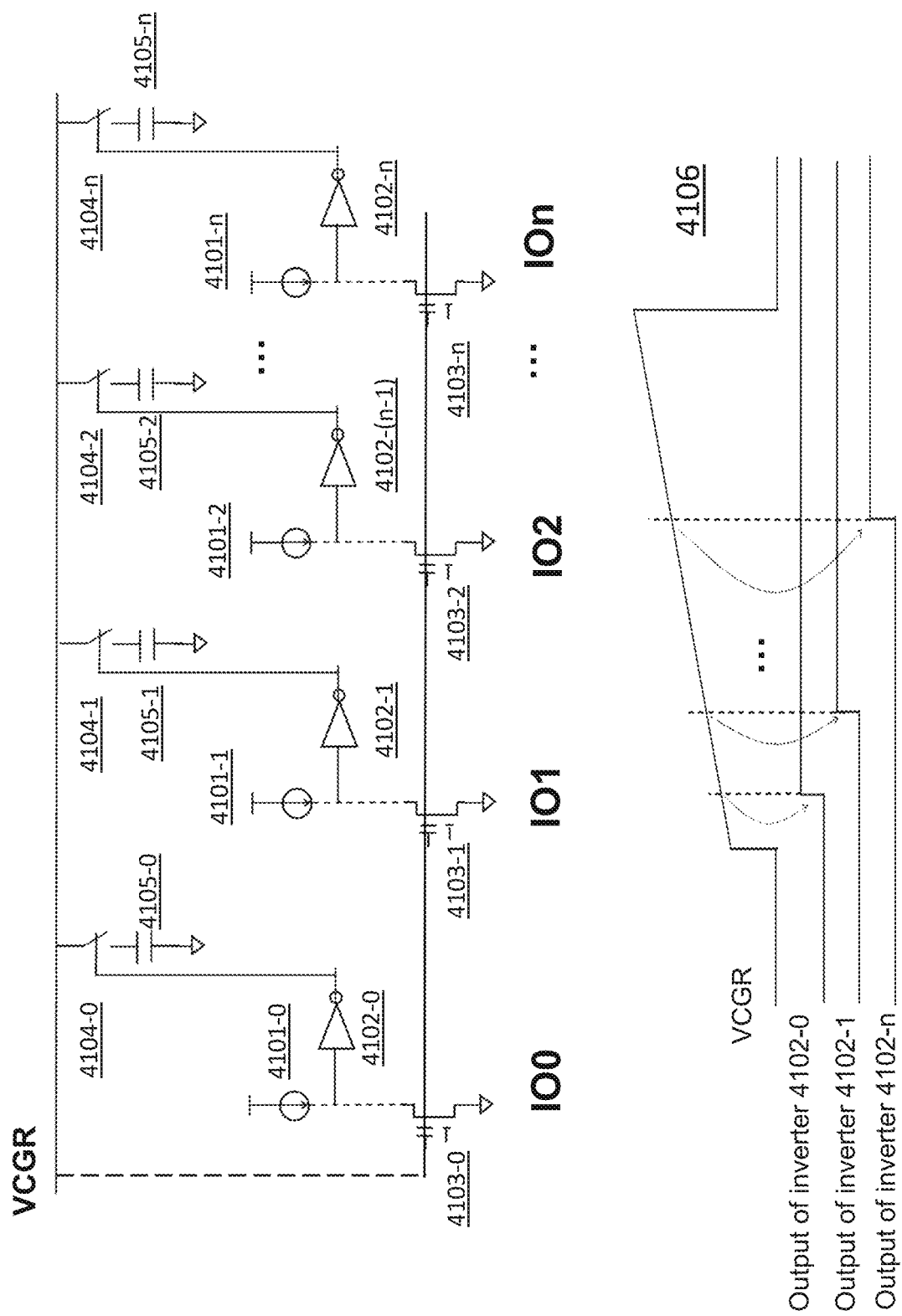
FIG. 41 depicts a circuit used in the calibration algorithm of FIG. 41.

FIG. 41 depicts circuit 4100 for implementing step 4003 of absolute calibration method 4000. A voltage source (not shown) generates VCGR, which begins at an initial voltage and ramps upward. Here, n+1 different current sources 4101 (4101-0, 4101-1, 4101-2, ..., 4101-$n$) generate different currents IO0, IO1, IO2, ... IOn of increasing magnitude. Each current source 4101 is connected to inverter 4102 (4102-0, 4102-1, 4102-2, ..., 4102-$n$) and memory cell 4103 (4103-0, 4103-1, 4103-2, ... 4103-$n$). As VCGR ramps upward, each memory cell 4103 draws increasing amounts of current, and the input voltage to each inverter 4102 decreases. Because IO0<IO1<IO2< ... <IOn, the output of inverter 4102-0 will switch from low to high first as VCGR increases. The output of inverter 4102-1 will switch from low to high next, then the output of inverter 4102-2, and so on, until the output of inverter 4102-$n$ switches from low to high. Each inverter 4102 controls switch 4104 (4104-0, 4104-1, 4104-2, ..., 4104-$n$), such that when the output of inverter 4102 is high, switch 4104 is closed, which will cause VCGR to be sampled by capacitor 4105 (4105-0, 4105-1, 4105-2, ..., 4105-$n$). Thus, switch 4104 and capacitor 4105 form a sample-and-hold circuit. The values of IO0, IO1, IO2, ..., IOn are used as possible values of Itarget and the respective sampled voltage is used as the associated value VCGRx in absolute calibration method 4000 of FIG. 40. Graph 4106 shows VCGR ramping upward over time, and the outputs of inverters 4102-0, 4102-1, and 4102-$n$ switching from low to high at various times.

Figure 42:
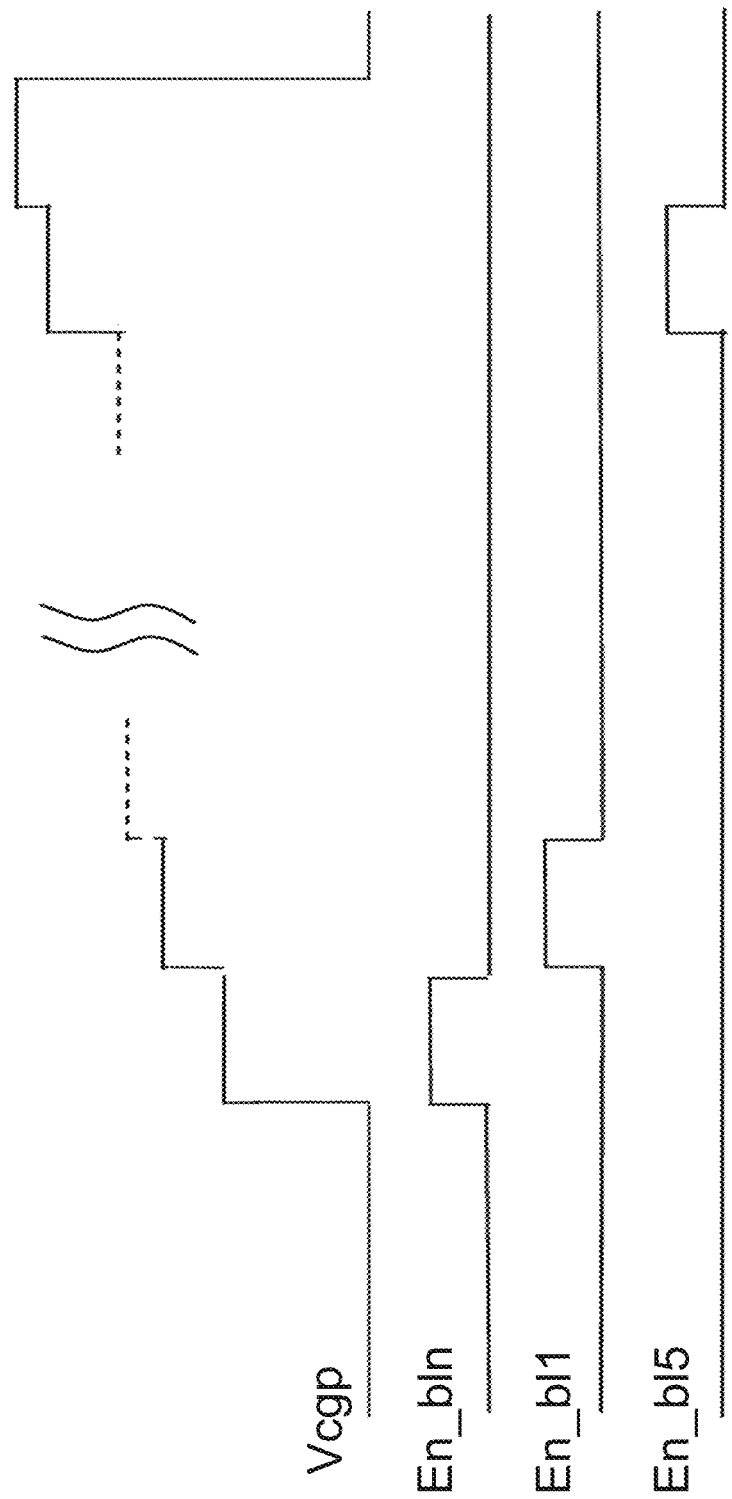
FIG. 42 depicts an exemplary progression of voltages applied to the control gate of a non-volatile memory cell during a programming operation.

FIG. 42 depicts exemplary progression 4200 for programming a selected cell during adaptive calibration method 3700 or absolute calibration method 4000. In one embodiment, the voltage Vcgp is applied to the control gates of a selected row of memory cells. The number of selected memory cells in the selected row is for example=32 cells. Hence, up to 32 memory cells in a selected row can be programmed in parallel. Each memory cell is enabled to couple to a programming current Iprog by a bitline enable signal. If the bitline enable signal is inactive (meaning a positive voltage being applied to selected bitline), the memory cell is inhibited (not being programmed). As shown in FIG. 42, bitline enabling signal En_blx (where x varies between 1 and n, where n is the number of bit lines) is enabled at different time with a Vcgp voltage level desired for that bitline (hence for selected memory on said bitline). In another embodiment, the voltage applied to the control gate of the selected cell can be controlled using enable signals on the bitline. Each bitline enable signal causes a desired voltage (such as vi described in FIG. 40) corresponding to that bitline to be applied as Vcgp. The bitline enable signal may also control the programming current flowing into the bitline. In this example, each subsequent control gate voltage Vcgp is higher than the previous voltage. Alternatively, each subsequent control gate voltage can be lower or higher than the previous voltage. Each subsequent increment in Vcgp can either be equal or not equal to the previous increment.

Figure 43:
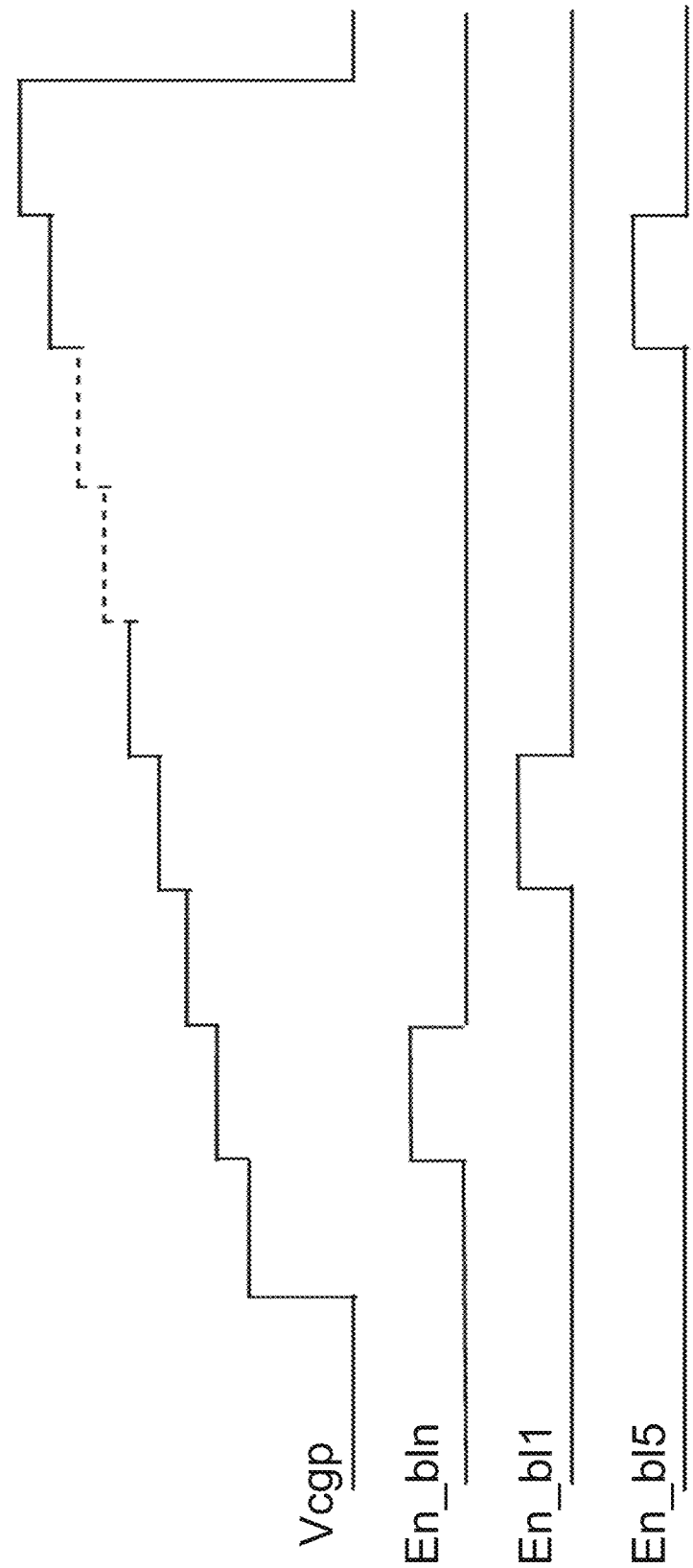
FIG. 43 depicts an exemplary progression of voltages applied to the control gate of a non-volatile memory cell during a programming operation.

FIG. 43 depicts exemplary progression 4300 for programming a selected cell during adaptive calibration method 3700 or absolute calibration method 4000. In one embodiment, bitline enable signal enables the selected bitline (meaning selected memory cell in said bitline) to be programmed with corresponding Vcgp voltage level. In another embodiment, the voltage applied to the increment ramping control gate of the selected cell can be controlled using bitline enable signals. Each bitline enable signal causes a desired voltage (such as vi described in FIG. 40) corresponding to that bitline to be applied to the control gate voltage. In this example, each subsequent increment is equal to the previous increment.

Figure 44:
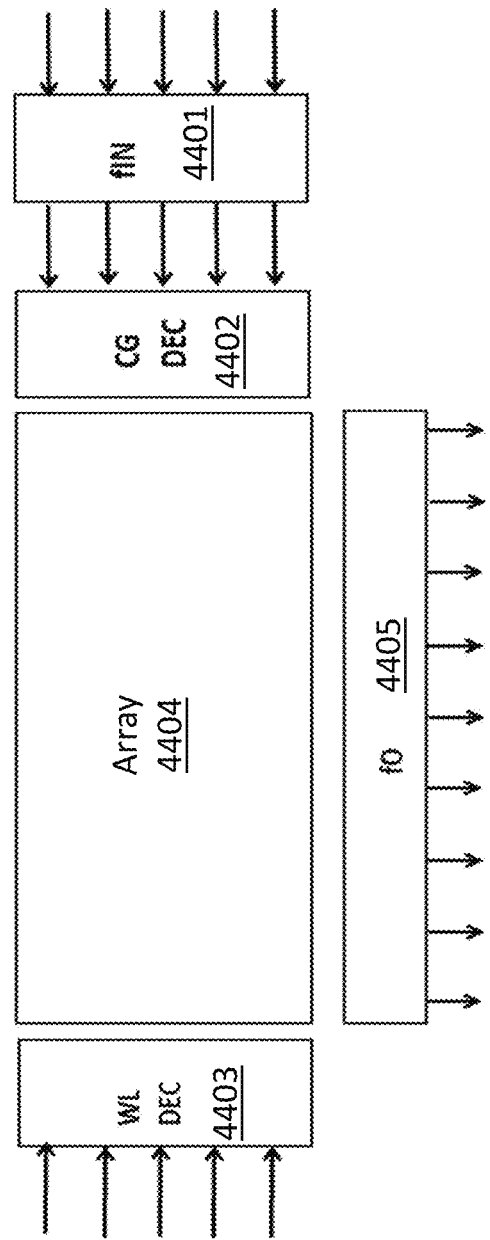
FIG. 44 depicts a system for applying programming voltages during the programming of a non-volatile memory cell within a vector-by-multiplication matrix system.

FIG. 44 depicts a system for implementing the input and output method for reading or verifying with a VMM array. The input function circuit 4401 receives digital bit values and converts those digital values into an analog signal that is then used to apply a voltage to the control gate of selected cells in array 4404, which is determined through control gate decoder 4402. Meanwhile, word line decoder 4403 also is used to select the row in which the selected cell is located. Output neuron circuit block 4405 performs an output action of each column (neuron) of cells in array 4404. The output circuit block 4405 can be implemented using an integrating analog-to-digital converter (ADC), a successive approximation (SAR) ADC, a Sigma-Delta ADC, or any other ADC schemes.

In one embodiment, the digital values provided to input function circuit 4401 comprise four bits (DIN3, DIN2, DIN1, and DIN0) as an example, and the various bit values correspond to different numbers of input pulses applied to the control gate. A greater number of pulses will cause a greater output value (current) of the cell. An example of bit values and pulse values is shown in Table No. 11:

TABLE No. 11

| Digital Bit Inputs v. Pulses Generated | | | | |
|---|---|---|---|---|
| DIN3 | DIN2 | DIN1 | DIN0 | Input Pulses Generated |
| 0 | 0 | 0 | 0 | 0 |
| 0 | 0 | 0 | 1 | 1 |
| 0 | 0 | 1 | 0 | 2 |
| 0 | 0 | 1 | 1 | 3 |
| 0 | 1 | 0 | 0 | 4 |
| 0 | 1 | 0 | 1 | 5 |
| 0 | 1 | 1 | 0 | 6 |
| 0 | 1 | 1 | 1 | 7 |
| 1 | 0 | 0 | 0 | 8 |
| 1 | 0 | 0 | 1 | 9 |
| 1 | 0 | 1 | 0 | 10 |
| 1 | 0 | 1 | 1 | 11 |
| 1 | 1 | 0 | 0 | 12 |
| 1 | 1 | 0 | 1 | 13 |
| 1 | 1 | 1 | 0 | 14 |
| 1 | 1 | 1 | 1 | 15 |

In the above example, there are a maximum of 15 pulses for 4 bit digital values for reading out the cell value. Each pulse is equal to one unit cell value (current). For example, if Icell unit=1 nA, then for DIN[3-0]=0001, Icell=1*1 nA=1 nA; and for DIN[3-0]=1111, Icell=15*1 nA=15 nA.

In another embodiment, the digital bit input uses digital bit position summation to read out the cell or neuron (e.g., value on bitline output) value as shown in Table 12. Here, only 4 pulses or 4 fixed same bias input (for example input on wordline or control gate) are needed to evaluate the 4 bit digital value. For example, a first pulse or a first fixed bias is used to evaluate DIN0, a second pulse or a second fixed bias with same value as the first one is used to evaluate DIN1, a third pulse or a third fixed bias with same value as the first one is used to evaluate DIN2, and a fourth pulse or a fourth fixed bias with same value as the first one is used to evaluate DIN3. Then, the results from the four pulses are summed according to bit position with each output result multiplied (scaled) by a multiplier factor that is $2^n$, n is the digital bit position as shown in Table 13. The digital bit summation equation realized is the following: Output=2^0*DIN0+2^1*DIN1+2^2*DIN2+2^3*DIN3) *Icell unit.

For example, if Icell unit=1 nA, then for DIN[3-0]=0001, Icell total=0+0+0+1*1 nA=1 nA; and for DIN[3-0]=1111, Icell total=8*1 nA+4*1 nA+2*1 nA+1*1 nA=26 nA.

TABLE No. 12

Digital Bit Input Summation

| 2^3*DIN3 | 2^2*DIN2 | 2^1*DIN1 | 2^0*DIN0 | Total values |
|---|---|---|---|---|
| 0 | 0 | 0 | 0 | 0 |
| 0 | 0 | 0 | 1 | 1 |
| 0 | 0 | 2 | 0 | 2 |
| 0 | 0 | 2 | 1 | 3 |
| 0 | 4 | 0 | 0 | 4 |
| 0 | 4 | 0 | 1 | 5 |
| 0 | 4 | 2 | 0 | 6 |
| 0 | 4 | 2 | 1 | 7 |
| 8 | 0 | 0 | 0 | 8 |
| 8 | 0 | 0 | 1 | 9 |
| 8 | 0 | 2 | 0 | 10 |
| 8 | 0 | 2 | 1 | 11 |
| 8 | 4 | 0 | 0 | 12 |
| 8 | 4 | 0 | 1 | 13 |
| 8 | 4 | 2 | 0 | 14 |
| 8 | 4 | 2 | 1 | 15 |

TABLE 13

Digital input bit Dn summation with 2^n output multiplication factor

| DIN3 | DIN2 | DIN1 | DIN0 | Output X factor |
|---|---|---|---|---|
|  |  |  | Y | X1 |
|  |  | Y |  | X2 |
|  | Y |  |  | X4 |
| Y |  |  |  | X8 |

Another embodiment with a hybrid input with multiple digital input pulse ranges and input digital range summations is shown in Table 14 for an exemplary 4-bit digital input In this embodiment, DINn-0 can be divided into m different groups, where each group is evaluated and the output is scaled by a multiplication factor by the group binary position. As example, for 4-bit DIN3-0, the groups can be DIN3-2 and DIN1-0, where the output for DIN1-0 is scaled by one (X1) and the output for DIN3-2 is scaled by 4 (X4).

TABLE 14

Hybrid input-output summation with multiple input ranges

| DIN3 | DIN2 | DIN1 | DIN0 | input pulses (or equivalent pulsewidth) | Output X factor |
|---|---|---|---|---|---|
|  |  | 0 | 0 | 0 | X1 |
|  |  | 0 | 1 | 1 | X1 |
|  |  | 1 | 0 | 2 | X1 |
|  |  | 1 | 1 | 3 | X1 |
| 0 | 0 |  |  | 0 | X4 |
| 0 | 1 |  |  | 1 | X4 |
| 1 | 0 |  |  | 2 | X4 |
| 1 | 1 |  |  | 3 | X4 |

Another embodiment combines a hybrid input range with a hybrid supercell. A hybrid super cells includes multiple physical x-bit cells to implement a logical n-bit cell with the x-cell output scaled by the 2^n binary position. For example, to implement an 8-bit logical cell, two 4-bit cells (cell1, cell0) are used. The output for cell0 is scaled by one (X1) and the output for cell1 is scaled by four (X, 2^2). Other combinations of physical x-cells to implement n-bit logical cell are possible such as two 2-bit physical cell and one 4-bit physical cell to implement 8-bit logical cell.

Figure 45:
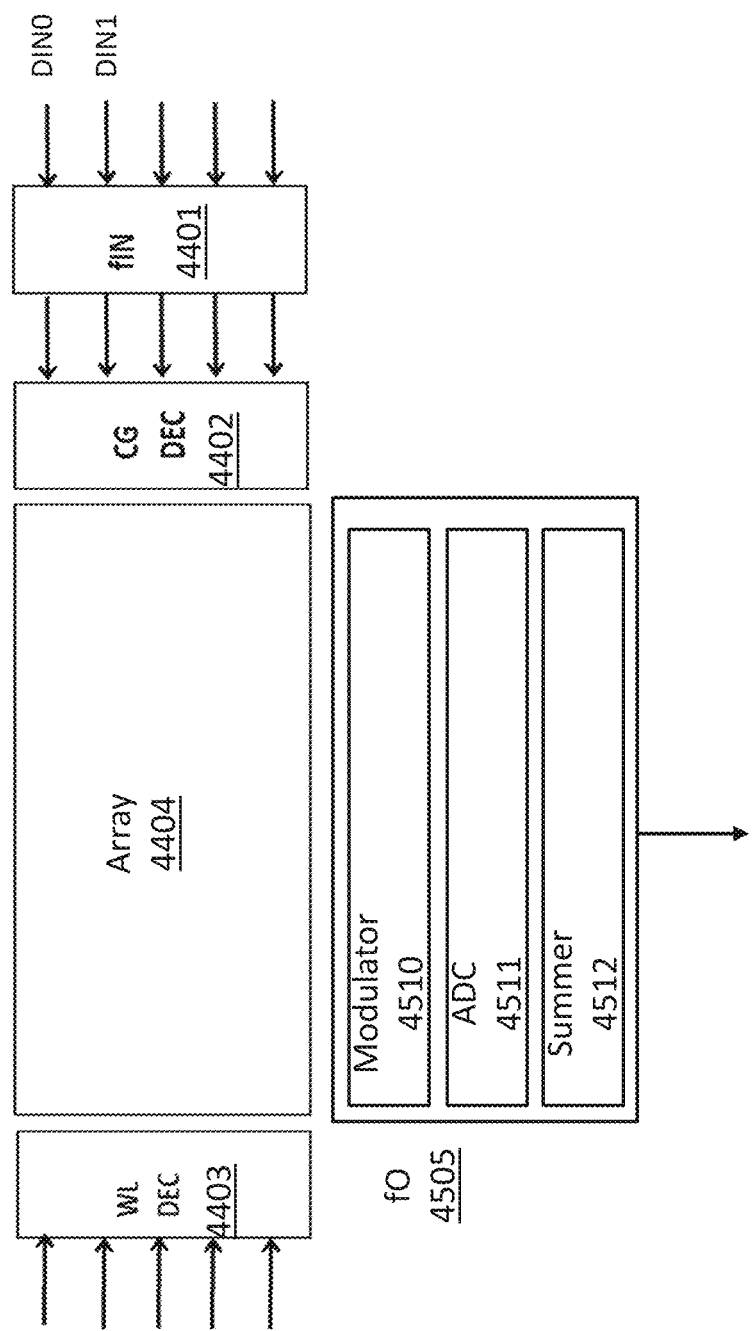
FIG. 45 depicts a vector-by-multiplication matrix system with an output block comprising a modulator, analog-to-digital converter, and a summer.

FIG. 45 depicts another embodiment, similar to the system of FIG. 44, except that the digital bit input uses digital bit position summation to read out the cell or neuron (e.g., value on bitline output) current modulated by modulator 4510 with the output pulsewidth that is designed according to the digital input bit position (e.g. to convert current into output voltage V=Current*Pulsewidth/Capacitance). For example, a first bias (applied on the input like wordline or control gate) is used to evaluate DIN0, the current (cell or neuron) output is modulated by modulator 4510 by a unit pulsewidth that is proportional to the DIN0 bit position, which is one (x1) unit, a second input bias is used to evaluate DIN1, the current output is modulated by modulator 4510 by a pulsewidth that is proportional to the DIN1 bit position, which is two (x2) units, a third input bias is used to evaluate DIN2, the current output is modulated by modulator 4510 by a pulsewidth that is proportional to the DIN2 bit position, which is four (x4) units, a fourth input bias is used to evaluate DIN3, the current output is modulated by modulator 4510 by a pulsewidth that is proportional to the DIN3 bit position, which is eight (x8) units. Each converted voltage is then converted into digital bits by ADC (Analog-to-Digital converter) 4511 for each digital input bits. The total output is then output by summer 4512 as the summation of the four digital outputs generated from DIN0-3 inputs.

FIG. 46 depicts an example of charge summer 4600 that can be used to sum the output of a VMM during a verify operation or during output neuron analog to digital conversion to obtain a single analog value that represents the output, and that can optionally be then converted into digital bit values. Charge summer 4600 can be used, for example, as summer 4512. Charge summer 4600 comprises current source 4601 and a sample-and-hold circuit comprising switch 4602 and sample-and-hold (S/H) capacitor 4603. As shown for an example of a 4-bit digital value, there are 4 S/H circuits to hold the value from 4 evaluation pulses, where the values are summed up at the end of the process. S/H capacitors 4603 are selected with ratios that are associated with the 2^n*DINn bit position for that S/H capacitor; for example C_DIN3=x8 Cu, C_DIN2=x4 Cu, C_DIN1=x2 Cu, DIN0=x1_Cu. The current source 4601 is also ratioed accordingly.

FIG. 47 depicts current summer 4700 that can be used to sum the output of a VMM during a verify operation or during output neuron analog to digital conversion. Current summer 4700 comprises current source 4701, switch 4702, switches 4703 and 4704, and switch 4705. As shown for an example of a 4-bit digital value, there are current source circuits to hold the value from 4 evaluation pulses, where the values are summed up at the end of the process. The current source is ratioed based on the 2^n*DINn bit position; for example, I_DIN3=x8 Icell unit, I_DIN2=x4 Icell unit, I_DIN1=x2 Icell unit, I_DIN0=x1 Icell unit.

Figure 48:
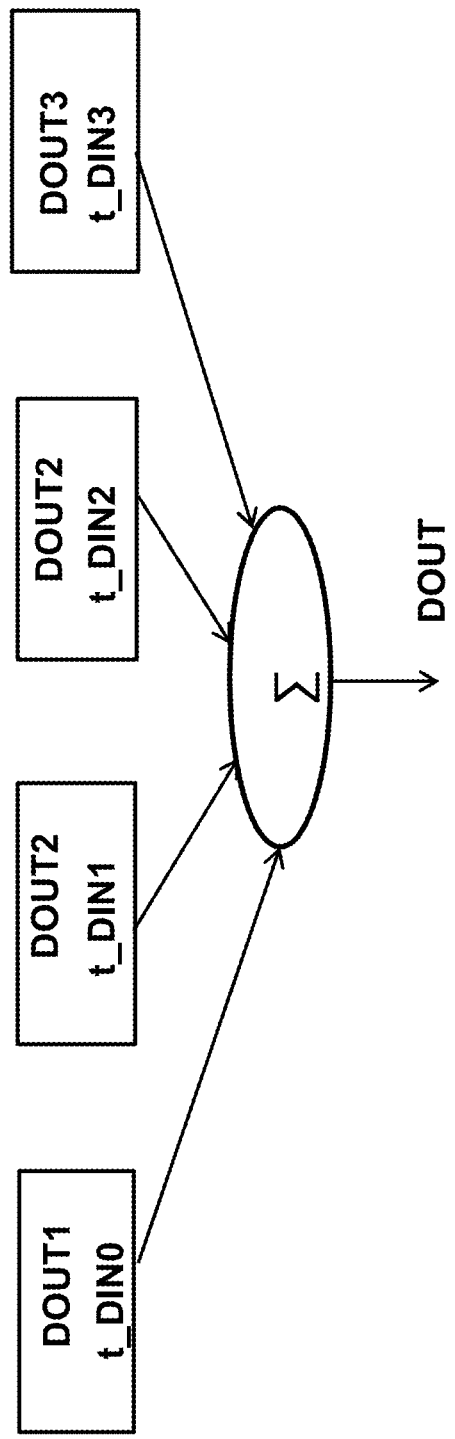
FIG. 48 depicts a digital summer circuit.

FIG. 48 depicts digital summer 4800, which receives a plurality of digital values, sums them together and generates an output DOUT representing the sum of the inputs. Digital summer 4800 can be used during a verify operation or during output neuron analog to digital conversion. As shown for an example of a 4-bit digital value, there are digital output bits to hold the value from 4 evaluation pulses, where the values are summed up at the end of the process. The digital outputs are digitally scaled based on the 2^n*DINn bit position, for example, DOUT3=x8 DOUT0, _DOUT2= x4 DOUT1, I_DOUT1=x2 DOUT0, I_DOUT0=DOUT0.

FIG. 49A shows an integrating dual-slope ADC 4900 applied to an output neuron to convert the cell current into digital output bits. An integrator consisting of integrating op-amp 4901 and integrating capacitor 4902 integrates a cell current ICELL versus a reference current IREF. As shown in FIG. 49B, during a fixed time t1, the cell current is up integrated (Vout rises), and then a reference current is applied to down integrated for a time t2 (Vout falls). The current Icell is =t2/t1*IREF. For example, for t1, for 10 bit digital bits resolution, 1024 cycles are used, and the cycle number for t2 varies from 0 to 1024 cycles depending on the Icell value.

Figure 49C:
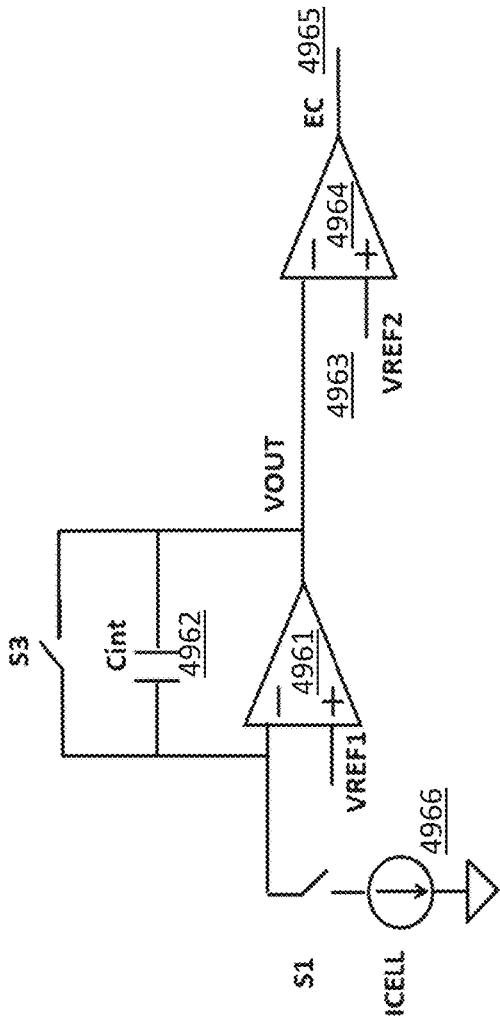
FIG. 49C depicts another embodiment of an integrating analog-to-digital converter for a neuron output.
Figure 49D:
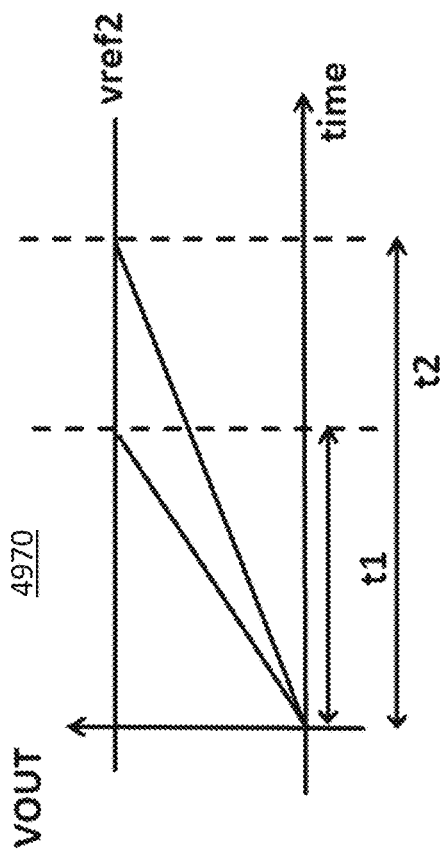
FIG. 49D depicts a graph showing the voltage output over time of the integrating analog-to-digital converter of FIG. 49C.

FIG. 49C shows integrating single slope ADC 4960 applied to an output neuron to convert the cell current into digital output bits. An integrator consisting of integrating op-amp 4961 and integrating capacitor 4962 integrates a cell current ICELL. As shown in FIG. 49D, during a time t1, a cell current is up integrated (Vout rises until it reaches Vref2), and during time t2, another cell current is up integrated. The cell current I cell=Cint*Vref2/t. A pulse counter is used to count the number of pulses (digital output bits) during integration time t. For example as shown digital output bits for t1 is less than that of t2, meaning the cell current during t1 is larger the cell current during t2 integration. An initial calibration is done to calibrate the integrating capacitor value with a reference current and a fixed time, Cint=Tref*Iref/Vref2.

FIG. 49E shows integrating dual slope ADC 4980 applied to an output neuron to convert the cell current into digital output bits. The integrating dual slope ADC 4980 does not utilize an integrating op-amp. The cell current or the reference current is integrated directly on the capacitor 4982. A pulse counter is used to count pulses (digital output bits) during integration time. The current Icell is =t2/t1*IREF.

FIG. 49F shows integrating single slope ADC 4990 applied to an output neuron to convert the cell current into digital output bits. The integrating single slope ADC 4980 does not utilize an integrating op-amp. The cell current is integrated directly on the capacitor 4992. A pulse counter is used to count pulses (digital output bits) during integration time. The cell current I cell=Cint*Vref2/t.

Figure 50A:
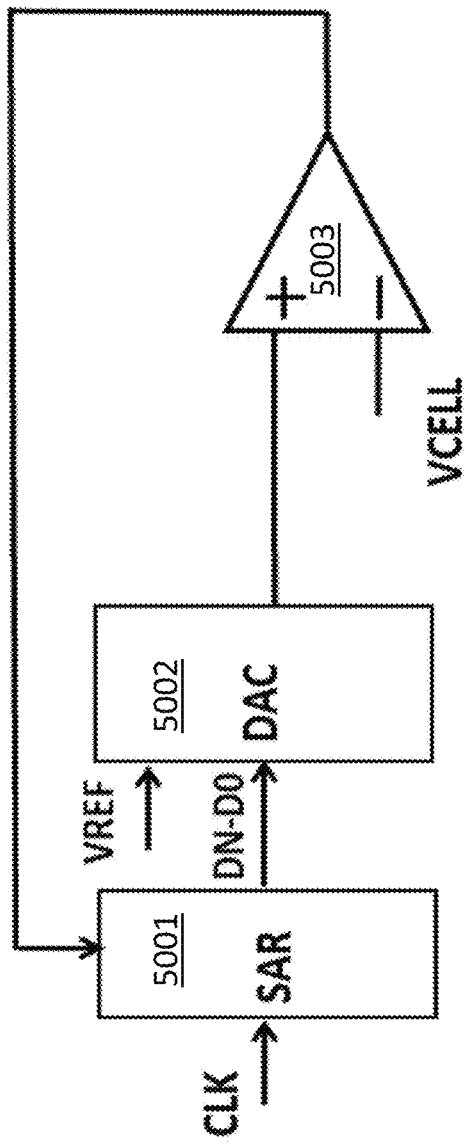
FIGS. 50A and 50B depict a successive approximation analog-to-digital converter for a neuron output.
Figure 50B:
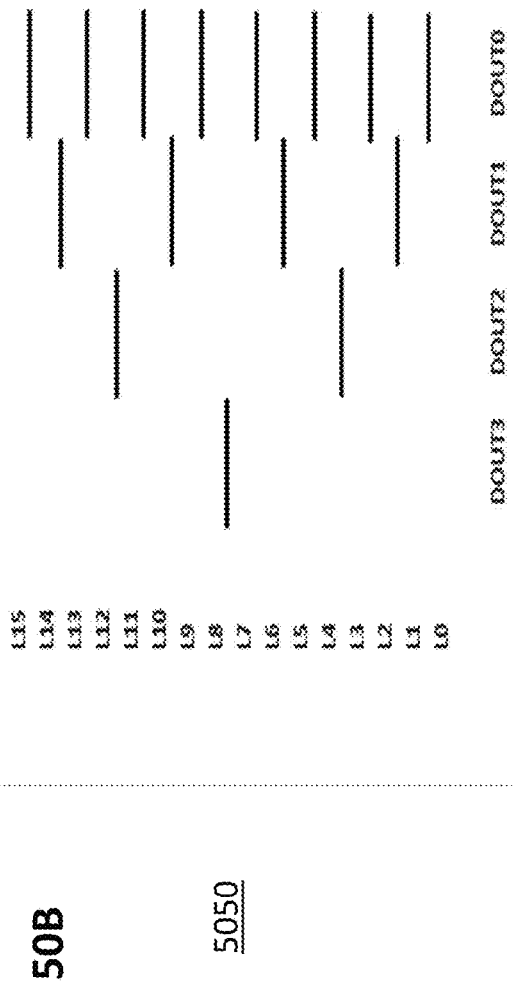

FIG. 50A shows a SAR (Successive Approximation Register) ADC applied to an output neuron to convert a cell current into digital output bits. Cell current can be dropped across a resistor to convert into a VCELL. Alternatively, the cell current can charge up a S/H capacitor to convert into a VCELL. A binary search is used to compute the bit starting from MSB bit (most significant bit). Basing on the digital bits from SAR 5001, DAC 5002 is used to set appropriate analog reference voltage to comparator 5003. The output of the comparator 5003 in turns feedback to SAR 5001 to choose the next analog level. As shown in FIG. 50B, for the example of 4-bit digital output bits, there are 4 evaluation periods: a first pulse to evaluate DOUT3 by setting an analog level half-way, then a second pulse to evaluate DOUT2 by setting an analog level half way of the top-half or half way of the bottom-half, etc.

A Modified Binary Search such as a cyclic (algorithmic) ADC can be used for the cell tuning (e.g., programming) verification or the output neuron conversion. A Modified Binary Search such as a switched cap (SC) charge redistribution ADC can be used for the cell tuning (e.g., programming) verification or the output neuron conversion.

Figure 51:
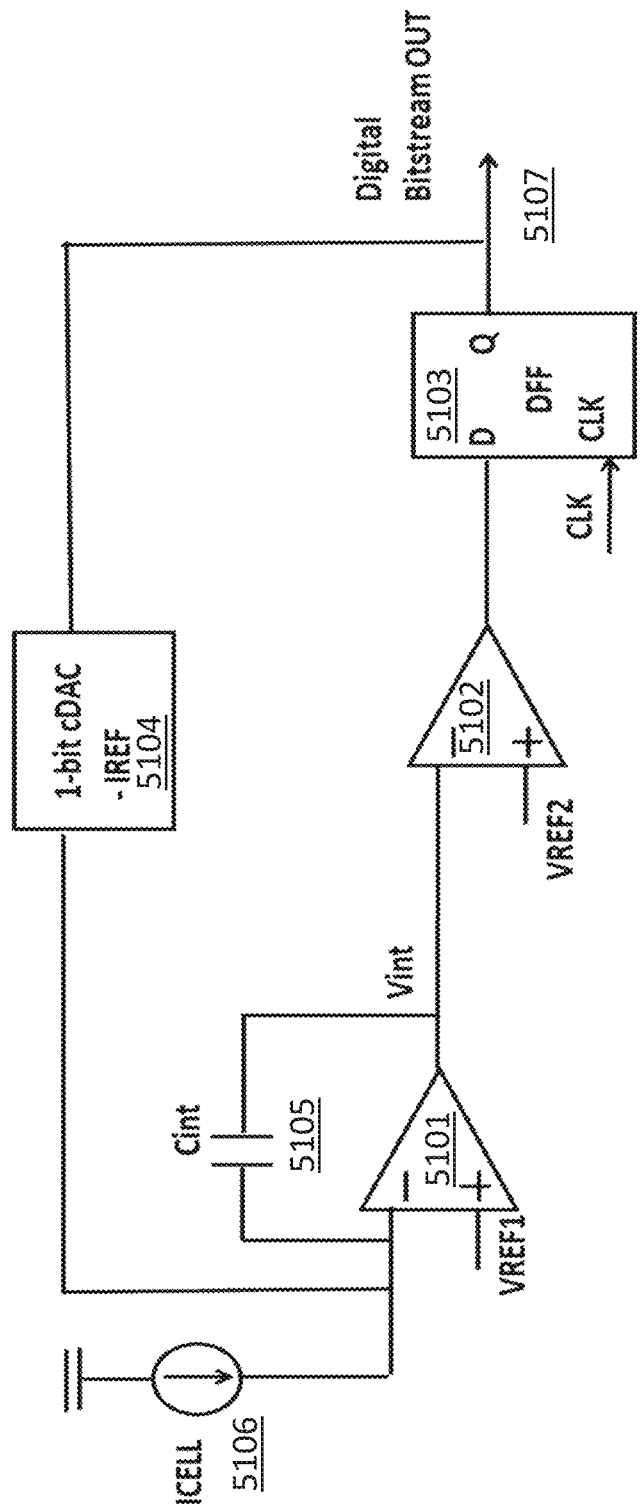
FIG. 51 depicts an embodiment of a sigma delta analog-to-digital converter.

FIG. 51 shows sigma delta ADC 5100 applied to an output neuron to convert a cell current into digital output bits. An integrator consisting of op-amp 5101 and capacitor 5105 integrates the summation of current from a selected cell current and a reference current resulting from 1-bit current DAC 5104. A comparator 5102 compares integrating output voltage versus a reference voltage. The clocked DFF 5103 provides digital output streams depending on the output of the comparator 5102. The digital output stream typically goes to a digital filter before outputting into digital output bits.

FIG. 52A depicts ramp analog-to-digital converter 5200, which comprises current source 5201 (which represents a received neuron current, Ineu), switch 5202, variable configurable capacitor 5203, and comparator 5204, which receives the voltage developed across variable configurable capacitor 5203, denoted Vneu, as the non-inverting input and configurable reference voltage Vreframp as the inverting input and generates output Cout. Vreframp is ramped up in discrete levels with each comparison clock cycle. Comparator 5204 compares Vneu against Vreframp, and as a result output Cout will be "1" when Vneu>Vreframp and will be "0" otherwise. Thus, output Cout will be a pulse, whose width varies in response to Ineu. A larger Ineu will cause Cout to be "1" for a longer period of time, resulting in a wider pulse for output Cout. A digital counter 5220 converts each pulse of output Cout into digital output bits as shown in FIG. 52B for two different Ineu currents, denoted OT1A and OT2A, respectively. Alternatively ramp voltage Vreframp is a continuous ramp voltage 5255 as shown in graph 5250 of FIG. 52B. A multi-ramp embodiment is shown in FIG. 52C for reducing the conversion time by utilizing a coarse-fine ramp conversion algorithm. First coarse reference ramp reference voltage 5271 is ramped in a fast manner to figure out the sub range for each Ineu. Next, fine reference ramp reference voltages 5272, i.e. Vreframp1 and Vreframp2, are used respectively for each sub-range for converting Ineu.currents within the respective sub-range. As shown there are two sub-ranges for fine reference ramp voltages. More than two coarse/fine steps or two sub-ranges are possible.

Figure 53:
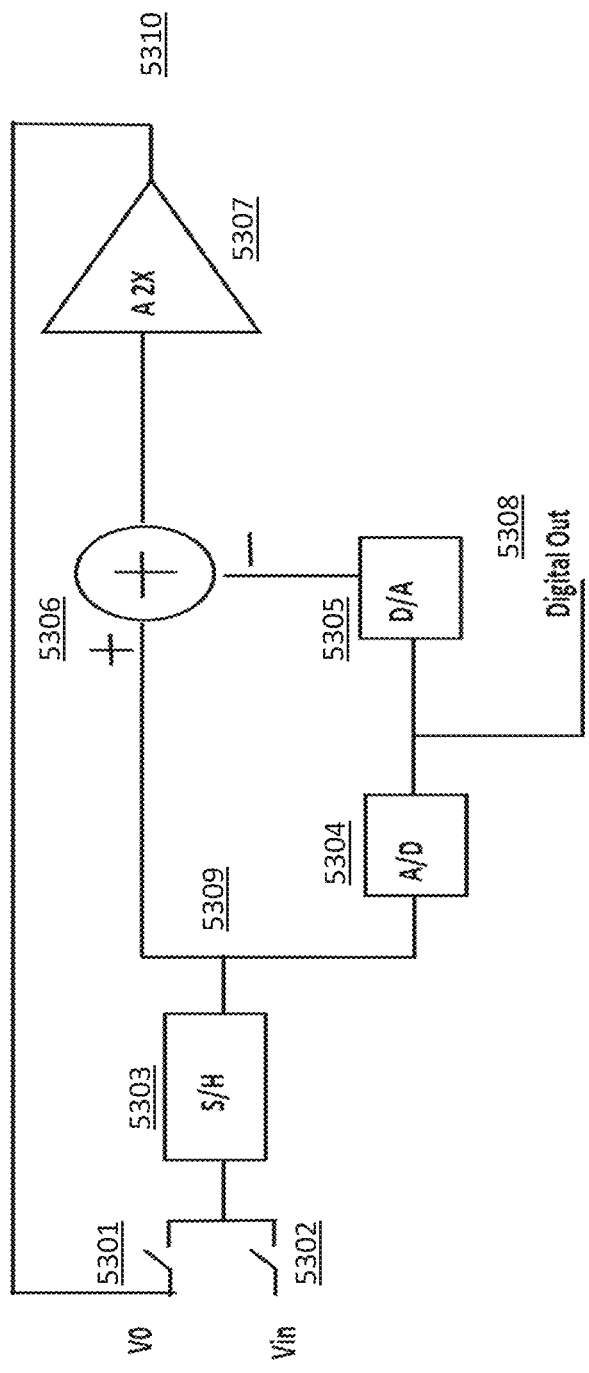
FIG. 53 depicts an embodiment of an algorithmic analog-to-digital converter.

FIG. 53 depicts algorithmic analog-to-digital output converter 5300, which comprises switch 5301, switch 5302, sample-and-hold (S/H) circuit 5303, 1 bit analog-to-digital converter (ADC) 5304, 1 bit digital-to-analog converter (DAC) 5305, summer 5306, and gain of two residue operational amplifier (2×opamp) 5307. Algorithmic analog-to-digital output converter 5300 generates conversion digital output 5308 in response to analog input Vin and control signals applied to switches 5302 and 5302. An input received at analog input Vin (e.g. Vneu in FIG. 52) is sampled first by the S/H circuit 5303 by the switch 5302, then conversion is performed in N clock cycles for N bits. For each conversion clock cycle, the 1-bit ADC 5304 compares the S/H voltage 5309 against a reference voltage (e.g., VREF/2, with VREF is full scale voltage for N bits) and outputs a digital bit (e.g., a "0" if input<=VREF/2 and a "1" if input>VREF/2). This digital bit, which is the Digital Output signal 5308, is in turn converted into an analog voltage by the 1-bit DAC 5305 (e.g. to either VREF/2 or 0V) and feed to the summer 5306 to be subtracted from the S/H voltage 5309. The 2× residue opamp 5307 then amplifies the summer difference voltage output into a conversion residue voltage 5310 which is fed to the S/H circuits 5303 through the switch 5301 for next clock cycle. Instead of this 1-bit (i.e., 2 levels) algorithmic ADC, a 1.5-bit (i.e., 3 levels) algorithmic ADC can be used to reduce the effect of offset such as from ADC 5304 and residue opamp 5307. A 1.5-bit or 2-bit (i.e., 4 levels) DAC is required for the 1.5-bit algorithmic ADC.

In another embodiment, a hybrid ADC can be used. For example, for a 9-bit ADC, the first 4 bits can be generated by a SAR ADC and the remaining 5 bits can be generated using a slope ADC or a ramp ADC.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A method of programming a selected non-volatile memory cell to store one of N possible values, where N is an integer greater than 2, the selected non-volatile memory cell comprising a floating gate and a control gate, the method comprising:
   performing a coarse programming process comprising:
      programming the non-volatile memory cell with an initial programming voltage;
      applying a first voltage to the control gate of the selected non-volatile memory cell and measuring a first current that results through the selected non-volatile memory cell;
      applying a second voltage to the control gate of the selected non-volatile memory cell and measuring a second current that results through the selected non-volatile memory cell;
      determining a slope value based on the first voltage, the second voltage, the first current, and the second current;
      determining a next programming voltage based on the slope value;
      programming the non-volatile memory cell with the next programming voltage;
      repeating the steps of determining a next programming voltage and programming the non-volatile memory cell with the next programming voltage until a current through the selected non-volatile memory cell during a read or verify operation is less than or equal to a first threshold current value; and
   performing a precision programming process until a current through the selected non-volatile memory cell during a read or verify operation is less than or equal to a second threshold current value.

2. The method of claim 1, wherein the step of performing a coarse programming process further comprises:
   when a current through the selected non-volatile memory cell is less than or equal to a third threshold current value, erasing the selected non-volatile memory cell and repeating the coarse programming process.

3. The method of claim 1, further comprising:
   performing a second precision programming process until a current through the selected non-volatile memory cell during a read or verify operation is less than or equal to a fourth threshold current value.

4. The method of claim 1, wherein the precision programming process comprises applying voltage pulses of increasing magnitude to the control gate of the selected non-volatile memory cell.

5. The method of claim 1, wherein the precision programming process comprises applying voltage pulses of increasing duration to the control gate of the selected non-volatile memory cell.

6. The method of claim 1, wherein the selected non-volatile memory cell is a split-gate flash memory cell.

7. The method of claim 1, wherein the selected non-volatile memory cell is in a vector-by-matrix multiplication array in an analog memory deep neural network.

8. The method of claim 1, further comprising:
   before performing the coarse programming process:
      programming the selected non-volatile memory cell to a '0' state; and
      erasing the selected non-volatile memory cell to a weakly-erased level.

9. The method of claim 1, further comprising:
   before performing the coarse programming process:
      erasing the selected non-volatile memory cell to a '1' state; and
      programming the selected non-volatile memory cell to a weakly-programmed level.

10. The method of claim 1, further comprising:
    performing a read operation on the selected non-volatile memory cell; and
    integrating the current drawn by the selected non-volatile memory cell during the read operation using an integrating analog-to-digital converter to generate digital bits.

11. The method of claim 1, further comprising:
    performing a read operation on the selected non-volatile memory cell; and
    converting the current drawn by the selected non-volatile memory cell during the read operation into digital bits using a sigma delta analog-to-digital converter.

12. The method of claim 1, further comprising:
    performing a read operation on the selected non-volatile memory cell; and
    converting the current drawn by the selected non-volatile memory cell during the read operation into digital bits using an algorithmic analog-to-digital.

13. The method of claim 2, further comprising:
    performing a second precision programming process until a current through the selected non-volatile memory cell during a read or verify operation is less than or equal to a fourth threshold current value.

14. The method of claim 2, wherein the precision programming process comprises applying voltage pulses of increasing magnitude to the control gate of the selected non-volatile memory cell.

15. The method of claim 2, wherein the precision programming process comprises applying voltage pulses of increasing duration to the control gate of the selected non-volatile memory cell.

16. The method of claim 2, wherein the selected non-volatile memory cell is a split-gate flash memory cell.

17. The method of claim 2, wherein the selected non-volatile memory cell is in a vector-by-matrix multiplication array in an analog memory deep neural network.

18. The method of claim 2, further comprising:
before performing the coarse programming process:
programming the selected non-volatile memory cell to a '0' state; and
erasing the selected non-volatile memory cell to a weakly-erased level.

19. The method of claim 2, further comprising:
before performing the coarse programming process:
erasing the selected non-volatile memory cell to a '1' state; and
programming the selected non-volatile memory cell to a weakly-programmed level.

20. The method of claim 2, further comprising:
performing a read operation on the selected non-volatile memory cell; and
integrating the current drawn by the selected non-volatile memory cell during the read operation using an integrating analog-to-digital converter to generate digital bits.

21. The method of claim 2, further comprising:
performing a read operation on the selected non-volatile memory cell; and
converting the current drawn by the selected non-volatile memory cell during the read operation into digital bits using a sigma delta analog-to-digital converter.

22. The method of claim 2, further comprising:
performing a read operation on the selected non-volatile memory cell; and
converting the current drawn by the selected non-volatile memory cell during the read operation into digital bits using an algorithmic analog-to-digital converter.

23. The method of claim 1, further comprising:
determining if the current through the selected non-volatile memory cell during a read or verify operation is less than or equal to the first threshold current value by applying an input pulse to a terminal of the non-volatile memory cell, measuring and digitizing the current drawn by the selected non-volatile memory cell to generate digital output bits, and comparing the digital output bits to digital bits representing the first threshold current.

24. The method of claim 1, further comprising:
determining if the current through the selected non-volatile memory cell during a read or verify operation is less than or equal to the first threshold current value by applying a fixed bias to a terminal of the non-volatile memory cell, measuring and digitizing the current drawn by the selected non-volatile memory cell to generate digital output bits, and comparing the digital output bits to digital bits representing the first threshold current.

25. The method of claim 1, further comprising:
determining if the current through the selected non-volatile memory cell during a read or verify operation is less than or equal to the first threshold current value by applying an input to a terminal of the non-volatile memory cell, modulating the current drawn by the selected non-volatile memory cell with an output pulse to generate a modulated output, digitizing the modulated output to generate digital output bits, and comparing the digital output bits to digital bits representing the first threshold current.

* * * * *